(12) United States Patent
Costantino et al.

(10) Patent No.: US 12,597,597 B2
(45) Date of Patent: Apr. 7, 2026

(54) PASSIVATED SILICON-CARBON COMPOSITE MATERIALS

(71) Applicant: GROUP14 TECHNOLOGIES, INC., Woodinville, WA (US)

(72) Inventors: Henry R. Costantino, Woodinville, WA (US); Avery J. Sakshaug, Snohomish, WA (US); Abirami Dhanabalan, Bothell, WA (US); Christopher Timmons, Monroe, WA (US); Aaron M. Feaver, Seattle, WA (US)

(73) Assignee: GROUP14 TECHNOLOGIES, INC., Woodinville, WA (US)

( * ) Notice: Subject to any disclaimer, the term of this patent is extended or adjusted under 35 U.S.C. 154(b) by 0 days.

(21) Appl. No.: 18/626,065

(22) Filed: Apr. 3, 2024

(65) Prior Publication Data

US 2024/0258509 A1 Aug. 1, 2024

Related U.S. Application Data

(60) Division of application No. 18/128,921, filed on Mar. 30, 2023, now Pat. No. 12,046,744, which is a
(Continued)

(51) Int. Cl.
*H01M 4/36* (2006.01)
*C01B 32/05* (2017.01)
(Continued)

(52) U.S. Cl.
CPC ............. *H01M 4/366* (2013.01); *C01B 32/05* (2017.08); *C23C 16/24* (2013.01);
(Continued)

(58) Field of Classification Search
CPC ...... H01M 4/366; H01M 4/386; H01M 4/362; H01M 4/587; B82Y 30/00
(Continued)

(56) References Cited

U.S. PATENT DOCUMENTS 7,816,413 B2 10/2010 Feaver et al.
7,835,136 B2 11/2010 Feaver et al.
(Continued)

FOREIGN PATENT DOCUMENTS

CN 102082262 A 6/2011
JP 2003100284 A 4/2003
(Continued)

OTHER PUBLICATIONS

Lee "A Mini Review: Recent Advances in Surface Modification of Porous Silicon." Materials 2018, 11(12), 2557 (Year: 2018).*
(Continued)

*Primary Examiner* — Tri V Nguyen
(74) *Attorney, Agent, or Firm* — Seed Intellectual Property Law Group LLP

(57) ABSTRACT

Passivated silicon-carbon composite materials and related processes are disclosed that overcome the challenges for providing amorphous nano-sized silicon entrained within porous carbon. Compared to other, inferior materials and processes described in the prior art, the materials and processes disclosed herein find superior utility in various applications, including energy storage devices such as lithium ion batteries.

5 Claims, 6 Drawing Sheets

Data for Various Silicon-Carbon Composite Materials

Z

Relationship between Z and average Coulombic efficiency for various silicon-carbon composite materials.

Related U.S. Application Data continuation of application No. PCT/US2021/052995, filed on Sep. 30, 2021.

(60) Provisional application No. 63/129,363, filed on Dec. 22, 2020, provisional application No. 63/085,788, filed on Sep. 30, 2020.

(51) Int. Cl.

| | |
|---|---|
| *C23C 16/24* | (2006.01) |
| *C23C 16/44* | (2006.01) |
| *C23C 16/455* | (2006.01) |
| *H01M 4/02* | (2006.01) |
| *H01M 4/04* | (2006.01) |
| *H01M 4/38* | (2006.01) |
| *H01M 4/587* | (2010.01) |

(52) U.S. Cl.
CPC .... *C23C 16/4417* (2013.01); *C23C 16/45523* (2013.01); *H01M 4/0428* (2013.01); *H01M 4/386* (2013.01); *H01M 4/587* (2013.01); *C01P 2004/61* (2013.01); *C01P 2004/62* (2013.01); *C01P 2004/64* (2013.01); *C01P 2004/80* (2013.01); *C01P 2006/12* (2013.01); *C01P 2006/40* (2013.01); *H01M 2004/021* (2013.01); *H01M 2004/027* (2013.01); *H01M 4/362* (2013.01)

(58) Field of Classification Search
USPC ...................................................... 428/307.7
See application file for complete search history.

(56) References Cited

U.S. PATENT DOCUMENTS

| | | | |
|---|---|---|---|
| 8,293,818 | B2 | 10/2012 | Costantino et al. |
| 8,467,170 | B2 | 6/2013 | Feaver et al. |
| 8,654,507 | B2 | 2/2014 | Costantino et al. |
| 8,797,717 | B2 | 8/2014 | Feaver et al. |
| 9,409,777 | B2 | 8/2016 | Geramita et al. |
| 9,412,523 | B2 | 8/2016 | Costantino et al. |
| 9,985,289 | B2 | 5/2018 | Costantino et al. |
| 10,141,122 | B2 | 11/2018 | Feaver et al. |
| 10,147,950 | B2 | 12/2018 | Sakshaug et al. |
| 10,195,583 | B2 | 2/2019 | Costantino et al. |
| 10,454,103 | B2 | 10/2019 | Sakshaug et al. |
| 10,490,358 | B2 | 11/2019 | Feaver et al. |
| 10,522,836 | B2 | 12/2019 | Thompkins et al. |
| 10,590,277 | B2 | 3/2020 | Costantino et al. |
| 10,600,581 | B2 | 3/2020 | Feaver et al. |
| 10,608,254 | B2 | 3/2020 | Sakshaug et al. |
| 10,711,140 | B2 | 7/2020 | Costantino et al. |
| 10,714,744 | B2 | 7/2020 | Sakshaug et al. |
| 10,756,347 | B2 | 8/2020 | Sakshaug et al. |
| 10,763,501 | B2 | 9/2020 | Feaver et al. |
| 10,784,512 | B2 | 9/2020 | Sakshaug et al. |
| 10,814,304 | B2 | 10/2020 | Costantino et al. |
| 10,923,722 | B2 | 2/2021 | Sakshaug et al. |
| 11,174,167 | B1 | 11/2021 | Dhanabalan et al. |
| 11,335,903 | B2 | 5/2022 | Costantino et al. |
| 11,401,363 | B2 | 8/2022 | Geramita et al. |
| 11,437,621 | B2 | 9/2022 | Sakshaug et al. |
| 11,492,262 | B2 | 11/2022 | Dhanabalan et al. |
| 11,495,793 | B2 | 11/2022 | Sakshaug et al. |
| 11,495,798 | B1 | 11/2022 | Sakshaug et al. |
| 11,498,838 | B2 | 11/2022 | Dhanabalan et al. |
| 11,611,070 | B2 | 3/2023 | Costantino et al. |
| 11,611,071 | B2 | 3/2023 | Costantino et al. |
| 11,611,073 | B2 | 3/2023 | Feaver et al. |
| 11,639,292 | B2 | 5/2023 | Costantino et al. |
| 11,646,419 | B2 | 5/2023 | Sakshaug et al. |
| 11,661,517 | B2 | 5/2023 | Costantino et al. |
| 11,707,728 | B2 | 7/2023 | Costantino et al. |
| 11,718,701 | B2 | 8/2023 | Geramita et al. |
| 11,725,074 | B2 | 8/2023 | Geramita et al. |
| 11,732,079 | B2 | 8/2023 | Geramita et al. |
| 11,804,591 | B2 | 10/2023 | Costantino et al. |
| 11,942,630 | B2 | 3/2024 | Feaver et al. |
| 11,999,828 | B2 | 6/2024 | Geramita et al. |
| 12,006,400 | B2 | 6/2024 | Geramita et al. |
| 12,046,744 | B2 | 7/2024 | Costantino et al. |
| 12,057,569 | B2 | 8/2024 | Costantino et al. |
| 2009/0087660 | A1 | 4/2009 | Suzuki et al. |
| 2010/0143798 | A1 | 6/2010 | Zhamu et al. |
| 2010/0285359 | A1 | 11/2010 | Hwang et al. |
| 2011/0027648 | A1 | 2/2011 | Rolison et al. |
| 2011/0151324 | A1 | 6/2011 | Chiang et al. |
| 2012/0100438 | A1 | 4/2012 | Fasching et al. |
| 2012/0115033 | A1 | 5/2012 | Kim et al. |
| 2012/0164531 | A1 | 6/2012 | Chen et al. |
| 2012/0196186 | A1 | 8/2012 | Richard |
| 2020/0280070 | A1 | 9/2020 | Sakshaug et al. |
| 2022/0059818 | A1 | 2/2022 | Dhanabalan et al. |
| 2023/0115078 | A1 | 4/2023 | Sakshaug et al. |
| 2023/0155120 | A1 | 5/2023 | Feaver et al. |
| 2023/0219819 | A1 | 7/2023 | Dhanabalan et al. |
| 2023/0304146 | A1 | 9/2023 | Timmons et al. |
| 2023/0304151 | A1 | 9/2023 | Constantino et al. |
| 2023/0321629 | A1 | 10/2023 | Constantino et al. |
| 2023/0327087 | A1 | 10/2023 | Constantino et al. |
| 2023/0348280 | A1 | 11/2023 | Constantino et al. |
| 2023/0348281 | A1 | 11/2023 | Dhanabalan et al. |
| 2023/0373796 | A1 | 11/2023 | Constantino et al. |
| 2023/0383045 | A1 | 11/2023 | Geramita et al. |
| 2023/0399452 | A1 | 12/2023 | Geramita et al. |
| 2024/0043692 | A1 | 2/2024 | Costantino et al. |
| 2024/0047650 | A1 | 2/2024 | Dhanabalan et al. |
| 2024/0150514 | A1 | 5/2024 | Geramita et al. |
| 2024/0208827 | A1 | 6/2024 | Constantino |

FOREIGN PATENT DOCUMENTS

| | | | |
|---|---|---|---|
| JP | 2005135925 | A | 5/2005 |
| JP | 2008186732 | A | 8/2008 |
| JP | 2018534720 | A | 11/2018 |
| JP | 2020514231 | A | 5/2020 |
| KR | 20190122805 | A | 10/2019 |
| WO | WO 0149604 | A1 | 7/2001 |
| WO | WO 2007136164 | A1 | 11/2007 |
| WO | WO 2011154692 | A1 | 12/2011 |
| WO | WO 2014031929 | A1 | 2/2014 |
| WO | 2020128523 | A1 | 6/2020 |

OTHER PUBLICATIONS

911 Metallurgist, "Re-agglomeration in Fine Grinding of Coal," retrieved at URL=https://www.911metallurgist.com/reagglomeration-fine-grinding/, on Jul. 5, 2022. (4 pages).

Knieke et al., "Identifying the apparent and true grinding limit," *Powder Technology* 195:25-30, 2009 [Published online May 20, 2009]. (6 pages).

U.S. Appl. No. 17/946,964, filed Sep. 16, 2022.

U.S. Appl. No. 18/403,598, filed Jan. 3, 2024.

U.S. Appl. No. 18/587,747, filed Feb. 26, 2024.

U.S. Appl. No. 18/769,150, filed Jul. 10, 2024.

U.S. Appl. No. 18/711,531, N/A.

U.S. Appl. No. 18/711,025, N/A.

\* cited by examiner

Relationship between Z and average Coulombic efficiency for various silicon-carbon composite materials.

Differential capacity vs voltage plot for Silicon-Carbon Composite 3 from $2^{nd}$ cycle using a half-cell.

Differential capacity vs voltage plot for Silicon-Carbon Composite 3 from 2$^{nd}$ cycle to 5$^{th}$ cycle using a half-cell.

dQ/dV vs V plot for various silicon-carbon composite materials.

Example of Calculation of φ for Silicon-Carbon Composite 3.

Z vs φ plot for various silicon-carbon composite materials.

PASSIVATED SILICON-CARBON COMPOSITE MATERIALS

CROSS-REFERENCE TO RELATED APPLICATIONS

This application is a divisional of U.S. Non-Provisional application Ser. No. 18/128,921, filed Mar. 30, 2023, which is a continuation of International Patent Application No. PCT/US2021/052995, filed Sep. 30, 2021, which claims priority benefit to U.S. Provisional Patent Application Ser. No. 63/129,363, filed Dec. 22, 2020, and also claims priority benefit to U.S. Provisional Patent Application Ser. No. 63/085,788, filed Sep. 30, 2020, each of which is hereby incorporated by reference in its entirety.

BACKGROUND

Technical Field

Embodiments of the present invention generally relate to methods of passivation to control oxygen content and reactivity of silicon-carbon composite materials, and compositions of matter related thereto. Said silicon-carbon composites are produced via chemical vapor infiltration employing a silicon containing gas to impregnate amorphous, nano-sized silicon within the pores of a porous scaffold. Suitable porous scaffolds include, but are not limited to, porous carbon scaffolds, for example carbon having a pore volume comprising micropores (less than 2 nm), mesopores (2 to 50 nm), and/or macropores (greater than 50 nm). Chemical vapor infiltration (CVI) of silicon into the pores of porous scaffold materials is accomplished by exposing said porous scaffold to silicon-containing gas (e.g., silane) at elevated temperatures.

Passivation can be carried out employing various oxygen containing gases infiltrated into the carbon porosity to the surface of the silicon impregnated therein. Alternatively, passivation can be carried out employing various non-oxygen containing gases infiltrated into the carbon porosity to the surface of the silicon impregnated therein. Such passivation is critical for enhancing the performance of the silicon-carbon composite materials and minimizing undesired reactivity, for instance reactivity between silicon and components of electrolytes employed for lithium ion batteries.

Description of the Related Art

CVI is a process wherein a gaseous substrate reacts within a porous scaffold material. This approach can be employed to produce composite materials, for instance silicon-carbon composites, wherein a silicon-containing gas decomposes at elevated temperature within a porous carbon scaffold. While this approach can be employed to manufacture a variety of composite materials, there is particular interest in silicon-carbon (Si—C) composite materials. Such Si—C composite materials have utility, for example as energy storage materials, for example as an anode material within a lithium ion battery (LIB). LIBs have potential to replace devices currently used in any number of applications. For example, current lead acid automobile batteries are not adequate for next generation all-electric and hybrid electric vehicles due to irreversible, stable sulfate formations during discharge. Lithium ion batteries are a viable alternative to the lead-based systems currently used due to their capacity, and other considerations.

To this end, there is continued strong interest in developing new LIB anode materials, particularly silicon, which has 10-fold higher gravimetric capacity than conventional graphite. However, silicon exhibits large volume change during cycling, in turn leading to electrode deterioration and solid-electrolyte interphase (SEI) instability. The most common amelioration approach is to reduce silicon particle size, for instance $D_{V,50}<150$ nm, for instance $D_{V,50}<100$ nm, for instance $D_{V,50}<50$ nm, for instance $D_{V,50}<20$ nm, for instance $D_{V,50}<10$ nm, for instance $D_{V,50}<5$ nm, for instance $D_{V,50}<2$ nm, either as discrete particles or within a matrix. Thus far, techniques for creating nano-scale silicon involve high-temperature reduction of silicon oxide, extensive particle diminution, multi-step toxic etching, and/or other cost prohibitive processes. Likewise, common matrix approaches involve expensive materials such as graphene or nano-graphite, and/or require complex processing and coating.

It is known from scientific literature that non-graphitizable (hard) carbon is beneficial as a LIB anode material (Liu Y, Xue, JS, Zheng T, Dahn, JR. Carbon 1996, 34:193-200; Wu, YP, Fang, SB, Jiang, Y Y. 1998, 75:201-206; Buiel E, Dahn JR. Electrochim Acta 1999 45:121-130). The basis for this improved performance stems from the disordered nature of the graphene layers that allows Li-ions to intercalate on either side of the graphene plane allowing for theoretically double the stoichiometric content of Li ions versus crystalline graphite. Furthermore, the disordered structure improves the rate capability of the material by allowing Li ions to intercalate isotropically as opposed to graphite where lithiation can only proceed in parallel to the stacked graphene planes. Despite these desirable electrochemical properties, amorphous carbons have not seen wide-spread deployment in commercial Li-ion batteries, owing primarily to low FCE and low bulk density (<1 g/cc). Instead, amorphous carbon has been used more commonly as a low-mass additive and coating for other active material components of the battery to improve conductivity and reduce surface side reactions.

In recent years, amorphous carbon as a LIB battery material has received considerable attention as a coating for silicon anode materials. Such a silicon-carbon core-shell structure has the potential for not only improving conductivity, but also buffering the expansion of silicon as it lithiates, thus stabilizing its cycle stability and minimizing problems associated with particle pulverization, isolation, and SEI integrity (Jung, Y, Lec K, Oh, S. Electrochim Acta 2007 52:7061-7067; Zuo P, Yin G, Ma Y. Electrochim Acta 2007 52:4878-4883; Ng S H, Wang J, Wexler D, Chew S Y, Liu H K. J Phys Chem C 2007 111:11131-11138). Problems associated with this strategy include the lack of a suitable silicon starting material that is amenable to the coating process, and the inherent lack of engineered void space within the carbon-coated silicon core-shell composite particle to accommodate expansion of the silicon during lithiation. This inevitably leads to cycle stability failure due to destruction of core-shell structure and SEI layer (Beattie S D, Larcher D, Morcrette M, Simon B, Tarascon, J-M. J Electrochem Soc 2008 155:A158-A163).

An alternative to core shell structure is a structure wherein amorphous, nano-sized silicon is homogenously distributed within the porosity of a porous carbon scaffold. The porous carbon allows for desirable properties: (i) carbon porosity provides void volume to accommodate the expansion of silicon during lithiation thus reducing the net composite particle expansion at the electrode level; (ii) the disordered graphene network provides increased electrical conductivity to the silicon thus enabling faster charge/discharge rates, (iii)

nano-pore structure acts as a template for the synthesis of silicon thereby dictating its size, distribution, and morphology.

To this end, the desired inverse hierarchical structure can be achieved by employing CVI wherein a silicon-containing gas can completely permeate nanoporous carbon and decompose therein to nano-sized silicon. The CVI approach confers several advantages in terms of silicon structure. One advantage is that nanoporous carbon provides nucleation sites for growing silicon while dictating maximum particle shape and size. Confining the growth of silicon within a nano-porous structure affords reduced susceptibility to cracking or pulverization and loss of contact caused by expansion. Moreover, this structure promotes nano-sized silicon to remain as amorphous phase. This property provides the opportunity for high charge/discharge rates, particularly in combination with silicon's vicinity within the conductive carbon scaffold. This system provides a high-rate-capable, solid-state lithium diffusion pathway that directly delivers lithium ions to the nano-scale silicon interface. Another benefit of the silicon provide via CVI within the carbon scaffold is the inhibition of formation of undesirable crystalline $Li_{15}Si_4$ phase. Yet another benefit is that the CVI process provides for void space within the particle interior.

In order to quantitate the percentage loading of silicon comprising the silicon-carbon composite, thermogravimetric analysis (TGA) may be employed. For this purpose, the silicon-composite is heated from 25° C. to 1100° C., which, without being bound by theory, provides for burn off of all carbon, and oxidation of all silicon to SiO2. Thus, the % silicon comprising the silicon-carbon composite is calculated as $$\% \ Si = 100 \times \left[ \left[ M1100 \times \left( 28/(28 + (16 \times 2)) \right) \right] / M^{\circ} \right]$$

wherein M1100 is the mass of the silicon-carbon composite at 1100° C. and M° is the minimum mass of the silicon-carbon composite between 50° C. and 200° C. when the silicon-carbon composite is heated under air from about 25° C. to about 1100° C., as determined by thermogravimetric analysis.

In order to gauge relative amount of silicon impregnated into the porosity of the porous carbon, thermogravimetric analysis TGA may be employed. TGA can be employed to assess the fraction of silicon residing within the porosity of porous carbon relative to the total silicon present, i.e., sum of silicon within the porosity and on the particle surface. As the silicon-carbon composite is heated under air, the sample exhibits a mass increase that initiates at about 300° C. to 500° C. that reflects initial oxidation of silicon to SiO2, and then the sample exhibits a mass loss as the carbon is burned off, and then the sample exhibits mass increase reflecting resumed conversion of silicon into SiO2 which increases towards an asymptotic value as the temperature approaches 1100° C. as silicon oxidizes to completion. For the purposes of this analysis, it is assumed that the minimum mass recorded for the sample as it heated from 800° C. to 1100° C. represents the point at which carbon burnoff is complete. Any further mass increase beyond that point corresponds to the oxidation of silicon to SiO2 and that the total mass at completion of oxidation is SiO2. Thus, the percentage of unoxidized silicon after carbon burnoff as a proportion of the total amount of silicon can be determined using the formula:

$$Z = 1.875 \times \left[ (M1100 - M)/M1100 \right] \times 100$$

where M1100 is the mass of the sample at completion of oxidation at a temperature of 1100° C., and M is the minimum mass recorded for the sample as it is heated from 800° C. to 1100° C.

Without being bound by theory, the temperature at which silicon is oxidized under TGA conditions relates to the length scale of the oxide coating on the silicon due to the diffusion of oxygen atoms through the oxide layer. Thus, silicon residing within the carbon porosity will oxidize at a lower temperature than deposits of silicon on a particle surface due to the necessarily thinner coating existing on these surfaces. In this fashion, calculation of Z is used to quantitatively assess the fraction of silicon not impregnated within the porosity of the porous carbon scaffold.

BRIEF SUMMARY

Silicon-carbon composite materials with enhanced electrochemical properties and performance, and their related processes including passivation methodologies are disclosed that overcome the challenges for providing amorphous nano-sized silicon entrained within porous carbon. Compared to other, inferior materials and processes described in the prior art, the materials and processes disclosed herein find superior utility in various applications, including energy storage devices such as lithium ion batteries.

Embodiments provide novel anode material comprised for a lithium-silicon battery, comprising a composite comprising Group 14 elements such as silicon and carbon, wherein said composites have novel properties that overcome the challenges for providing a anode for lithium-silicon batteries that comprises silicon in the preferred mode: silicon that is amorphous, nano-sized, and entrained within porous carbon. Said silicon-carbon composites are produced via chemical vapor infiltration (CVI) to impregnate amorphous, nano-sized silicon within the pores of a porous scaffold. Suitable porous scaffolds include, but are not limited to, porous carbon scaffolds, for example carbon having a pore volume comprising micropores (less than 2 nm), mesopores (2 to 50 nm), and/or macropores (greater than 50 nm). Suitable precursors for the carbon scaffold include, but are not limited to, sugars and polyols, organic acids, phenolic compounds, cross-linkers, and amine compounds. Suitable compositing materials include, but are not limited to, silicon materials. Precursors for the silicon include, but are not limited to, silicon containing gases such as silane, high-order silanes (such as di-, tri-, and/or tetrasilane), and/or chlorosilane(s) (such as mono-, di-, tri-, and tetrachlorosilane) and mixtures thereof. CVI to produce silicon within the pores of porous scaffold materials is accomplished by exposing said porous scaffold to silicon-containing gas (e.g., silane) at elevated temperatures. The porous carbon scaffold can be a particulate porous carbon.

A key outcome in this regard is to achieve the desired form of silicon in the desired form, namely amorphous nano-sized silicon. Furthermore, another key outcome is to achieve the silicon impregnation within the pores of the porous carbon. Such materials, for example, silicon-carbon composite materials, have utility as anode materials for energy storage devices, for example lithium-silicon batteries.

DETAILED DESCRIPTION

Figure 1:
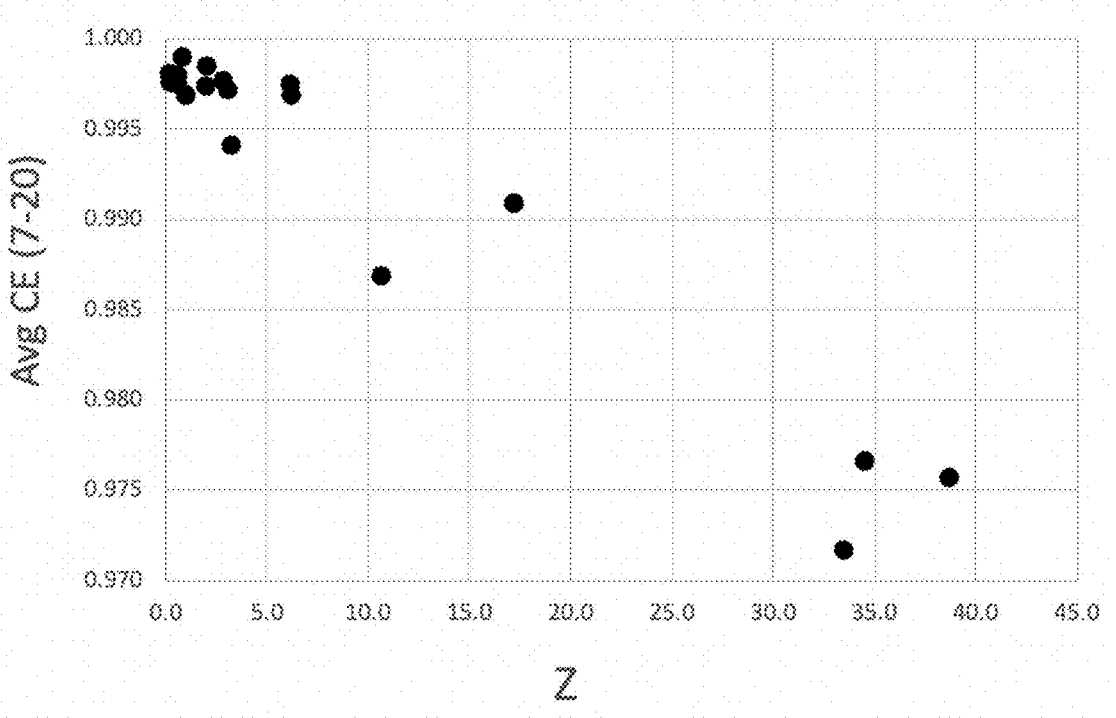
FIG. 1. Relationship between Z and average Coulombic efficiency for various silicon-carbon composite materials.

In the following description, certain specific details are set forth in order to provide a thorough understanding of various embodiments. However, one skilled in the art will understand that the invention may be practiced without these details. In other instances, well-known structures have not been shown or described in detail to avoid unnecessarily obscuring descriptions of the embodiments. Unless the context requires otherwise, throughout the specification and claims which follow, the word "comprise" and variations thereof, such as, "comprises" and "comprising" are to be construed in an open, inclusive sense, that is, as "including, but not limited to." Further, headings provided herein are for convenience only and do not interpret the scope or meaning of the claimed invention.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Also, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

A. Porous Scaffold Materials

For the purposes of embodiments of the current invention, a porous scaffold may be used, into which silicon is to be impregnated. In this context, the porous scaffold can comprise various materials. In some embodiments the porous scaffold material primarily comprises carbon, for example hard carbon. Other allotropes of carbon are also envisioned in other embodiments, for example, graphite, amorphous carbon, diamond, C60, carbon nanotubes (e.g., single and/or multi-walled), graphene and/or carbon fibers. The introduction of porosity into the carbon material can be achieved by a variety of means. For instance, the porosity in the carbon material can be achieved by modulation of polymer precursors, and/or processing conditions to create said porous carbon material, and described in detail in the subsequent section.

In other embodiments, the porous scaffold comprises a polymer material. To this end, a wide variety of polymers are envisioned in various embodiments to have utility, including, but not limited to, inorganic polymer, organic polymers, and addition polymers. Examples of inorganic polymers in this context includes, but are not limited to homochain polymers of silicon-silicon such as polysilanes, silicon carbide, polygermanes, and polystannanes. Additional examples of inorganic polymers includes, but are not limited to, heterochain polymers such as polyborazylenes, polysiloxanes like polydimethylsiloxane (PDMS), polymethylhydrosiloxane (PMHS) and polydiphenylsiloxane, polysilazanes like perhydridopolysilazane (PHPS), polyphosphazenes and poly(dichlorophosphazenes), polyphosphates, polythiazyls, and polysulfides. Examples of organic polymers includes, but are not limited to, low density polyethylene (LDPE), high density polyethylene (HDPE), polypropylene (PP), polyvinyl chloride (PVC), polystyrene (PS), nylon, nylon 6, nylon 6,6, teflon (Polytetrafluoroethylene), thermoplastic polyurethanes (TPU), polyureas, poly(lactide), poly(glycolide) and combinations thereof, phenolic resins, polyamides, polyaramids, polyethylene terephthalate, polychloroprene, polyacrylonitrile, polyaniline, polyimide, poly(3,4-ethylenedioxythiophene) polystyrene sulfonate (PDOT:PSS), and others known in the arts. The organic polymer can be synthetic or natural in origin. In some embodiments, the polymer is a polysaccharide, such as starch, cellulose, cellobiose, amylose, amylopectin, gum Arabic, lignin, and the like. In some embodiments, the polysaccharide is derived from the caramelization of mono- or oligomeric sugars, such as fructose, glucose, sucrose, maltose, raffinose, and the like.

In certain embodiments, the porous scaffold polymer material comprises a coordination polymer. Coordination polymers in this context include, but are not limited to, metal organic frameworks (MOFs). Techniques for production of MOFs, as well as exemplary species of MOFs, are known and described in the art ("The Chemistry and Applications of Metal-Organic Frameworks," Hiroyasu Furukawa et al. Science 341, (2013); DOI: 10.1126/science.1230444). Examples of MOFs in the context include, but are not limited to, Basolite™ materials and zeolitic imidazolate frameworks (ZIFs).

Concomitant with the myriad variety of polymers envisioned with the potential to provide a porous substrate, various processing approaches are envisioned in various embodiments to achieve said porosity. In this context, general methods for imparting porosity into various materials are myriad, as known in the art, including, but certainly not limited to, methods involving emulsification, micelle creation, gasification, dissolution followed by solvent removal (for example, lyophilization), axial compaction and sintering, gravity sintering, powder rolling and sintering, isostatic compaction and sintering, metal spraying, metal coating and sintering, metal injection molding and sintering, and the like. Other approaches to create a porous polymeric material, including creation of a porous gel, such as a freeze dried gel, aerogel, and the like are also envisioned.

In certain embodiments, the porous scaffold material comprises a porous ceramic material. In certain embodiments, the porous scaffold material comprises a porous ceramic foam. In this context, general methods for imparting porosity into ceramic materials are varied, as known in the art, including, but certainly not limited to, creation of porous In this context, general methods and materials suitable for comprising the porous ceramic include, but are not limited to, porous aluminum oxide, porous zirconia toughened alumina, porous partially stabilized zirconia, porous alumina, porous sintered silicon carbide, sintered silicon nitride, porous cordierite, porous zirconium oxide, clay-bound silicon carbide, and the like.

In certain embodiments, the porous scaffold comprises porous silica or other silicon material containing oxygen. The creation of silicon gels, including sol gels, and other porous silica materials is known in the art.

In certain embodiments, the porous material comprises a porous metal. Suitable metals in this regard include, but are not limited to porous aluminum, porous steel, porous nickel, porous Inconcel, porous Hasteloy, porous titanium, porous copper, porous brass, porous gold, porous silver, porous germanium, and other metals capable of being formed into porous structures, as known in the art. In some embodiments, the porous scaffold material comprises a porous metal foam. The types of metals and methods to manufacture related to same are known in the art. Such methods include, but are not limited to, casting (including foaming, infiltration, and lost-foam casting), deposition (chemical and physical), gas-eutectic formation, and powder metallurgy techniques (such as powder sintering, compaction in the presence of a foaming agent, and fiber metallurgy techniques).

B. Porous Carbon Scaffold

Methods for preparing porous carbon materials from polymer precursors are known in the art. For example, methods for preparation of carbon materials are described in U.S. Pat. Nos. 7,723,262, 8,293,818, 8,404,384, 8,654,507, 8,916,296, 9,269,502, 10,590,277, and U.S. patent application Ser. No. 16/745,197, the full disclosures of which are hereby incorporated by reference in their entireties for all purposes.

Accordingly, in one embodiment the present disclosure provides a method for preparing any of the carbon materials or polymer gels described above. The carbon materials may be synthesized through pyrolysis of either a single precursor, for example a saccharide material such as sucrose, fructose, glucose, dextrin, maltodextrin, starch, amylopectin, amylose, lignin, gum Arabic, and other saccharides known in the art, and combinations thereof. Alternatively, the carbon materials may be synthesized through pyrolysis of a complex resin, for instance formed using a sol-gel method using polymer precursors such as phenol, resorcinol, bisphenol A, urea, melamine, and other suitable compounds known in the art, and combinations thereof, in a suitable solvent such as water, ethanol, methanol, and other solvents known in the art, and combinations thereof, with cross-linking agents such as formaldehyde, hexamethylenetetramine, furfural, and other cross-lining agents known in the art, and combinations thereof. The resin may be acid or basic, and may contain a catalyst. The catalyst may be volatile or non-volatile. The pyrolysis temperature and dwell time can vary as known in the art.

In some embodiments, the methods comprise preparation of a polymer gel by a sol gel process, condensation process or crosslinking process involving monomer precursor(s) and a crosslinking agent, two existing polymers and a crosslinking agent or a single polymer and a crosslinking agent, followed by pyrolysis of the polymer gel. The polymer gel may be dried (e.g., freeze dried) prior to pyrolysis; however drying is not necessarily required.

The target carbon properties can be derived from a variety of polymer chemistries provided the polymerization reaction produces a resin/polymer with the necessary carbon backbone. Different polymer families include novolacs, resoles, acrylates, styrenes, ureathanes, rubbers (neoprenes, styrenebutadienes, etc.), nylons, etc. The preparation of any of these polymer resins can occur via a number of different processes including sol gel, emulsion/suspension, solid state, solution state, melt state, etc. for either polymerization and cross-linking processes.

In some embodiments an electrochemical modifier is incorporated into the material as polymer. For example, the organic or carbon containing polymer, RF for example, is copolymerized with the polymer, which contains the electrochemical modifier. In one embodiment, the electrochemical modifier-containing polymer contains silicon. In one embodiment the polymer is tetraethylorthosiliane (TEOS). In one embodiment, a TEOS solution is added to the RF solution prior to or during polymerization. In another embodiment the polymer is a polysilane with organic side groups. In some cases these side groups are methyl groups, in other cases these groups are phenyl groups, in other cases the side chains include phenyl, pyrol, acetate, vinyl, siloxane fragments. In some cases the side chain includes a group 14 element (silicon, germanium, tin or lead). In other cases, the side chain includes a group 13 element (boron, aluminum, boron, gallium, indium). In other cases the side chain includes a group 15 element (nitrogen, phosphorous, arsenic). In other cases the side chain includes a group 16 element (oxygen, sulfur, selenium).

In another embodiment the electrochemical modifier comprises a silole. In some cases it is a phenol-silole or a silafluorene. In other cases it is a poly-silole or a poly-silafluorene. In some cases the silicon is replaced with germanium (germole or germafluorene), tin (stannole or stannaflourene) nitrogen (carbazole) or phosphorous (phosphole, phosphafluorene). In all cases the heteroatom containing material can be a small molecule, an oligomer or a polymer. Phosphorous atoms may or may not be also bonded to oxygen.

In some embodiments the reactant comprises phosphorous. In certain other embodiments, the phosphorus is in the form of phosphoric acid. In certain other embodiments, the phosphorus can be in the form of a salt, wherein the anion of the salt comprises one or more phosphate, phosphite, phosphide, hydrogen phosphate, dihydrogen phosphate, hexafluorophosphate, hypophosphite, polyphosphate, or pyrophosphate ions, or combinations thereof. In certain other embodiments, the phosphorus can be in the form of a salt, wherein the cation of the salt comprises one or more phosphonium ions. The non-phosphate containing anion or cation pair for any of the above embodiments can be chosen for those known and described in the art. In the context, exemplary cations to pair with phosphate-containing anions include, but are not limited to, ammonium, tetraethylammonium, and tetramethylammonium ions. In the context, exemplary anions to pair with phosphate-containing cations include, but are not limited to, carbonate, dicarbonate, and acetate ions.

In some embodiments, the catalyst comprises a basic volatile catalyst. For example, in one embodiment, the basic volatile catalyst comprises ammonium carbonate, ammonium bicarbonate, ammonium acetate, ammonium hydroxide, or combinations thereof. In a further embodiment, the basic volatile catalyst is ammonium carbonate. In another further embodiment, the basic volatile catalyst is ammonium acetate.

In still other embodiments, the method comprises admixing an acid. In certain embodiments, the acid is a solid at room temperature and pressure. In some embodiments, the acid is a liquid at room temperature and pressure. In some embodiments, the acid is a liquid at room temperature and pressure that does not provide dissolution of one or more of the other polymer precursors.

The acid may be selected from any number of acids suitable for the polymerization process. For example, in some embodiments the acid is acetic acid and in other embodiments the acid is oxalic acid. In further embodiments, the acid is mixed with the first or second solvent in a ratio of acid to solvent of 99:1, 90:10, 75:25, 50:50, 25:75, 20:80, 10:90 or 1:90. In other embodiments, the acid is acetic acid and the first or second solvent is water. In other embodiments, acidity is provided by adding a solid acid.

The total content of acid in the mixture can be varied to alter the properties of the final product. In some embodiments, the acid is present from about 1% to about 50% by weight of mixture. In other embodiments, the acid is present from about 5% to about 25%. In other embodiments, the acid is present from about 10% to about 20%, for example about 10%, about 15% or about 20%.

In certain embodiments, the polymer precursor components are blended together and subsequently held for a time and at a temperature sufficient to achieve polymerization. One or more of the polymer precursor components can have particle size less than about 20 mm in size, for example less than 10 mm, for example less than 7 mm, for example, less than 5 mm, for example less than 2 mm, for example less than 1 mm, for example less than 100 microns, for example less than 10 microns. In some embodiments, the particle size of one or more of the polymer precursor components is reduced during the blending process.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The reaction duration is generally sufficient to allow the polymer precursors to react and form a polymer, for example the mixture may be aged anywhere from 1 hour to 48 hours, or more or less depending on the desired result. Typical embodiments include aging for a period of time ranging from about 2 hours to about 48 hours, for example in some embodiments aging comprises about 12 hours and in other embodiments aging comprises about 4-8 hours (e.g., about 6 hours).

In certain embodiments, an electrochemical modifier is incorporated during the above described polymerization process. For example, in some embodiments, an electrochemical modifier in the form of metal particles, metal paste, metal salt, metal oxide or molten metal can be dissolved or suspended into the mixture from which the gel resin is produced Exemplary electrochemical modifiers for producing composite materials may fall into one or more than one of the chemical classifications. In some embodiments, the electrochemical modifier is a lithium salt, for example, but not limited to, lithium fluoride, lithium chloride, lithium carbonate, lithium hydroxide, lithium benzoate, lithium bromide, lithium formate, lithium hexafluorophosphate, lithium iodate, lithium iodide, lithium perchlorate, lithium phosphate, lithium sulfate, lithium tetraborate, lithium tetrafluoroborate, and combinations thereof.

In certain embodiments, the electrochemical modifier comprises a metal, and exemplary species includes, but are not limited to aluminum isoproproxide, manganese acetate, nickel acetate, iron acetate, tin chloride, silicon chloride, and combinations thereof. In certain embodiments, the electrochemical modifier is a phosphate compound, including but not limited to phytic acid, phosphoric acid, ammonium dihydrogenphosphate, and combinations thereof. In certain embodiments, the electrochemical modifier comprises silicon, and exemplary species includes, but are not limited to silicon powders, silicon nanotubes, polycrystalline silicon, nanocrystalline silicon, amorpohous silicon, porous silicon, nano sized silicon, nano-featured silicon, nano-sized and nano-featured silicon, silicyne, and black silicon, and combinations thereof.

Electrochemical modifiers can be combined with a variety of polymer systems through either physical mixing or chemical reactions with latent (or secondary) polymer functionality. Examples of latent polymer functionality include, but are not limited to, epoxide groups, unsaturation (double and triple bonds), acid groups, alcohol groups, amine groups, basic groups. Crosslinking with latent functionality can occur via heteroatoms (e.g., vulcanization with sulfur, acid/base/ring opening reactions with phosphoric acid), reactions with organic acids or bases (described above), coordination to transition metals (including but not limited to Ti, Cr, Mn, Fe, Co, Ni, Cu, Zn, Zr, Nb, Mo, Ag, Au), ring opening or ring closing reactions (rotaxanes, spiro compounds, etc.).

Electrochemical modifiers can also be added to the polymer system through physical blending. Physical blending can include but is not limited to melt blending of polymers and/or co-polymers, the inclusion of discrete particles, chemical vapor deposition of the electrochemical modifier and coprecipitation of the electrochemical modifier and the main polymer material.

In some instances the electrochemical modifier can be added via a metal salt solid, solution, or suspension. The metal salt solid, solution or suspension may comprise acids and/or alcohols to improve solubility of the metal salt. In yet another variation, the polymer gel (either before or after an optional drying step) is contacted with a paste comprising the electrochemical modifier. In yet another variation, the polymer gel (either before or after an optional drying step) is contacted with a metal or metal oxide sol comprising the desired electrochemical modifier.

In addition to the above exemplified electrochemical modifiers, the composite materials may comprise one or more additional forms (i.e., allotropes) of carbon. In this regard, it has been found that inclusion of different allotropes of carbon such as graphite, amorphous carbon, conductive carbon, carbon black, diamond, C60, carbon nanotubes (e.g., single and/or multi-walled), graphene and/or carbon fibers into the composite materials is effective to optimize the electrochemical properties of the composite materials. The various allotropes of carbon can be incorporated into the carbon materials during any stage of the preparation process described herein. For example, during the solution phase, during the gelation phase, during the curing phase, during the pyrolysis phase, during the milling phase, or after milling. In some embodiments, the second carbon form is incorporated into the composite material by adding the second carbon form before or during polymerization of the polymer gel as described in more detail herein. The polymerized polymer gel containing the second carbon form is then processed according to the general techniques described herein to obtain a carbon material containing a second allotrope of carbon.

In a preferred embodiment, the carbon is produced from precursors with little or no solvent required for processing (solvent free). The structure of the polymer precursors suitable for use in a low solvent or essentially solvent free reaction mixture is not particularly limited, provided that the polymer precursor is capable of reacting with another polymer precursor or with a second polymer precursor to form a polymer. Polymer precursors include amine-containing compounds, alcohol-containing compounds and carbonyl-containing compounds, for example in some embodiments the polymer precursors are selected from an alcohol, a phenol, a polyalcohol, a sugar, an alkyl amine, an aromatic amine, an aldehyde, a ketone, a carboxylic acid, an ester, a urea, an acid halide and an isocyanate.

In one embodiment employing a low or essentially solvent free reaction mixture, the method comprises use of a first and second polymer precursor, and in some embodiments the first or second polymer precursor is a carbonyl containing compound and the other of the first or second polymer precursor is an alcohol containing compound. In some embodiments, a first polymer precursor is a phenolic compound and a second polymer precursor is an aldehyde compound (e.g., formaldehyde). In one embodiment, of the method the phenolic compound is phenol, resorcinol, catechol, hydroquinone, phloroglucinol, or a combination thereof; and the aldehyde compound is formaldehyde, acetaldehyde, propionaldehyde, butyraldehyde, benzaldehyde, cinnamaldehyde, or a combination thereof. In a further embodiment, the phenolic compound is resorcinol, phenol or a combination thereof, and the aldehyde compound is formaldehyde. In yet further embodiments, the phenolic compound is resorcinol and the aldehyde compound is formaldehyde. In some embodiments, the polymer precursors are alcohols and carbonyl compounds (e.g., resorcinol and aldehyde) and they are present in a ratio of about 0.5:1.0, respectively.

The polymer precursor materials suitable for low or essentially solvent free reaction mixture as disclosed herein include (a) alcohols, phenolic compounds, and other mono- or polyhydroxy compounds and (b) aldehydes, ketones, and combinations thereof. Representative alcohols in this context include straight chain and branched, saturated and unsaturated alcohols. Suitable phenolic compounds include polyhydroxy benzene, such as a dihydroxy or trihydroxy benzene. Representative polyhydroxy benzenes include resorcinol (i.e., 1,3-dihydroxy benzene), catechol, hydroquinone, and phloroglucinol. Other suitable compounds in this regard are bisphenols, for instance, bisphenol A. Mixtures of two or more polyhydroxy benzenes can also be used. Phenol (monohydroxy benzene) can also be used. Representative polyhydroxy compounds include sugars, such as glucose, sucrose, fructose, chitin and other polyols, such as mannitol. Aldehydes in this context include: straight chain saturated aldehydes such as methanal (formaldehyde), ethanal (acetaldehyde), propanal (propionaldehyde), butanal (butyraldehyde), and the like; straight chain unsaturated aldehydes such as ethenone and other ketenes, 2-propenal (acrylaldehyde), 2-butenal (crotonaldehyde), 3 butenal, and the like; branched saturated and unsaturated aldehydes; and aromatic-type aldehydes such as benzaldehyde, salicylaldehyde, hydrocinnamaldehyde, and the like. Suitable ketones include: straight chain saturated ketones such as propanone and 2 butanone, and the like; straight chain unsaturated ketones such as propenone, 2 butenone, and 3 butenone (methyl vinyl ketone) and the like; branched saturated and unsaturated ketones; and aromatic-type ketones such as methyl benzyl ketone (phenylacetone), ethyl benzyl ketone, and the like. The polymer precursor materials can also be combinations of the precursors described above.

In some embodiments, one polymer precursor in the low or essentially solvent free reaction mixture is an alcohol-containing species and another polymer precursor is a carbonyl-containing species. The relative amounts of alcohol-containing species (e.g., alcohols, phenolic compounds and mono- or poly-hydroxy compounds or combinations thereof) reacted with the carbonyl containing species (e.g., aldehydes, ketones or combinations thereof) can vary substantially. In some embodiments, the ratio of alcohol-containing species to aldehyde species is selected so that the total moles of reactive alcohol groups in the alcohol-containing species is approximately the same as the total moles of reactive carbonyl groups in the aldehyde species. Similarly, the ratio of alcohol-containing species to ketone species may be selected so that the total moles of reactive alcohol groups in the alcohol containing species is approximately the same as the total moles of reactive carbonyl groups in the ketone species. The same general 1:1 molar ratio holds true when the carbonyl-containing species comprises a combination of an aldehyde species and a ketone species.

In other embodiments, the polymer precursor in the low or essentially solvent free reaction mixture is a urea or an amine containing compound. For example, in some embodiments the polymer precursor is urea, melamine, hexamethylenetetramine (HMT) or combination thereof. Other embodiments include polymer precursors selected from isocyanates or other activated carbonyl compounds such as acid halides and the like.

Some embodiments of the disclosed methods include preparation of low or solvent-free polymer gels (and carbon materials) comprising electrochemical modifiers. Such electrochemical modifiers include, but are not limited to nitrogen, silicon, and sulfur. In other embodiments, the electrochemical modifier comprises fluorine, iron, tin, silicon, nickel, aluminum, zinc, or manganese. The electrochemical modifier can be included in the preparation procedure at any step. For example, in some the electrochemical modifier is admixed with the mixture, the polymer phase or the continuous phase.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The porous carbon material can be achieved via pyrolysis of a polymer produced from precursors materials as described above. In some embodiments, the porous carbon material comprises an amorphous activated carbon that is produced by pyrolysis, physical or chemical activation, or combination thereof in either a single process step or sequential process steps.

The temperature and dwell time of pyrolysis can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C. In some embodiments, the pyrolysis temperature varies from 650 C to 1100 C. The pyrolysis can be accomplished in an inert gas, for example nitrogen, or argon.

In some embodiments, an alternate gas is used to further accomplish carbon activation. In certain embodiments, pyrolysis and activation are combined. Suitable gases for accomplishing carbon activation include, but are not limited to, carbon dioxide, carbon monoxide, water (steam), air, oxygen, and further combinations thereof. The temperature and dwell time of activation can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C. In some embodiments, the temperature for combined pyrolysis and activation varies from 650 C to 1100 C.

In some embodiments, combined pyrolysis and activation is carried out to prepare the porous carbon scaffold. In such embodiments, the process gas can remain the same during process, or the composition of process gas may be varied during processing. In some embodiments, the addition of an activation gas such as CO2, steam, or combination thereof, is added to the process gas following stuffiest temperature and time to allow for pyrolysis of the solid carbon precursors.

Suitable gases for accomplishing carbon activation include, but are not limited to, carbon dioxide, carbon monoxide, water (steam), air, oxygen, and further combinations thereof. The temperature and dwell time of activation can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C. In some embodiments, the activation temperature varies from 650 C to 1100 C.

Either prior to the pyrolysis, and/or after pyrolysis, and/or after activation, the carbon may be subjected to a particle size reduction. The particle size reduction can be accomplished by a variety of techniques known in the art, for example by jet milling in the presence of various gases including air, nitrogen, argon, helium, supercritical steam, and other gases known in the art. Other particle size reduction methods, such as grinding, ball milling, jet milling, water jet milling, and other approaches known in the art are also envisioned.

The porous carbon scaffold may be in the form of particles. The particle size and particle size distribution can be measured by a variety of techniques known in the art, and can be described based on fractional volume. In this regard, the $Dv,50$ of the carbon scaffold may be between 10 nm and 10 mm, for example between 100 nm and 1 mm, for example between 1 um and 100 um, for example between 2 um and 50 um, example between 3 um and 30 um, example between 4 um and 20 um, example between 5 um and 10 um. In certain embodiments, the $Dv,50$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $Dv,100$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $Dv,99$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $Dv,90$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $Dv,0$ is greater than 10 nm, for example greater than 100 nm, for example greater than 500 nm, for example greater than 1 um, for example greater than 2 um, for example greater than 5 um, for example greater than 10 um. In certain embodiments, the $Dv,1$ is greater than 10 nm, for example greater than 100 nm, for example greater than 500 nm, for example greater than 1 um, for example greater than 2 um, for example greater than 5 um, for example greater than 10 um. In certain embodiments, the $Dv,10$ is greater than 10 nm, for example greater than 100 nm, for example greater than 500 nm, for example greater than 1 um, for example greater than 2 um, for example greater than 5 um, for example greater than 10 um.

In some embodiments, the surface area of the porous carbon scaffold can comprise a surface area greater than 400 m2/g, for example greater than 500 m2/g, for example greater than 750 m2/g, for example greater than 1000 m2/g, for example greater than 1250 m2/g, for example greater than 1500 m2/g, for example greater than 1750 m2/g, for example greater than 2000 m2/g, for example greater than 2500 m2/g, for example greater than 3000 m2/g. In other embodiments, the surface area of the porous carbon scaffold can be less than 500 m2/g. In some embodiments, the surface area of the porous carbon scaffold is between 200 and 500 m2/g. In some embodiments, the surface area of the porous carbon scaffold is between 100 and 200 m2/g. In some embodiments, the surface area of the porous carbon scaffold is between 50 and 100 m2/g. In some embodiments, the surface area of the porous carbon scaffold is between 10 and 50 m2/g. In some embodiments, the surface area of the porous carbon scaffold can be less than 10 m2/g.

In some embodiments, the pore volume of the porous carbon scaffold is greater than 0.4 cm3/g, for example greater than 0.5 cm3/g, for example greater than 0.6 cm3/g, for example greater than 0.7 cm3/g, for example greater than 0.8 cm3/g, for example greater than 0.9 cm3/g, for example greater than 1.0 cm3/g, for example greater than 1.1 cm3/g, for example greater than 1.2 cm3/g, for example greater than 1.4 cm3/g, for example greater than 1.6 cm3/g, for example greater than 1.8 cm3/g, for example greater than 2.0 cm3/g. In other embodiments, the pore volume of the porous silicon scaffold is less than 0.5 cm3, for example between 0.1 cm3/g and 0.5 cm3/g. In certain other embodiments, the pore volume of the porous silicon scaffold is between 0.01 cm3/g and 0.1 cm3/g.

In some other embodiments, the porous carbon scaffold is an amorphous activated carbon with a pore volume between 0.2 and 2.0 cm3/g. In certain embodiments, the carbon is an amorphous activated carbon with a pore volume between 0.4 and 1.5 cm3/g. In certain embodiments, the carbon is an amorphous activated carbon with a pore volume between 0.5 and 1.2 cm3/g. In certain embodiments, the carbon is an amorphous activated carbon with a pore volume between 0.6 and 1.0 cm3/g.

In some other embodiments, the porous carbon scaffold comprises a tap density of less than 1.0 g/cm3, for example less than 0.8 g/cm3, for example less than 0.6 g/cm3, for example less than 0.5 g/cm3, for example less than 0.4 g/cm3, for example less than 0.3 g/cm3, for example less than 0.2 g/cm3, for example less than 0.1 g/cm3.

The surface functionality of the porous carbon scaffold can vary. One property which can be predictive of surface functionality is the pH of the porous carbon scaffold. The presently disclosed porous carbon scaffolds comprise pH values ranging from less than 1 to about 14, for example less than 5, from 5 to 8 or greater than 8. In some embodiments, the pH of the porous carbon is less than 4, less than 3, less than 2 or even less than 1. In other embodiments, the pH of the porous carbon is between about 5 and 6, between about 6 and 7, between about 7 and 8 or between 8 and 9 or between 9 and 10. In still other embodiments, the pH is high and the pH of the porous carbon ranges is greater than 8, greater than 9, greater than 10, greater than 11, greater than 12, or even greater than 13.

The pore volume distribution of the porous carbon scaffold can vary. For example, the % micropores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable micropore volume in the porous carbon scaffold.

The mesopores comprising the porous carbon scaffold can vary. For example, the % mesopores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable mesopore volume in the porous carbon scaffold.

In some embodiments, the pore volume distribution of the porous carbon scaffold comprises more than 50% macropores, for example more than 60% macropores, for example more than 70% macropores, for example more than 80% macropores, for example more than 90% macropores, for example more than 95% macropores, for example more than 98% macropores, for example more than 99% macropores, for example more than 99.5% macropores, for example more than 99.9% macropores.

In certain preferred embodiments, the pore volume of the porous carbon scaffold comprises a blend of micropores, mesopores, and macropores. Accordingly, in certain embodiments, the porous carbon scaffold comprises 0-20% micropores, 30-70% mesopores, and less than 10% macropores. In certain other embodiments, the porous carbon scaffold comprises 0-20% micropores, 0-20% mesopores, and 70-95% macropores. In certain other embodiments, the porous carbon scaffold comprises 20-50% micropores, 50-80% mesopores, and 0-10% macropores. In certain other embodiments, the porous carbon scaffold comprises 40-60% micropores, 40-60% mesopores, and 0-10% macropores. In certain other embodiments, the porous carbon scaffold comprises 80-95% micropores, 0-10% mesopores, and 0-10% macropores. In certain other embodiments, the porous carbon scaffold comprises 0-10% micropores, 30-50% mesopores, and 50-70% macropores. In certain other embodiments, the porous carbon scaffold comprises 0-10% micropores, 70-80% mesopores, and 0-20% macropores. In certain other embodiments, the porous carbon scaffold comprises 0-20% micropores, 70-95% mesopores, and 0-10% macropores. In certain other embodiments, the porous carbon scaffold comprises 0-10% micropores, 70-95% mesopores, and 0-20% macropores.

In certain embodiments, the % of pore volume in the porous carbon scaffold representing pores between 100 and 1000 A (10 and 100 nm) comprises greater than 30% of the total pore volume, for example greater than 40% of the total pore volume, for example greater than 50% of the total pore volume, for example greater than 60% of the total pore volume, for example greater than 70% of the total pore volume, for example greater than 80% of the total pore volume, for example greater than 90% of the total pore volume, for example greater than 95% of the total pore volume, for example greater than 98% of the total pore volume, for example greater than 99% of the total pore volume, for example greater than 99.5% of the total pore volume, for example greater than 99.9% of the total pore volume.

In certain embodiments, the pycnometry density of the porous carbon scaffold ranges from about 1 g/cc to about 3 g/cc, for example from about 1.5 g/cc to about 2.3 g/cc. In other embodiments, the skeletal density ranges from about 1.5 cc/g to about 1.6 cc/g, from about 1.6 cc/g to about 1.7 cc/g, from about 1.7 cc/g to about 1.8 cc/g, from about 1.8 cc/g to about 1.9 cc/g, from about 1.9 cc/g to about 2.0 cc/g, from about 2.0 cc/g to about 2.1 cc/g, from about 2.1 cc/g to about 2.2 cc/g or from about 2.2 cc/g to about 2.3 cc/g, from about 2.3 cc to about 2.4 cc/g, for example from about 2.4 cc/g to about 2.5 cc/g.

C. Silicon Production Via Chemical Vapor Infiltration (CVI)

Chemical vapor deposition (CVD) is a process wherein a substrate provides a solid surface comprising the first component of the composite, and the gas thermally decomposes on this solid surface to provide the second component of composite. Such a CVD approach can be employed, for instance, to create Si—C composite materials wherein the silicon is coating on the outside surface of silicon particles. Alternatively, chemical vapor infiltration (CVI) is a process wherein a substrate provides a porous scaffold comprising the first component of the composite, and the gas thermally decomposes on into the porosity (into the pores) of the porous scaffold material to provide the second component of composite.

In an embodiment, silicon is created within the pores of the porous carbon scaffold by subjecting the porous carbon particles to a silicon containing precursor gas at elevated temperature and the presence of a silicon-containing gas, preferably silane, in order to decompose said gas into silicon. In some embodiments, the silicon containing gas may comprise a higher-order silane (such as di-, tri-, and/or tetrasilane), chlorosilane(s) (such as mono-, di-, tri-, and tetrachlorosilane) or mixtures thereof.

The silicon containing precursor gas can be mixed with other inert gas(es( ) for example, nitrogen gas, or hydrogen gas, or argon gas, or helium gas, or combinations thereof. The temperature and time of processing can be varied, for example the temperature can be between 200 and 900 C, for example between 200 and 250 C, for example between 250 and 300 C, for example between 300 and 350 C, for example between 300 and 400 C, for example between 350 and 450 C, for example between 350 and 400 C, for example between 400 and 500 C, for example between 500 and 600 C, for example between 600 and 700 C, for example between 700 and 800 C, for example between 800 and 900 C, for example between 600 and 1100 C.

The mixture of gas can comprise between 0.1 and 1% silane and remainder inert gas. Alternatively, the mixture of gas can comprise between 1% and 10% silane and remainder inert gas. Alternatively, the mixture of gas can comprise between 10% and 20% silane and remainder inert gas. Alternatively, the mixture of gas can comprise between 20% and 50% silane and remainder inert gas. Alternatively, the mixture of gas can comprise above 50% silane and remainder inert gas. Alternatively, the gas can essentially be 100% silane gas. Suitable inert gases include, but are not limited to, hydrogen, nitrogen, argon, and combinations thereof.

The pressure for the CVI process can be varied. In some embodiments, the pressure is atmospheric pressure. In some embodiments, the pressure is below atmospheric pressure. In some embodiments, the pressure is above atmospheric pressure.

D. Physico- and Electrochemical Properties of Silicon-Carbon Composite

While not wishing to be bound by theory, it is believed that the nano sized silicon achieved as a result of filling in certain, desired pore volume structure of the porous carbon scaffold (for instance, silicon filling pores in the range of 5 to 1000 nm, or other range as disclosed elsewhere herein), along with the advantageous properties of the other components of the composite, including low surface area, low pycnometry density, yield composite materials having different and advantageous properties, for instance electrochemical performance when the composite comprises an anode of a lithium ion energy storage device.

In certain embodiments, the embedded silicon particles embedded within the composite comprise nano-sized features. The nano-sized features can have a characteristic length scale of preferably less than 1 um, preferably less than 300 nm, preferably less than 150 nm, preferably less than 100 μm, preferably less than 50 nm, preferably less than 30 nm, preferably less than 15 nm, preferably less than 10 nm, preferably less than 5 nm.

In certain embodiments, the silicon embedded within the composite is spherical in shape. In certain other embodiments, the porous silicon particles are non-spherical, for example rod-like, or fibrous in structure. In some embodiments, the silicon exists as a layer coating the inside of pores within the porous carbon scaffold. The depth of this silicon layer can vary, for example the depth can between 5 nm and 10 nm, for example between 5 nm and 20 nm, for example between 5 nm and 30 nm, for example between 5 nm and 33 nm, for example between 10 nm and 30 nm, for example between 10 nm and 50 nm, for example between 10 nm and 100 nm, for example between 10 and 150 nm, for example between 50 nm and 150 nm, for example between 100 and 300 nm, for example between 300 and 1000 nm.

In some embodiments, the silicon embedded within the composite is nano sized, and resides within pores of the porous carbon scaffold. For example, the embedded silicon can be impregnated, deposited by CVI, or other appropriate process into pores within the porous carbon particle comprising pore sizes between 5 and 1000 nm, for example between 10 and 500 nm, for example between 10 and 200 nm, for example between 10 and 100 nm, for example between 33 and 150 nm, for example between and 20 and 100 nm. Other ranges of carbon pores sizes with regards to fractional pore volume, whether micropores, mesopores, or macropores, are also envisioned.

In some embodiments, the carbon scaffold pore volume distribution can be described as the number or volume distribution of pores as determined as known in the art based on gas sorption analysis, for example nitrogen gas sorption analysis. In some embodiments the pore size distribution can be expressed in terms of the pore size at which a certain fraction of the total pore volume resides at or below. For example, the pore size at which 10% of the pores reside at or below can be expressed at DPv10.

The DPv10 for the porous carbon scaffold can vary, for example DPv10 can be between 0.01 nm and 100 nm, for example between 0.1 nm and 100 nm, for example between 1 nm and 100 nm, for example between 1 nm and 50 nm, for example between 1 nm and 40 nm, for example between 1 nm and 30 nm, for example between 1 nm and 10 nm, for example between 1 nm and 5 nm.

The DPv50 for the porous carbon scaffold can vary, for example DPv50 can be between 0.01 nm and 100 nm, for example between 0.1 nm and 100 nm, for example between 1 nm and 100 nm, for example between 1 nm and 50 nm, for example between 1 nm and 40 nm, for example between 1 nm and 30 nm, for example between 1 nm and 10 nm, for example between 1 nm and 5 nm. In other embodiments, the DPv50 is between 2 and 100, for example between 2 and 50, for example between 2 and 30, for example between 2 and 20, for example between 2 and 15, for example between 2 and 10.

The DPv90 for the porous carbon scaffold can vary, for example DPv90 can be between 0.01 nm and 100 nm, for example between 0.1 nm and 100 nm, for example between 1 nm and 100 nm, for example between 1 nm and 50 nm, for example between 1 nm and 50 nm, for example between 1 nm and 40 nm, for example between 1 nm and 30 nm, for example between 1 nm and 10 nm, for example between 1 nm and 5 nm. In other embodiments, the DPv50 is between 2 nm and 100 nm, for example between 2 nm and 50 nm, for example between 2 nm and 30 nm, for example between 2 nm and 20 nm, for example between 2 nm and 15 nm, for example between 2 nm and 10 nm.

In some embodiments, the DPv90 is less than 100 nm, for example less than 50 nm, for example less than 40 nm, for example less than 30 nn, for example less than 20 nn, for example less than 15 nm, for example less than 10 nm. In some embodiments, the carbon scaffold comprises a pore volume with greater than 70% micropores (and DPv90 less than 100 nm, for example DPv90 less than 50 nm, for example DPv90 less than 40 nm, for example DPv90 less than 30 nm, for example DPv90 less than 20 nm, for example DPv90 less than 15 nm, for example DPv90 less than 10 nm, for example DPv90 less than 5 nm, for example DPv90 less than 4 nm, for example DPv90 less than 3 nm. In other embodiments, the carbon scaffold comprises a pore volume with greater than 80% micropores and DPv90 less than 100 nm, for example DPv90 less than 50 nm, for example DPv90 less than 40 nm, for example DPv90 less than 30 nm, for example DPv90 less than 20 nm, for example DPv90 less than 15 nm, for example DPv90 less than 10 nm, for example DPv90 less than 5 nm, for example DPv90 less than 4 nm, for example DPv90 less than 3 nm.

The DPv99 for the porous carbon scaffold can vary, for example DPv99 can be between 0.01 nm and 1000 nm, for example between 0.1 nm and 1000 nm, for example between 1 nm and 500 nm, for example between 1 nm and 200 nm, for example between 1 nm and 150 nm, for example between 1 nm and 100 nm, for example between 1 nm and 50 nm, for example between 1 nm and 20 nm. In other embodiments, the DPv99 is between 2 nm and 500 nm, for example between 2 nm and 200 nm, for example between 2 nm and 150 nm, for example between 2 nm and 100 nm, for example between 2 nm and 50 nm, for example between 2 nm and 20 nm, for example between 2 nm and 15 nm, for example between 2 nm and 10 nm.

Embodiments of the composite with extremely durable intercalation of lithium disclosed herein improves the properties of any number of electrical energy storage devices, for example lithium ion batteries. In some embodiments, the silicon-carbon composite disclosed herein exhibits a Z less than 10, for example a Z less than 5, for example a Z less than 4, for example a Z less than 3, for example a Z less than 2, for example a Z less than 1, for example a Z less than 0.1, for example a Z less than 0.01, for example a Z less than 0.001. In certain embodiments, the Z is zero.

In certain preferred embodiment, the silicon-carbon composite comprises desirably low Z in combination with another desired physicochemical and/or electrochemical property or in combination with more than one other desired physicochemical and/or electrochemical properties. Table 1 provides a description of certain embodiments for combination of properties for the silicon-carbon composite, including reversible capacity. Surface area can be determined as known in the art, for example, by nitrogen gas sorption analysis. Silicon content can be determined as known in th art, for example by TGA. The property Z can be determined from TGA according to the current disclosure. First cycle efficiency can be determined as known in the art, for example calculated based on first cycle charge and discharge capacity in a full cell or half cell. For example, first cycle efficiency can be determined in a half cell for the voltage window of 5 mV to 0.8 V, or alternatively, 5 mV to 1.5 V. Reversible capacity can be described as the maximum reversible capacity or maximum capacity, and can be determined as known in the art, for example in a half cell for the voltage window of 5 mV to 0.8 V, or alternatively, 5 mV to 1.5 V.

TABLE 1

Embodiments for silicon-carbon composite with embodied properties.

| | In some embodiments the silicon-carbon composite comprises . . . |
|---|---|
| Z | <10, <5, <4, <3, <2, <1, <0.1, <0.01, <0.01, 0 |
| Surface Area | <100 m2/g, <50 m2/g, <30 m2/g, <20 m2/g, <10 m2/g, <5 m2/g, <4 m2/g, <3 m2/g, <2 m2/g, <1 m2/g; |
| First Cycle Efficiency | >75%, >80%, >85%, >90%, >91%, >92%, >93%, >94%, >95%, >96%, >97%, >98%, >99%; |
| Reversible Capacity | >1300 mAh/g, >1600 mAh/g, >1700 mAh/g, >1800 mAh/g, >1900 mAh/g, >2000 mAh/g, >2100 mAh/g, >2200 mAh/g, >2300 mAh/g, >2400 mAh/g, >2500 mAh/g, >2600 mAh/g, >2700 mAh/g, >2800 mAh/g, >2900 mAh/g, >3000 mAh/g; and/or |
| Silicon Content by weight | 10%-90%, 15-85%, 20%-80%, 30%-70%, 40%-60%. |

According to Table 1, the silicon-carbon composite may comprise combinations of various properties. For example, the silicon-carbon composite may comprise a Z less than 10, surface area less than 100 m2/g, a first cycle efficiency greater than 80%, and a reversible capacity of at least 1300 mAh/g. For example, the silicon-carbon composite may comprise a Z less than 10, surface area less than 100 m2/g, a first cycle efficiency greater than 80%, and a reversible capacity of at least 1600 mAh/g. For example, the silicon-carbon composite may comprise a Z less than 10, surface area less than 20 m2/g, a first cycle efficiency greater than 85%, and a reversible capacity of at least 1600 mAh/g. For example, the silicon-carbon composite may comprise a Z less than 10, surface area less than 10 m2/g, a first cycle efficiency greater than 85%, and a reversible capacity of at least 1600 mAh/g. For example, the silicon-carbon composite may comprise a Z less than 10, surface area less than 10 m2/g, a first cycle efficiency greater than 90%, and a reversible capacity of at least 1600 mAh/g. For example, the silicon-carbon composite may comprise a Z less than 10, surface area less than 10 m2/g, a first cycle efficiency greater than 90%, and a reversible capacity of at least 1800 mAh/g.

The silicon-carbon composite can comprise a combination of the aforementioned properties, in addition to also comprising a carbon scaffold comprising properties also described within this proposal. Accordingly, Table 2 provides a description of certain embodiments for combination of properties for the silicon-carbon composite.

TABLE 2

Embodiments for silicon-carbon composite with embodied properties.

| | In some embodiments the silicon-carbon composite comprises . . . |
|---|---|
| Z | <10, <5, <4, <3, <2, <1, <0.1, <0.01, <0.01, 0 |
| Surface Area | <100 m2/g, <50 m2/g, <30 m2/g, <20 m2/g, <10 m2/g, <5 m2/g, <4 m2/g, <3 m2/g, <2 m2/g, <1 m2/g; |

TABLE 2-continued

| Embodiments for silicon-carbon composite with embodied properties. | |
| --- | --- |
| First Cycle Efficiency | >75%, >80%, >85%, >90%, >91%, >92%, >93%, >94%, >95%, >96%, >97%, >98%, >99%; |
| Reversible Capacity | >1300 mAh/g, >1600 mAh/g, >1700 mAh/g, >1800 mAh/g, >1900 mAh/g, >2000 mAh/g, >2100 mAh/g, >2200 mAh/g, >2300 mAh/g, >2400 mAh/g, >2500 mAh/g, >2600 mAh/g, >2700 mAh/g, >2800 mAh/g, >2900 mAh/g, >3000 mAh/g; |
| Average Coulombic efficiency | ≥0.9969, ≥0.9970, ≥0.9975, ≥0.9980, ≥0.9985, ≥0.9990, ≥0.9995, ≥0.9999 |
| Silicon Content by weight | 10%-90%, 15-85%, 20%-80%, 30%-70%, 40%-60%; |
| Carbon Scaffold pore volume | 0.1-1.5 cm3/g, 0.2-1.2 cm3/g, 0.3-1.1 cm3/g, 0.4-1.0 cm3/g, 0.4-1.0 cm3/g, 0.5-1.0 cm3/g, 0.6-1.0 cm3/g, 0.5-0.9 cm3/g, 0.4-1.0 cm3/g, >0.1 cm3/g, >0.2 cm3/g, >0.4 cm3/g, >0.6 cm3/g, >0.8 cm3/g; |
| % silicon content | 15%-25%, 25%-35%, 20%-40%, 25%-50%, 30%-70%, 30%-60%, 60%-80%, 80%-100%; |
| Scaffold pore size range | <1 nm, 1-5 nm, 5-1000 nm, 10-500 nm, 10-200 nm, 10-100 nm, 33-150 nm, 20-100 nm; and/or |
| Percentage of microporosity/ mesoporosity/ macroporosity expressed as percentage of total pore volume | >20%/>30%/>30%, <10/>30/>30, <5/>30/>30, <5/>40/>40, <1/>40/>40, <10/>70/>20, <10/>20/>70, >10/>10/>80, <10/>80/>10, <5/>70/>20, <5/>20/>70, <5/>5/>80, <5/>80/>10, >80%/<20%/<20%, >70/<30/<10, >70/<30/<5, >70/<20/<10, >70/<10/<10, >70/<10/<5, >70/<5/<5, >80/<20/<10, >80/<20/<5, >80/<20/<1, >80/<10/<10, >80/<10/<5, >80/<10/<1, >90/<10/<10, >90/<10/<5, >90/<10/<1, >90/<5/<1, >95/<5/<5, >90/<5/<1 |
| $I_D/I_G$ | >2.0, 1.0-2.0, 0.8-1.0, 0.8-0.9, 0.9-1.0, 0.6-0.8, 0.6-0.7, 0.7-0.8, 0.4-0.6, 0.4-0.5, 0.5-0.6, 0.2-0.4, 0.2-0.3, 0.3-0.4, 0.01-0.2, 0.01-0.1, 0.1-0.2, ≤0.7, ≤0.6, ≤0.5, ≤0.4, ≤0.3, ≤0.2, ≤0.1, ≤0.05, ≤0.01 |

As used in herein, the percentage "microporosity," "mesoporosity" and "macroporosity" refers to the percent of micropores, mesopores and macropores, respectively, as a percent of total pore volume. For example, a carbon scaffold having 90% microporosity is a carbon scaffold where 90% of the total pore volume of the carbon scaffold is formed by micropores.

According to Table 2, the silicon-carbon composite may comprise combinations of various properties. For example, the silicon-carbon composite may comprise a $I_D/I_G \leq 0.7$, a Z less than 10, surface area less than 100 m2/g, a first cycle efficiency greater than 80%, a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a $I_D/I_G \leq 0.7$, a Z less than 10, surface area less than 20 m2/g, a first cycle efficiency greater than 85%, and a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a $I_D/I_G \leq 0.7$, a Z less than 10, surface area less than 10 m2/g, a first cycle efficiency greater than 85%, and a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a $I_D/I_G \leq 0.7$, Z less than 10, surface area less than 10 m2/g, a first cycle efficiency greater than 90%, and a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a $I_D/I_G \leq 0.7$, a Z less than 10, surface area less than 10 m2/g, a first cycle efficiency greater than 90%, and a reversible capacity of at least 1800 mAh/g, a silicon content of 15%-85%, a carbon scaffold total pore volume of 0.2-1.2 cm3/g wherein the scaffold pore volume comprises >80% micropores, <20% mesopores, and <10% macropores.

Also according to Table 2, the silicon-carbon composite may comprise a carbon scaffold with >80% micropores, silicon content of 30-60%, average Coulombic efficiency of ≥0.9969, and Z<10. For example, the silicon-carbon composite may comprise a carbon scaffold with >80% micropores, silicon content of 30-60%, average Coulombic efficiency of ≥0.9970, and Z<10. For example, the silicon-carbon composite may comprise a carbon scaffold with >80% micropores, silicon content of 30-60%, average Coulombic efficiency of ≥0.9975, and Z<10. For example, the silicon-carbon composite may comprise a carbon scaffold with >80% micropores, silicon content of 30-60%, average Coulombic efficiency of ≥0.9980, and Z<10. For example, the silicon-carbon composite may comprise a carbon scaffold with >80% micropores, silicon content of 30-60%, average Coulombic efficiency of ≥0.9985, and Z<10. For example, the silicon-carbon composite may comprise a carbon scaffold with >80% micropores, silicon content of 30-60%, average Coulombic efficiency of ≥0.9990, and Z<10. For example, the silicon-carbon composite may comprise a carbon scaffold with >80% micropores, silicon content of 30-60%, average Coulombic efficiency of ≥0.9995, and Z<10. For example, the silicon-carbon composite may comprise a carbon scaffold with >80% micropores, silicon content of 30-60%, average Coulombic efficiency of ≥0.9970, and Z<10. For example, the silicon-carbon composite may comprise a carbon scaffold with >80% micropores, silicon content of 30-60%, average Coulombic efficiency of ≥0.9999, and Z<10.

Without being bound by theory, the filling of silicon within the pores of the porous carbon traps porosity within the porous carbon scaffold particle, resulting in inaccessible volume, for example volume that is inaccessible to nitrogen gas. Accordingly, the silicon-carbon composite material may exhibit a pycnometry density of less than 2.1 g/cm3, for example less than 2.0 g/cm3, for example less than 1.9 g/cm3, for example less than 1.8 g/cm3, for example less than 1.7 g/cm3, for example less than 1.6 g/cm3, for example less than 1.4 g/cm3, for example less than 1.2 g/cm3, for example less than 1.0 g/cm3.

In some embodiments, the silicon-carbon composite material may exhibit a pycnometry density between 1.7 g·cm3 and 2.1 g/cm3, for example between 1.7 g·cm3 and 1.8 g/cm3, between 1.8 g·cm3 and 1.9 g/cm3, for example between 1.9 g·cm3 and 2.0 g/cm3, for example between 2.0 g·cm3 and 2.1 g/cm3. In some embodiments, the silicon-carbon composite material may exhibit a pycnometry density between 1.8 g·cm3 and 2.1 g/cm3. In some embodiments, the silicon-carbon composite material may exhibit a pycnometry density between 1.8 g·cm3 and 2.0 g/cm3. In some embodiments, the silicon-carbon composite material may exhibit a pycnometry density between 1.9 g·cm3 and 2.1 g/cm3.

The pore volume of the composite material exhibiting extremely durable intercalation of lithium can range between 0.01 cm3/g and 0.2 cm3/g. In certain embodiments, the pore volume of the composite material can range between 0.01 cm3/g and 0.15 cm3/g, for example between 0.01 cm3/g and 0.1 cm3/g, for example between 0.01 cm3/g and 0.05 cm2/g.

The particle size distribution of the composite material exhibiting extremely durable intercalation of lithium is important to both determine power performance as well as volumetric capacity. As the packing improves, the volumetric capacity may increase. In one embodiment the distributions are either Gaussian with a single peak in shape, bimodal, or polymodal (>2 distinct peaks, for example trimodal). The properties of particle size of the composite can be described by the DO (smallest particle in the distribution), Dv50 (average particle size) and Dv100 (maximum size of the largest particle). The optimal combined of particle packing and performance will be some combination of the size ranges below. The particle size reduction in the such embodiments can be carried out as known in the art, for example by jet milling in the presence of various gases including air, nitrogen, argon, helium, supercritical steam, and other gases known in the art.

In one embodiment the Dv0 of the composite material can range from 1 nm to 5 microns. In another embodiment the Dv0 of the composite ranges from 5 nm to 1 micron, for example 5-500 nm, for example 5-100 nm, for example 10-50 nm. In another embodiment the Dv0 of the composite ranges from 500 nm to 2 microns, or 750 nm to 1 um, or 1-2 um. microns to 2 microns. In other embodiments, the Dv0 of the composite ranges from 2-5 um, or >5 um.

In one embodiment the Dv1 of the composite material can range from 1 nm to 5 microns. In another embodiment the Dv1 of the composite ranges from 5 nm to 1 micron, for example for example 5-500 nm, for example 5-100 nm, for example 10-50 nm. In another embodiment the Dv1 of the composite ranges from 100 nm to 10 microns, 200 nm to 5 microns, 500 nm to 2 microns, or 750 nm to 1 um, or 1-2 um. microns to 2 microns. In other embodiments, the Dv1 of the composite ranges from 2-5 um, or >5 um.

In one embodiment the Dv10 of the composite material can range from 1 nm to 10 microns. In another embodiment the Dv10 of the composite ranges from 5 nm to 1 micron, for example for example 5-500 nm, for example 5-100 nm, for example 10-50 nm. In another embodiment the Dv10 of the composite ranges from 100 nm to 10 microns, 500 nm to 10 microns, 500 nm to 5 microns, or 750 nm to 1 um, or 1-2 um. In other embodiments, the Dv 10 of the composite ranges from 2-5 um, or >5 um.

In some embodiments the Dv50 of the composite material ranges from 5 nm to 20 um. In other embodiments the Dv50 of the composite ranges from 5 nm to 1 um, for example 5-500 nm, for example 5-100 nm, for example 10-50 nm. In another embodiment the Dv50 of the composite ranges from 500 nm to 2 um, 750 nm to 1 um, 1-2 um. In still another embodiments, the Dv50 of the composite ranges from 1 to 1000 um, for example from 1-100 um, for example from 1-10 um, for example 2-20 um, for example 3-15 um, for example 4-8 um. In certain embodiments, the Dv50 is >20 um, for example >50 um, for example >100 um.

The span (Dv50)/(Dv90-Dv10), wherein Dv10, Dv50 and Dv90 represent the particle size at 10%, 50%, and 90% of the volume distribution, can be varied from example from 100 to 10, from 10 to 5, from 5 to 2, from 2 to 1; in some embodiments the span can be less than 1. In certain embodiments, the composite comprising carbon and porous silicon material particle size distribution can be multimodal, for example, bimodal, or trimodal.

The surface functionality of the presently disclosed the composite material exhibiting extremely durable intercalation of lithium may be altered to obtain the desired electrochemical properties. One property which can be predictive of surface functionality is the pH of the composite materials. The presently disclosed composite materials comprise pH values ranging from less than 1 to about 14, for example less than 5, from 5 to 8 or greater than 8. In some embodiments, the pH of the composite materials is less than 4, less than 3, less than 2 or even less than 1. In other embodiments, the pH of the composite materials is between about 5 and 6, between about 6 and 7, between about 7 and 8 or between 8 and 9 or between 9 and 10. In still other embodiments, the pH is high and the pH of the composite materials ranges is greater than 8, greater than 9, greater than 10, greater than 11, greater than 12, or even greater than 13.

The silicon-carbon composite material may comprise varying amounts of carbon, oxygen, hydrogen and nitrogen as measured by gas chromatography CHNO analysis. In one embodiment, the carbon content of the composite is greater than 98 wt. % or even greater than 99.9 wt % as measured by CHNO analysis. In another embodiment, the carbon content of the silicon-carbon composite ranges from about 10-90%, for example 20-80%, for example 30-70%, for example 40-60%.

In some embodiments, silicon-carbon composite material comprises a nitrogen content ranging from 0-90%, example 0.1-1%, for example 1-3%, for example 1-5%, for example 1-10%, for example 10-20%, for example 20-30%, for example 30-90%.

In some embodiments, the oxygen content ranges from 0-90%, example 0.1-1%, for example 1-3%, for example 1-5%, for example 1-10%, for example 10-20%, for example 20-30%, for example 30-90%.

The silicon-carbon composite material may also incorporate an electrochemical modifier selected to optimize the electrochemical performance of the non-modified composite. The electrochemical modifier may be incorporated within the pore structure and/or on the surface of the porous carbon scaffold, within the embedded silicon, or within the final layer of carbon, or conductive polymer, coating, or incorporated in any number of other ways. For example, in some embodiments, the composite materials comprise a coating of the electrochemical modifier (e.g., silicon or $Al_2O_3$) on the surface of the carbon materials. In some embodiments, the composite materials comprise greater than about 100 ppm of an electrochemical modifier. In certain embodiments, the electrochemical modifier is selected from iron, tin, silicon, nickel, aluminum and manganese.

In certain embodiments the electrochemical modifier comprises an element with the ability to lithiate from 3 to 0 V versus lithium metal (e.g., silicon, tin, sulfur). In other embodiments, the electrochemical modifier comprises metal oxides with the ability to lithiate from 3 to 0 V versus lithium metal (e.g., iron oxide, molybdenum oxide, titanium oxide). In still other embodiments, the electrochemical modifier comprises elements which do not lithiate from 3 to 0 V versus lithium metal (e.g., aluminum, manganese, nickel, metal-phosphates). In yet other embodiments, the electrochemical modifier comprises a non-metal element (e.g., fluorine, nitrogen, hydrogen). In still other embodiments, the electrochemical modifier comprises any of the foregoing electrochemical modifiers or any combination thereof (e.g., tin-silicon, nickel-titanium oxide).

The electrochemical modifier may be provided in any number of forms. For example, in some embodiments the electrochemical modifier comprises a salt. In other embodiments, the electrochemical modifier comprises one or more elements in elemental form, for example elemental iron, tin, silicon, nickel or manganese. In other embodiments, the electrochemical modifier comprises one or more elements in oxidized form, for example iron oxides, tin oxides, silicon oxides, nickel oxides, aluminum oxides or manganese oxides.

The electrochemical properties of the composite material can be modified, at least in part, by the amount of the electrochemical modifier in the material, wherein the electrochemical modifier is an alloying material such as silicon, tin, indium, aluminum, germanium, gallium. Accordingly, in some embodiments, the composite material comprises at least 0.10%, at least 0.25%, at least 0.50%, at least 1.0%, at least 5.0%, at least 10%, at least 25%, at least 50%, at least 75%, at least 90%, at least 95%, at least 99% or at least 99.5% of the electrochemical modifier.

The particle size of the composite material may expand upon lithiation as compared to the non-lithiated state. For example, the expansion factor, defined as ratio of the average particle size of particles of composite material comprising a porous silicon material upon lithiation divided by the average particle size under non-lithiated conditions. As described in the art, this expansion factor can be relatively large for previously known, non-optimal silicon-containing materials, for example about 4x (corresponding to a 400% volume expansion upon lithiation). The current inventors have discovered composite materials comprising a porous silicon material that can exhibit a lower extent of expansion, for example, the expansion factor can vary from 3.5 to 4, from 3.0 to 3.5, from 2.5 to 3.0, from 2.0 to 2.5, from 1.5 to 2.0, from 1.0 to 1.5.

It is envisioned that composite materials in certain embodiments will comprise a fraction of trapped pore volume, namely, void volume non-accessible to nitrogen gas as probed by nitrogen gas sorption measurement. Without being bound by theory, this trapped pore volume is important in that it provides volume into which silicon can expand upon lithiation.

In certain embodiments, the ratio of trapped void volume to the silicon volume comprising the composite particle is between 0.1:1 and 10:1. For example, the ratio of trapped void volume to the silicon volume comprising the composite particle is between 1:1 and 5:1, or 5:1 to 10:1. In embodiments, the ratio of ratio trapped void volume to the silicon volume comprising the composite particle is between 2:1 and 5:1, or about 3:1, in order to efficiently accommodate the maximum extent of expansion of silicon upon lithiation.

In certain embodiments, the electrochemical performance of the composite disclosed herein is tested in a half-cell; alternatively the performance of the composite with extremely durable intercalation of lithium disclosed herein is tested in a full cell, for example a full cell coin cell, a full cell pouch cell, a prismatic cell, or other battery configurations known in the art. The anode composition comprising the composite with extremely durable intercalation of lithium disclosed herein can further comprise various species, as known in the art. Additional formulation components include, but are not limited to, conductive additives, such as conductive carbons such as Super C45, Super P, Ketjenblack carbons, and the like, conductive polymers and the like, binders such as styrene-butadiene rubber sodium carboxymethylcellulose (SBR—Na-CMC), polyvinylidene difluoride (PVDF), polyimide (PI), polyacrylic acid (PAA) and the like, and combinations thereof. In certain embodiments, the binder can comprise a lithium ion as counter ion.

Other species comprising the electrode are known in the art. The % of active material in the electrode by weight can vary, for example between 1 and 5%, for example between 5 and 15%, for example between 15 and 25%, for example between 25 and 35%, for example between 35 and 45%, for example between 45 and 55%, for example between 55 and 65%, for example between 65 and 75%, for example between 75 and 85%, for example between 85 and 95%. In some embodiments, the active material comprises between 80 and 95% of the electrode. In certain embodiment, the amount of conductive additive in the electrode can vary, for example between 1 and 5%, between 5 and 15%, for example between 15 and 25%, for example between 25 and 35%. In some embodiments, the amount of conductive additive in the electrode is between 5 and 25%. In certain embodiments, the amount of binder can vary, for example between 1 and 5%, between 5 and 15%, for example between 15 and 25%, for example between 25 and 35%. In certain embodiments, the amount of conductive additive in the electrode is between 5 and 25%.

The silicon-carbon composite material may be prelithiated, as known in the art. In certain embodiments, the prelithiation is achieved electrochemically, for example in a half cell, prior to assembling the lithiated anode comprising the porous silicon material into a full cell lithium ion battery. In certain embodiments, prelithiation is accomplished by doping the cathode with a lithium-containing compound, for example a lithium containing salt. Examples of suitable lithium salts in this context include, but are not limited to, dilithium tetrabromonickelate(II), dilithium tetrachlorocuprate(II), lithium azide, lithium benzoate, lithium bromide, lithium carbonate, lithium chloride, lithium cyclohexanebutyrate, lithium fluoride, lithium formate, lithium hexafluoroarsenate(V), lithium hexafluorophosphate, lithium hydroxide, lithium iodate, lithium iodide, lithium metaborate, lithium perchlorate, lithium phosphate, lithium sulfate, lithium tetraborate, lithium tetrachloroaluminate, lithium tetrafluoroborate, lithium thiocyanate, lithium trifluoromethanesulfonate, lithium trifluoromethanesulfonate, and combinations thereof.

The anode comprising the silicon-carbon composite material can be paired with various cathode materials to result in a full cell lithium ion battery. Examples of suitable cathode materials are known in the art. Examples of such cathode materials include, but are not limited to $LiCoO_2$ (LCO), $LiNi_{0.8}Co_{0.15}Al_{0.05}O_2$ (NCA), $LiNi_{1/3}Co_{1/3}Mn_{1/3}O_2$ (NMC), $LiMn_2O_4$ and variants (LMO), and $LiFcPO_4$ (LFP).

For the full cell lithium ion battery comprising an anode further comprising the silicon-carbon composite material, pairing of cathode to anode can be varied. For example, the ratio of cathode-to-anode capacity can vary from 0.7 to 1.3. In certain embodiments, the ratio of cathode-to-anode capacity can vary from 0.7 to 1.0, for example from 0.8 to 1.0, for example from 0.85 to 1.0, for example from 0.9 to 1.0, for example from 0.95 to 1.0. In other embodiments, the ratio of cathode-to-anode capacity can vary from 1.0 to 1.3, for example from 1.0 to 1.2, for example from 1.0 to 1.15, for example from 1.0 to 1.1, for example from 1.0 to 1.05. In yet other embodiments, the ratio of cathode-to-anode capacity can vary from 0.8 to 1.2, for example from 0.9 to 1.1, for example from 0.95 to 1.05.

For the full cell lithium ion battery comprising an anode further comprising the silicon-carbon composite material, the voltage window for charging and discharging can be varied. In this regard, the voltage window can be varied as known in the art, depending on various properties of the lithium ion battery. For instance, the choice of cathode plays a role in the voltage window chosen, as known in the art. Examples of voltage windows vary, for example, in terms of potential versus Li/Li+, from 2.0 V to 5.0 V, for example from 2.5 V to 4.5V, for example from 2.5V to 4.2V.

For the full cell lithium ion battery comprising an anode further comprising the silicon-carbon composite material, the strategy for conditioning the cell can be varied as known in the art. For example, the conditioning can be accomplished by one or more charge and discharge cycles at various rate(s), for example at rates slower than the desired cycling rate. As known in the art, the conditioning process may also include a step to unseal the lithium ion battery, evacuate any gases generated within during the conditioning process, followed by resealing the lithium ion battery.

For the full cell lithium ion battery comprising an anode further comprising the silicon-carbon composite material, the cycling rate can be varied as known in the art, for example, the rate can between C/20 and 20 C, for example between C10 to 10 C, for example between C/5 and 5 C. In certain embodiments, the cycling rate is C/10. In certain embodiments, the cycling rate is C/5. In certain embodiments, the cycling rate is C/2. In certain embodiments, the cycling rate is IC. In certain embodiments, the cycling rate is IC, with periodic reductions in the rate to a slower rate, for example cycling at 1 C with a C/10 rate employed every 20th cycle. In certain embodiments, the cycling rate is 2 C. In certain embodiments, the cycling rate is 4 C. In certain embodiments, the cycling rate is 5 C. In certain embodiments, the cycling rate is 10 C. In certain embodiments, the cycling rate is 20 C.

The first cycle efficiency of the composite with extremely durable intercalation of lithium disclosed herein be determined by comparing the lithium inserted into the anode during the first cycle to the lithium extracted from the anode on the first cycle, prior prelithiation modification. When the insertion and extraction are equal, the efficiency is 100%. As known in the art, the anode material can be tested in a half-cell, where the counter electrode is lithium metal, the electrolyte is a IM $LiPF_6$ 1:1 ethylene carbonate:diethylcarbonate (EC:DEC), using a commercial polypropylene separator. In certain embodiments, the electrolyte can comprise various additives known to provide improved performance, such as fluoroethylene carbonate (FEC) or other related fluorinated carbonate compounds, or ester co-solvents such as methyl butyrate, vinylene carbonate, and other electrolyte additives known to improve electrochemical performance of silicon-comprising anode materials.

In certain embodiments, the first cycle efficiency in a half cell can be determined over the voltage window from 5 mV to 0.8 V. In another embodiment, the first cycle efficiency in a half cell can be determined over the voltage window from 5 mV to 1.0 V. In another embodiment, the first cycle efficiency in a half cell can be determined over the voltage window from 5 mV to 1.5 V. In another embodiment, the first cycle efficiency in a half cell can be determined over the voltage window from 5 mV to 2.0 V. In other embodiments, the first cycle efficiency is determined in a full cell battery, for example over the voltage window from 2.0 V to 4.5 V, or 2.3 V to 4.5 V, or 2.5 V to 4.2 V, or 3.0 V to 4.2 V.

Coulombic efficiency can be averaged, for example averaged over cycles 7 to cycle 25 when tested in a half cell. Coulombic efficiency can be averaged, for example averaged over cycles 7 to cycle 20 when tested in a half cell. In certain embodiments, the average efficiency of the composite with extremely durable intercalation of lithium is greater than 0.9, or 90%. In certain embodiments, the average efficiency is greater than 0.95, or 95%. In certain other embodiments, the average efficiency is 0.99 or greater, for example 0.991 or greater, for example 0.992 or greater, for example 0.993 or greater, for example 0.994 or greater, for example 0.995 or greater, for example 0.996 or greater, for example 0.997 or greater, for example 0.998 or greater, for example 0.999 or greater, for example 0.9991 or greater, for example 0.9992 or greater, for example 0.9993 or greater, for example 0.9994 or greater, for example 0.9995 or greater, for example 0.9996 or greater, for example 0.9997 or greater, for example 0.9998 or greater, for example 0.9999 or greater.

In still other embodiments the present disclosure provides a composite material exhibiting extremely durable intercalation of lithium, wherein when the composite material is incorporated into an electrode of a lithium-based energy storage device the composite material has a volumetric capacity at least 10% greater than when the lithium based energy storage device comprises a graphite electrode. In some embodiments, the lithium based energy storage device is a lithium ion battery. In other embodiments, the composite material has a volumetric capacity in a lithium-based energy storage device that is at least 5% greater, at least 10% greater, at least 15% greater than the volumetric capacity of the same electrical energy storage device having a graphite electrode. In still other embodiments, the composite material has a volumetric capacity in a lithium based energy storage device that is at least 20% greater, at least 30% greater, at least 40% greater, at least 50% greater, at least 200% greater, at least 100% greater, at least 150% greater, or at least 200% greater than the volumetric capacity of the same electrical energy storage device having a graphite electrode.

The composite material may be prelithiated, as known in the art. These lithium atoms may or may not be able to be separated from the carbon. The number of lithium atoms to 6 carbon atoms can be calculated by techniques known to those familiar with the art:

$$\#Li = Q \times 3.6 \times MM/(C\ \% \times F)$$

wherein Q is the lithium extraction capacity measured in mAh/g between the voltages of 5 mV and 2.0V versus lithium metal, MM is 72 or the molecular mass of 6 carbons, F is Faraday's constant of 96500, C % is the mass percent carbon present in the structure as measured by CHNO or XPS.

The composite material can be characterized by the ratio of lithium atoms to carbon atoms (Li:C) which may vary between about 0:6 and 2:6. In some embodiments the Li:C ratio is between about 0.05:6 and about 1.9:6. In other embodiments the maximum Li:C ratio wherein the lithium is in ionic and not metallic form is 2.2:6. In certain other embodiments, the Li:C ratio ranges from about 1.2:6 to about 2:6, from about 1.3:6 to about 1.9:6, from about 1.4:6 to about 1.9:6, from about 1.6:6 to about 1.8:6 or from about 1.7:6 to about 1.8:6. In other embodiments, the Li:C ratio is greater than 1:6, greater than 1.2:6, greater than 1.4:6, greater than 1.6:6 or even greater than 1.8:6. In even other embodiments, the Li:C ratio is about 1.4:6, about 1.5:6, about 1.6:6, about 1.6:6, about 1.7:6, about 1.8:6 or about 2:6. In a specific embodiment the Li:C ratio is about 1.78:6.

In certain other embodiments, the composite material comprises an Li:C ratio ranging from about 1:6 to about 2.5:6, from about 1.4:6 to about 2.2:6 or from about 1.4:6 to about 2:6. In still other embodiments, the composite materials may not necessarily include lithium, but instead have a lithium uptake capacity (i.e., the capability to uptake a certain quantity of lithium, for example upon cycling the material between two voltage conditions (in the case of a lithium ion half cell, an exemplary voltage window lies between 0 and 3 V, for example between 0.005 and 2.7 V, for example between 0.005 and 1 V, for example between 0.005 and 0.8 V). While not wishing to be bound by theory, it is believed the lithium uptake capacity of the composite materials contributes to their superior performance in lithium based energy storage devices. The lithium uptake capacity is expressed as a ratio of the atoms of lithium taken up by the composite. In certain other embodiments, the composite material exhibiting extremely durable intercalation of lithium comprise a lithium uptake capacity ranging from about 1:6 to about 2.5:6, from about 1.4:6 to about 2.2:6 or from about 1.4:6 to about 2:6.

In certain other embodiments, the lithium uptake capacity ranges from about 1.2:6 to about 2:6, from about 1.3:6 to about 1.9:6, from about 1.4:6 to about 1.9:6, from about 1.6:6 to about 1.8:6 or from about 1.7:6 to about 1.8:6. In other embodiments, the lithium uptake capacity is greater than 1:6, greater than 1.2:6, greater than 1.4:6, greater than 1.6:6 or even greater than 1.8:6. In even other embodiments, the Li:C ratio is about 1.4:6, about 1.5:6, about 1.6:6, about 1.6:6, about 1.7:6, about 1.8:6 or about 2:6. In a specific embodiment the Li:C ratio is about 1.78:6.

E. Methods of Passivation to Control Oxygen Content and Reactivity of Silicon-Carbon Materials with Silane Used as Silicon Precursor The nature of low-temperature chemical vapor deposition utilizing silane gas to yield elemental silicon produces an amorphous structure that is prone to rapid oxidation (pyrophoric) when not passivated properly. The current state of art for passivation of the as-synthesized silicon requires simply introducing air while still in the furnace to react without fear of flammability concerns. The problem is the extent of oxidation can vary drastically depending on the ending surface area of the composite. For instance, high surface area composites will react more easily with oxygen, heat up exponentially, and further oxidize as a result. While lower surface area composites will passivate more slowly and generate very little heat. The latter case would seem most ideal however in order to better understand and exploit the presumably improved electrochemical cycle stability of higher surface area (smaller dimensional silicon) composites an alternative passivation method is required to have low oxygen content and maintain the as-deposited silicon morphology. The invention described herein outlines several methods to passivate the surface of the as-deposited silicon material by exposing it to benign (non-oxygen) gas species in order to keep the exothermic temperature low and thus afford the lowest achievable oxygen content and highest capacity.

The prior art describes methods to passivate silicon surfaces that are present of silicon films and particles including nanocrystals (e.g., Sun et al., 2016, "Heterogeneous reduction of carbon dioxide by hydride-terminated silicon nanocrystals" *Nature Communications,* 7:1-9; Cicero et al., 2000, "Photoreactivity of Unsaturated Compounds with Hydrogen-Terminated Silicon (111)," *Langmuir* 16:5688-5695; Cai et al., 2004, "Direct electrical detection of DNA Hybridization at DNA-modified silicon surfaces," *Biosensors and Bioelectronics* 19:1013-1019 (2004). This prior art does not address the very different and much more challenging task of passivating the surface of amorphous nano-sized silicon present within a pore of porous carbon scaffold. That is, the prior art does not address how to passivate the silicon surface for silicon prepared via CVI, namely silicon impregnated into the pores of porous carbon scaffold via CVI.

The function of this invention is mitigating over-oxidation of silicon derived from a silane CVI reaction in which high surface area and low-oxygen content Si—C composites may be obtained. By controlling the time, temperature, and gas species and concentration it would be possible to influence the passivation characteristics of the silicon so as to maintain an as-deposited amorphous structure, and increase Li-ion capacity. Furthermore, without being bound by theory, such passivation of silicon prepared via CVI results in improved Li-ion rate capability by minimizing the thickness of the oxide barrier.

When suddenly exposing high surface area silane-derived silicon to air an intense exothermic oxidation takes place which can be exacerbated by thermal runaway potentially fully oxidizing the silicon present (i.e., rendering it inert/unusable) and creating a flammability safety concern. This invention solves the problems associated with pyrophoric silane-derived silicon when deposited on high surface area (particularly >500 m2/g) substrates by allowing for gradual controlled passivation of the material.

In some embodiments, the silicon produced via CVI can be passivated by cooling the freshly prepared silicon-carbon material under nitrogen flow down to a temperature lower than the CVI reaction temperature, for example down to <400° C., or <350° C., or <300° C., or <250° C., or <200° C., or <150° C., or <100° C., or <50° C., followed by introduction of air, or, alternatively, oxygen gas, either in pure form, or blended with nitrogen gas at various percentages, for example, the passivation gas stream may comprise 1% oxygen and 99% nitrogen, or comprise 5% oxygen and 95% nitrogen, or comprise 10% oxygen and 90% nitrogen, or comprise 15% oxygen and 85% nitrogen, or comprise 20% oxygen and 80% nitrogen, or the passivation gas steam may comprise >20% oxygen gas in nitrogen gas mixture.

Typical low-temperature chemical vapor deposition (CVD) reactions involving hydride-based (e.g., silane) gaseous precursors resulting in highly disordered nano-films/particles often exhibit an innate tendency to oxidize or passivate upon exposure to atmospheric conditions. The extent and exothermic nature to which this occurs is most strongly dictated by the size and crystallinity of the as-deposited material. In the case of polycrystalline growth as performed by the photovoltaics industry the deposition conditions are often performed at much higher temperatures (>600° C.) and form thick films or granular particles. These materials not only exhibit high crystallinity but very low surface area resulting in very slow and benign reactivity on exposure to air, thus controlling the extent of passivation is trivially unnecessary.

In contrast to the prior art, the current invention discloses passivation methods for silicon produced via CVI, for example silicon produced within the pores of porous carbon scaffold via CVI. When low-temperature elemental silicon CVI is performed on very tortuous, porous, high surface area materials with irregular morphologies and high surface area (e.g., particulate porous carbon comprising surface area>500 m2/g and total pore volume>0.4 cm3/g), the silicon structure is much more disordered (amorphous), contains a high percentage of surface-terminated reactive hydrogen bonds, and is dimensionally very small (for example <200 nm, or <100 nm, or <50 nm, or <30 nm, or <20 nm, or <10 nm, or <5 nm, or <3 nm, or <2 nm, or <1 nm). These material properties result in a dramatic reduction in the energy of activation required for silicon oxidation to occur under atmospheric conditions thus resulting in uncontrolled and often unsafe reactivity (pyrophoric) towards oxygen on exposure to air. The material can undergo thermal runaway, burning, and perhaps completely oxidizing to silicon dioxide as a result. Thermal runaway is herein numerically defined as a silicon-carbon composite following silane CVI processing being removed from the reactor at a temperature <50° C. and proceeds to heat to temperatures >50° C. upon exposure to air. In order to control the extent of oxidation of as-deposited nano-silicon the method of passivation must be carefully controlled so as to satisfy the thermodynamic susceptibility but limit the kinetic reactivity as described in this invention.

In the case when air is used as the passivating agent, it is important to limit the reactant (oxygen) concentration on initial exposure to the as-deposited amorphous silicon so as to minimize thermal runaways. In one embodiment, following silicon CVI on a porous carbon scaffold the material is cooled to <100° C. under an inert gas, followed by air is slowly introduced into the reaction chamber initially at a total diluted oxygen content of 1 vol %. Sufficient time is allowed to go by so as to ensure complete purge of the chamber volume and stoichiometric excess of O:Si. At this point, the oxygen concentration is increased incrementally (e.g., ~5, 10, 15, and finally 20 vol % oxygen) by reducing the inert gas flow through the chamber allowing for ample purge time and stoichiometric excess of O:Si. The passivation is considered complete once the oxygen concentration has reached that of ambient air and the sample can then be safely removed from the reaction chamber.

In another embodiment, following silicon CVI on a porous carbon scaffold the material is cooled to <100° C. under an inert gas, followed by reduction in pressure, for example to a pressure of <700 Torr, or <600 Torr, or <500 Torr, or <300 Torr, or <100 Torr, or <50 Torr, or <30 Torr, or <20 Torr, or <10 Torr, or <5 Torr, or <3 Torr, or <2 Torr, or <1 Torr. Subsequently, air is incrementally introduced until specific pressures are achieved (e.g., 50 Torr, 100 Torr, 200 Torr, 300 Torr, 500 Torr, 600 Torr, 760 Torr) and allowed to dwell for specific increments of time (e.g., 1 min, or 5 min, or 10 min, or 20 min, or 30 min, or 60 min). This method foregoes the need of controlling the dilution of air with an inert gas stream and instead uses vacuum as the "diluent." The advantage of this method is reduction in convective heat flow due to partial vacuum conditions thereby mitigating a thermal runaway before it can start. Without being bound by theory, the reduction in pressure prior to passivation is important for passivating silicon within the carbon pore and hence relatively inaccessible to the gas phase, for example silicon produced via CVI, which presents a very different situation compared to prior art for passivating silicon present on a surface that is relatively accessible to the gas phase.

Aside from controlling the concentration and distribution of the oxygen reactant, silicon passivation can also be achieved by exploiting the reactivity of surface terminated hydrogen (Si—H) bonds using chemical reactions known in the art. In one such embodiment, following silicon deposition on a porous substrate the material is cooled/heated to ~400° C. under an inert gas. At which point, carbon dioxide is introduced into the furnace where it undergoes a self-terminating hydride-exchange reaction with the Si—H surface group (Si—H+CO2→Si—OH+CO) thus resulting in a hydroxyl termination no longer susceptible to further oxidation on eventual exposure to air.

In yet another embodiment, following silicon deposition on a porous substrate the material is cooled/heated to 100 to 200° C. under an inert gas. At which point, an alkene or alkyne gas (e.g., ethylene, propylene, acetylene, etc.) is introduced into the furnace and allowed to dwell for a period of time (e.g., 1-24 hours) where it undergoes a self-terminating hydrosilylation reaction2,3 with the Si—H surface group (Si—H+R1=R2→Si—R1H—R2) thus resulting in an alkyl termination no longer susceptible to further oxidation on eventual exposure to air. This particular passivation reaction is advantageous because it emits no byproducts and imparts no oxygen content thereby potentially improving electrochemical anode performance by mitigating formation of irreversible Li—O byproducts in a Li-ion battery.

An alternative approach to air passivation over those stated above would be following silicon deposition on a porous substrate the material is cooled to <100° C. the chamber is evacuated and backfilled with just enough oxygen as to stoichiometrically react with the surface monolayer of silicon. The chamber is held under these conditions for a nominal amount of time (e.g., several hours) to ensure enough time for passivation and heat loss to take place. This method would ensure the most minimal amount of oxygen needed to create an oxide film preventing any further oxidation.

In the case of passivation using the hydrosilylation reaction, the specific alkene can be tailored so to impart certain advantageous characteristics including but not limited to hydrophobicity, covalent cross-linking with common Li-ion anode binders, or artificial SEI.

In the case of passivation using carbon dioxide or hydrosilylation, the reaction can be initiated using UV light instead of heat. This would have the advantage of limiting further CO2 diffusion into the silicon bulk by keeping the material at a cooler (ambient) temperature.

In some embodiments, the passivation gas comprises an oxygen species, and the passivation gas is a liquid at room temperature. In such embodiments, the reaction between the passivation gas the silicon not only achieves the desired passivation of the silicon surface, but also, without being bound by theory, results in chemical modification of the surface to improve electrochemical properties, and/or stability of the silicon materials. In some embodiments, the passivation in this regard results in formation of silyl ether species that provide for improved performance for the silicon-carbon composite material when employed as an anode for lithium ion batteries, for example provide for more stable SEI, improved calendar life, increased cycle life, and/or improved performance at elevated temperatures such as 45 C or 60 C.

Examples of passivation gases for passivating silicon prepared via CVI include, but are not limited to, oxygen, carbon dioxide, water, methanol, ethanol, propanol, butanol, dimethyl carbonate, ethylene carbonate, propylene carbonate, ethyl methyl carbonate, diethyl carbonate, vinylene carbonate, fluoroethylene carbonate, and mixtures thereof.

In certain embodiments, the current invention comprises a method of passivating the surface of hydrogen-terminated silicon-carbon composites using alkene and/or alkyne chemical species to improve atmospheric temperature (shelf-life) and electrochemical stability for anodes in Li-ion batteries. For such composites produced via CVI employing a silicon-containing gas such as silane as the silicon precursor, the resulting silicon within the silicon-carbon composite is amorphous and such structure is prone to rapid oxidation (thermal runaway) unless passivated thoroughly.

Prior to this current invention, state-of-the-art passivation of the as-synthesized silicon comprised solely introducing air after completion of the CVI process for newly synthesized silicon-carbon composite material still in the CVI furnace, or within a cooling chamber downstream of the CVI furnace. However, this current approach is problematic since the extent of oxidation required can vary drastically, depending on the ending surface area of the composite. The higher the surface area of the new synthesized silicon-carbon composite, the more readily the material reacts with oxygen, heats up rapidly, thus further promoting the reaction, with the unwanted potential for a thermal runaway event. In contrast, the lower the surface area of the newly synthesized silicon-carbon composite, the more slowly the material reacts with oxygen, thus generating commensurately less heat. Therefore, the current state-of-the-art approach for passivating newly synthesized silicon-carbon composite material is very challenging to control at relevant commercial manufacturing scale beyond the laboratory.

Therefore, the current invention has utility in passivating newly synthesized silicon-carbon composite materials with surface area comprising greater than 2 m2/g, for example greater than 5 m2/g, for example greater than 10 m2/g, for example greater than 15 m2/g, for example greater than 20 m2/g, for example greater than 25 m2/g, for example greater than 30 m2/g, for example greater than 40 m2/g, for example greater than 50 m2/g, for example greater than 100 m2/g.

In certain embodiments, the passivation of the surface of hydrogen terminated silicon material by exposure to benign (non-oxygen) organic species via a gas-phase reaction, including but not limited to a hydrosilylation reaction, that not only mitigates exothermic behavior and facilitate stable commercial manufacturing, but also provides the lowest achievable oxygen content in the silicon-carbon composite. This content can be expressed as the mol ratio of oxygen to silicon in the silicon-carbon composite. In certain embodiments, after passivation of the surface of hydrogen terminated silicon material by exposure to organic species via a gas-phase hydrosilylation reaction, the mole ratio of oxygen to silicon is less than 0.5 mol/mol, for example less than 0.4 mol/mol, for example less than 0.3 mol/mol, for example less than 0.2 mol/mol, for example less than 0.1 mol/mol, for example less than 0.09 mol/mol, for example less than 0.08 mol/mol, for example less than 0.07 mol/mol, for example less than 0.06 mol/mol, for example less than 0.05 mol/mol, for example less than 0.04 mol/mol, for example less than 0.03 mol/mol, for example less than 0.02 mol/mol, for example less than 0.01 mol/mol, for example less than 0.005 mol/mol, for example less than 0.001 mol/mol.

In certain embodiments, the passivation of the surface of hydrogen terminated silicon material by exposure to benign (non-oxygen) organic species via a gas-phase hydrosilylation reaction not only mitigates exothermic behavior and facilitate stable commercial manufacturing and provides the lowest achievable oxygen content in the silicon-carbon composite, but also provides for an oxygen content that is highly stable when the silicon-carbon composite powder is exposed to atmospheric conditions (i.e., room temperature of ~ 25 C and atmospheric oxygen). In certain embodiments, the ratio of oxygen to silicon in silicon-carbon composite powder when exposed to atmospheric conditions increases less than 0.01 mol/mol/day, for example less than 0.009 mol/mol/day, for example less than 0.008 mol/mol/day, for example less than 0.007 mol/mol/day, for example less than 0.006 mol/mol/day, for example less than 0.005 mol/mol/day, for example less than 0.004 mol/mol/day, for example less than 0.003 mol/mol/day, for example less than 0.002 mol/mol/day, for example less than 0.001 mol/mol/day, for example less than 0.0009 mol/mol/day, for example less than 0.008 mol/mol/day, for example less than 0.0007 mol/mol/day, for example less than 0.0006 mol/mol/day, for example less than 0.0005 mol/mol/day, for example less than 0.0004 mol/mol/day, for example less than 0.0003 mol/mol/day, for example less than 0.0002 mol/mol/day, for example less than 0.0001 mol/mol/day, for example less than 0.00005 mol/mol/day, for example less than 0.00001 mol/mol/day.

In turn, the low ratio of oxygen to silicon in the silicon-carbon composites for the above embodiments imparts lower reactivity for the silicon-carbon composite as well as more stable mol ratio of oxygen to silicon content, thus improving and maintaining superior cycle life and calendar life when employed as an anode in a lithium ion battery.

In certain embodiments, the passivation of the surface of hydrogen terminated silicon material within a silicon-carbon composite material is accomplished via a hydrosilylation reaction. In some embodiments, the hydrosilylation reaction is a gas-solid reaction, i.e., reaction between a passivation agent that exists primarily as a gas at the passivation reaction conditions and the solid silicon-carbon composite. In other embodiments, the hydrosilylation reaction is a liquid-solid reaction, i.e., reaction between a passivation agent that exists primarily as a liquid at the passivation reaction conditions and the solid silicon-carbon composite.

The passivation agent chosen may vary, and its properties imparts desirable properties to the resulting passivated silicon-carbon composite material. For example, passivation agents with ether functional groups, when employed as agents to passify surface of hydrogen terminated silicon material within a silicon carbon composite material, provide a passivated silicon-carbon composite material with increased ionic conductivity. As another example, passivation agent with carbonate groups, when employed as agents to passify surface of hydrogen terminated silicon material within a silicon carbon composite material, provide a passivated silicon-carbon composite material that forms a more stable SEI layer when employed as an anode active material as cycled in lithium ion batteries. As yet another example, passivation agents with epoxide groups, when employed as agents to passify surface of hydrogen terminated silicon material within a silicon carbon composite material, provide a passivated silicon-carbon composite material that forms bonds with the binders (e.g., polyacrylic acid) within the anode formulation, resulting in improved performance when the silicon-carbon composite material is cycled as an anode active material in lithium ion batteries. As yet another example, passivation agents comprising flouride, when employed as agents to passify surface of hydrogen terminated silicon material within a silicon carbon composite material, provide a passivated silicon-carbon composite material that forms a more stable SEI layer when employed as an anode active material as cycled in lithium ion batteries. As yet another example, passivation agents comprising nitrogen containing functional groups (e.g., amine, amide, etc.), when employed as agents to passify surface of hydrogen terminated silicon material within a silicon carbon composite material, provide a passivated silicon-carbon composite material that offers hybrid properties to the aforementioned examples including increased ionic conductivity and binding properties.

EXAMPLES

Example 1

Production of Silicon-Carbon Composite Material by CVI

The properties of the carbon scaffold (Carbon Scaffold 1) employed for producing the silicon-carbon composite is presented in Table 3. Employing Carbon Scaffold 1, the silicon-carbon composite (Silicon-Carbon Composite 1) was produced by CVI as follows. A mass of 0.2 grams of amorphous porous carbon was placed into a 2 in.×2 in. ceramic crucible then positioned in the center of a horizontal tube furnace. The furnace was sealed and continuously purged with nitrogen gas at 500 cubic centimeters per minute (ccm). The furnace temperature was increased at 20° C./min to 450° C. peak temperature where it was allowed to equilibrate for 30 minutes. At this point, the nitrogen gas is shutoff and then silane and hydrogen gas are introduced at flow rates of 50 ccm and 450 ccm, respectively for a total dwell time of 30 minutes. After the dwell period, silane and hydrogen were shutoff and nitrogen was again introduced to the furnace to purge the internal atmosphere. Simultaneously the furnace heat is shutoff and allowed to cool to ambient temperature. The completed Si—C material is subsequently removed from the furnace.

TABLE 3

| Description of carbon scaffold employed for Example 1. | | | | | |
|---|---|---|---|---|---|
| Carbon Scaffold # | Surface Area (m2/g) | Pore Volume (cm3/g) | % Micro- pores | % Meso- pores | % Macro- pores |
| 1 | 1710 | 0.762 | 93.1 | 6.8 | 0.1 |

Example 2

Analysis of Various Silicon-Composite Materials

A variety of carbon scaffold materials were employed, and the carbon scaffold materials were characterized by nitrogen sorption gas analysis to determine specific surface area, total pore volume, and fraction of pore volume comprising micropores, mesopores, and macropores. The characterization data for the carbon scaffold materials is presented in Table 4, namely the data for carbon scaffold surface area, pore volume, and pore volume distribution (% micropores, % mesopores, and % macropores), all as determined by nitrogen sorption analysis.

TABLE 4

| Properties of various carbon scaffold materials. | | | | | |
|---|---|---|---|---|---|
| Carbon Scaffold # | Surface Area (m2/g) | Pore Volume (cm3/g) | % Micro- pores | % Meso- pores | % Macro- pores |
| 1 | 1710 | 0.762 | 93.1 | 6.8 | 0.1 |
| 2 | 1744 | 0.72 | 97.2 | 2.7 | 0.1 |
| 3 | 1581 | 0.832 | 69.1 | 30.9 | 0.1 |
| 4 | 1710 | 0.817 | 80.1 | 19.9 | 0 |
| 5 | 1835 | 0.9 | 82.2 | 17.8 | 0 |
| 6 | 1475 | 1.06 | 52.4 | 47.6 | 0 |
| 7 | 453 | 0.5 | 3.9 | 91.1 | 5.1 |
| 8 | 787 | 2.284 | 0 | 59.1 | 40.9 |
| 9 | 1713 | 0.76 | 91 | 9 | 0 |
| 10 | 1746 | 0.7552 | 95 | 5 | 0 |

The carbons scaffold sample as described in Table 4 were employed to produce a variety of silicon-carbon composite materials employing the CVI methodology in a static bed configuration as generally described in Example 1. These silicon-carbon samples were produced employing a range of process conditions: silane concentration 1.25% to 100%, diluent gas nitrogen or hydrogen, carbon scaffold starting mass 0.2 g to 700 g.

The surface area for the silicon-carbon composites was determined. The silicon-carbon composites were also analyzed by TGA to determine silicon content and the Z.

Silicon-carbon composite materials were also tested in half-cell coin cells. The anode for the half-cell coin cell can comprise 60-90% silicon-carbon composite, 5-20% Na-CMC (as binder) and 5-20% Super C45 (as conductivity enhancer), and the electrolyte can comprise 2:1 ethylene carbonate:diethylene carbonate, 1 M LiPF6 and 10% fluoroethylene carbonate. The half-cell coin cells can be cycled at 25° C. at a rate of C/5 for 5 cycles and then cycled thereafter at C/10 rate. The voltage can be cycled between 0 V and 0.8 V, alternatively, the voltage can be cycled between 0 V and 1.5 V. From the half-cell coin cell data, the maximum capacity can be measured, as well as the average Coulombic efficiency (CE) over the range of cycles from cycle 7 to cycle 20. Physicochemical and electrochemical properties for various silicon-carbon composite materials are presented in Table 5.

Oxygen, nitrogen, and hydrogen content of the silicon-carbon composites were determined using an inert gas fusion instrument known in the art (LECO ONH 836). The silicon-carbon composite sample is flash heated in a graphite arc furnace to ~3000° C. under flowing helium gas. The oxygen in the sample is carbo-thermally reduced to CO2 and/or CO which entrained in the helium gas stream, and quantified downstream using an IR spectrometer. Hydrogen is evolved from the sample in the form of H2 which is converted catalytically to H2O in the gas phase and quantified also using an IR spectrometer. Lastly, the nitrogen is evolved from the sample in the form of N2 and quantified using a thermal conductivity detector. The results are expressed as elemental weight fractions with respect to the total mass of the sample.

TABLE 5

| Silicon-Carbon Composite # | Carbon Scaffold # | Surface Area (m2/g) | Si content (%) | Z | Max Capacity (mAh/g) | Average CE (7-20) |
|---|---|---|---|---|---|---|
| 1 | 1 | 7 | 45.0 | 0.2 | 1433 | 0.9981 |
| 2 | 1 | 7 | 45.4 | 0.6 | 1545 | 0.9980 |
| 3 | 1 | 6 | 45.8 | 0.6 | 1510 | 0.9975 |
| 4 | 2 | 3.06 | 50.1 | 1.0 | 1665 | 0.9969 |
| 5 | 2 | 1.96 | 51.3 | 2.0 | 1662 | 0.9974 |
| 6 | 3 | 140 | 43.1 | 3.2 | 832 | 0.9941 |
| 7 | 2 | 1.61 | 48.7 | 2.8 | 1574 | 0.9977 |
| 8 | 2 | 2 | 48.5 | 3.0 | 1543 | 0.9972 |
| 9 | 1 | 8 | 46.3 | 0.2 | 1373 | 0.9976 |
| 10 | 4 | 44 | 51.2 | 6.2 | 1614 | 0.9975 |
| 11 | 5 | 94 | 48.9 | 6.2 | 1455 | 0.9969 |
| 12 | 6 | 61 | 52.1 | 10.6 | 2011 | 0.9869 |
| 13 | 7 | 68.5 | 34.6 | 17.2 | 1006 | 0.9909 |
| 14 | 8 | 20 | 74 | 33.5 | 2463 | 0.9717 |
| 15 | 8 | 149 | 57.7 | 34.5 | 1892 | 0.9766 |
| 16 | 8 | 61.7 | 68.9 | 38.7 | 2213 | 0.9757 |
| 17 | 9 | 11 | 46.1 | 0.8 | 1675 | 0.9990 |
| 18 | 9 | 11 | 46.7 | 2.0 | 1739 | 0.9985 |
| 19 | 9 | 15.1 | 46.8 | 1.7 | 1503 | 0.9908 |
| 20 | 9 | 4.1 | 47.9 | 4.2 | 1790 | 0.9953 |
| 21 | 9 | 5 | 48.1 | 4.6 | 1861 | 0.9962 |

A plot of the average Coulombic efficiency as a function of the Z is presented in FIG. 1. As can be seen there was dramatic increase in the average Coulombic 5 efficiency for silicon-carbon samples with low Z. In particular, all silicon-carbon samples with Z below 10.0 exhibited average Coulombic efficiency ≥0.9941, and all silicon-carbon samples with Z above 10 (Silicon-Carbon Composite Sample 12 through Silicon-Carbon Composite Sample 16) were observed to have average Coulombic efficiency≤0.9909. Without being bound by theory, higher Coulombic efficiency for the silicon-carbon samples with Z<10 provides for superior cycling stability in full cell lithium ion batteries. Further inspection of Table reveals the surprising and unexpected finding that the combination of silicon-carbon composite samples with Z<10 and also comprising carbon scaffold comprising >70 microporosity provides for average Coulombic efficiency ≥0.995.

Therefore, in a preferred embodiment, the silicon-carbon composite material comprises a Z less than 10, for example less Z less than 5, for example less Z less than 3, for example less Z less than 2, for example less Z less than 1, for example less Z less than 0.5, for example less Z less than 0.1, or Z of zero.

In certain preferred embodiments, the silicon-carbon composite material comprises a Z less than 10 and a carbon scaffold with >70% microporosity, for example Z less than 10 and >80% microporosity, for example Z less than 10 and >90% microporosity, for example Z less than 10 and >95% microporosity, for example Z less than 5 and >70% microporosity, for example Z less than 5 and >80% microporosity, for example Z less than 5 and >90% microporosity, for example Z less than 5 and >95% microporosity, for example Z less than 3 and >70% microporosity, for example Z less than 3 and >80% microporosity, for example Z less than 3 and >90% microporosity, for example Z less than 3 and >95% microporosity, for example Z less than 2 and >70% microporosity, for example Z less than 2 and >80% microporosity, for example Z less than 2 and >90% microporosity, for example Z less than 2 and >95% microporosity, for example Z less than 1 and >70% microporosity, for example Z less than 1 and >80% microporosity, for example Z less than 1 and >90% microporosity, for example Z less than 1 and >95% microporosity, for example Z less than 0.5 and >70% microporosity, for example Z less than 0.5 and >80% microporosity, for example Z less than 0.5 and >90% microporosity, for example Z less than 0.5 and >95% microporosity, for example Z less than 0.1 and >70% microporosity, for example Z less than 0.1 and >80% microporosity, for example Z less than 0.1 and >90% microporosity, for example Z less than 0.1 and >95% microporosity, for example Z of zero and >70% microporosity, for example Z of zero and >80% microporosity, for example Z of zero and >90% microporosity, for example Z of zero and >95% microporosity.

In certain preferred embodiments, the silicon-carbon composite material comprises a Z less than 10 and a carbon scaffold with >70% microporosity, and wherein the silicon-carbon composite also comprises 15%-85% silicon, and surface area less than 100 m2/g, for example Z less than 10 and >70% microporosity, and wherein the silicon-carbon composite also comprises 15%-85% silicon, and surface area less than 50 m2/g, for example Z less than 10 and >70% microporosity, and wherein the silicon-carbon composite also comprises 15%-85% silicon, and surface area less than 30 m2/g, for example Z less than 10 and >70% microporosity, and wherein the silicon-carbon composite also comprises 15%-85% silicon, and surface area less than 10 m2/g, for example Z less than 10 and >70% microporosity, and wherein the silicon-carbon composite also comprises 15%-85% silicon, and surface area less than 5 m2/g, for example Z less than 10 and >80% microporosity, and wherein the silicon-carbon composite also comprises 15%-85% silicon, and surface area less than 50 m2/g, for example Z less than 10 and >80% microporosity, and wherein the silicon-carbon composite also comprises 15%-85% silicon, and surface area less than 30 m2/g, for example Z less than 10 and >80% microporosity, and wherein the silicon-carbon composite also comprises 15%-85% silicon, and surface area less than 10 m2/g, for example Z less than 10 and >80% microporosity, and wherein the silicon-carbon composite also comprises 15%-85% silicon, and surface area less than 5 m2/g, for example Z less than 10 and >90% microporosity, and wherein the silicon-carbon composite also comprises 15%-85% silicon, and surface area less than 50 m2/g, for example Z less than 10 and >90% microporosity, and wherein the silicon-carbon composite also comprises 15%-85% silicon, and surface area less than 30 m2/g, for example Z less than 10 and >90% microporosity, and wherein the silicon-carbon composite also comprises 15%-85% silicon, and surface area less than 10 m2/g, for example Z less than 10 and >90% microporosity, and wherein the silicon-carbon composite also comprises 15%-85% silicon, and surface area less than 5 m2/g, for example Z less than 10 and >95% microporosity, and wherein the silicon-carbon composite also comprises 15%-85% silicon, and surface area less than 50 m2/g, for example Z less than 10 and >95% microporosity, and wherein the silicon-carbon composite also comprises 15%-85% silicon, and surface area less than 30 m2/g, for example Z less than 10 and >95% microporosity, and wherein the silicon-carbon composite also comprises 15%-85% silicon, and surface area less than 10 m2/g, for example Z less than 10 and >95% microporosity, and wherein the silicon-carbon composite also comprises 15%-85% silicon, and surface area less than 5 m2/g.

In certain preferred embodiments, the silicon-carbon composite material comprises a Z less than 10 and a carbon scaffold with >70% microporosity, and wherein the silicon-carbon composite also comprises 30%-60% silicon, and surface area less than 100 m2/g, for example Z less than 10 and >70% microporosity, and wherein the silicon-carbon composite also comprises 30%-60% silicon, and surface area less than 50 m2/g, for example Z less than 10 and >70% microporosity, and wherein the silicon-carbon composite also comprises 30%-60% silicon, and surface area less than 30 m2/g, for example Z less than 10 and >70% microporosity, and wherein the silicon-carbon composite also comprises 30%-60% silicon, and surface area less than 10 m2/g, for example Z less than 10 and >70% microporosity, and wherein the silicon-carbon composite also comprises 30%-60% silicon, and surface area less than 5 m2/g, for example Z less than 10 and >80% microporosity, and wherein the silicon-carbon composite also comprises 30%-60% silicon, and surface area less than 50 m2/g, for example Z less than 10 and >80% microporosity, and wherein the silicon-carbon composite also comprises 30%-60% silicon, and surface area less than 30 m2/g, for example Z less than 10 and >80% microporosity, and wherein the silicon-carbon composite also comprises 30%-60% silicon, and surface area less than 10 m2/g, for example Z less than 10 and >80% microporosity, and wherein the silicon-carbon composite also comprises 30%-60% silicon, and surface area less than 5 m2/g, for example Z less than 10 and >90% microporosity, and wherein the silicon-carbon composite also comprises 30%-60% silicon, and surface area less than 50 m2/g, for example Z less than 10 and >90% microporosity, and wherein the silicon-carbon composite also comprises 30%-60% silicon, and surface area less than 30 m2/g, for example Z less than 10 and >90% microporosity, and wherein the silicon-carbon composite also comprises 30%-60% silicon, and surface area less than 10 m2/g, for example Z less than 10 and >90% microporosity, and wherein the silicon-carbon composite also comprises 30%-60% silicon, and surface area less than 5 m2/g, for example Z less than 10 and >95% microporosity, and wherein the silicon-carbon composite also comprises 30%-60% silicon, and surface area less than 50 m2/g, for example Z less than 10 and >95% microporosity, and wherein the silicon-carbon composite also comprises 30%-60% silicon, and surface area less than 30 m2/g, for example Z less than 10 and >95% microporosity, and wherein the silicon-carbon composite also comprises 30%-60% silicon, and surface area less than 10 m2/g, for example Z less than 10 and >95% microporosity, and wherein the silicon-carbon composite also comprises 30%-60% silicon, and surface area less than 5 m2/g.

In certain preferred embodiments, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9969. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9970. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9975. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9980. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9985. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9990. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9995. For example, the silicon-carbon composite material comprises a Z less than 10 and a carbon scaffold with >80% microporosity, and wherein the silicon-carbon composite also comprises 30%-60% silicon, surface area less than 30 m2/g, and average Coulombic efficiency ≥0.9999.

Example 3 dV/dQ for Various Silicon-Composite Materials

Differential capacity curve (dQ/dV vs Voltage) is often used as a non-destructive tool to understand the phase transition as a function of voltage in lithium battery electrodes (M. N. Obrovac et al. Structural Changes in Silicon Anodes during Lithium Insertion/Extraction, Electrochemical and Solid-State Letters, 7 (5) A93-A96 (2004); Ogata, K. et al. Revealing lithium-silicide phase transformations in nano-structured silicon-based lithium ion batteries via in situ NMR spectroscopy. Nat. Commun. 5:3217). As an alternative methodology to plotting dQ/dV vs Voltage, a strategy to yield similar analysis is the plot of dQ vs V. For this example, the differential capacity plot (dQ/dV vs Voltage) capacity plot (dQ/dV vs Voltage) is calculated from the data obtained using galvanostatic cycling at 0.1 C rate between 5 mV to 0.8V in a half-cell coin cell at 25° C. Typical differential capacity curve for a silicon-based material in a half-cell vs lithium can be found in many literature references (Loveridge, M. J. et al. Towards High Capacity Li-Ion Batteries Based on Silicon-Graphene Composite Anodes and Sub-micron V-doped LiFePO4 Cathodes. Sci. Rep. 6, 37787; doi: 10.1038/srep37787 (2016); M. N. Obrovac et al. Li15Si4 Formation in Silicon Thin Film Negative Electrodes, Journal of The Electrochemical Society, 163 (2) A255-A261 (2016); Q. Pan et al. Improved electrochemical performance of micro-sized SiO-based composite anode by prelithiation of stabilized lithium metal powder, Journal of Power Sources 347 (2017) 170-177). First cycle lithiation behavior is dependent on the crystallinity of the silicon and oxygen content among other factors.

After first cycle, previous amorphous silicon materials in the art exhibit two specific phase transition peaks in the dQ/dV vs V plot for lithiation, and correspondingly two specific phase transition peaks in the dQ/dV vs V plot for delithiation. For lithiation, one peak corresponding to lithium-poor Li—Si alloy phase occurs between 0.2-0.4 V and another peak corresponding to a lithium-rich Li—Si alloy phase occurs below 0.15 V. For delithiation, one delithiation peak corresponding to the extraction of lithium occurs below 0.4 V and another peak occurs between 0.4 V and 0.55 V. If the Li15Si4 phase is formed during lithiation, it is delithiated at ~0.45V and appears as a very narrow sharp peak.

Figure 2:
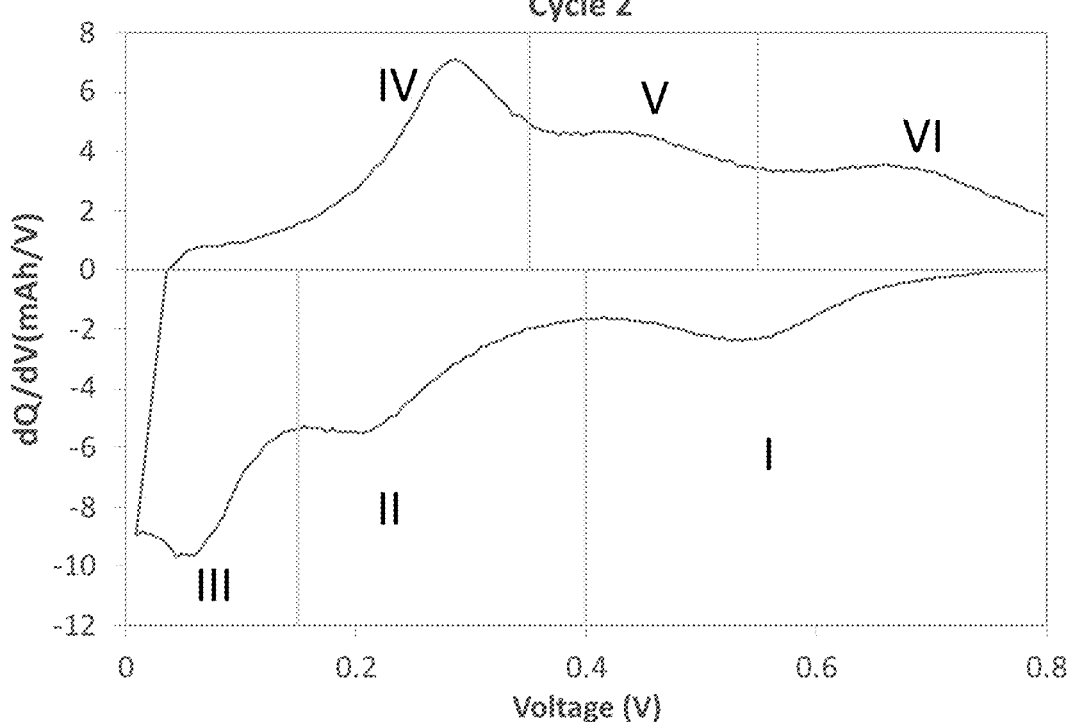
FIG. 2. Differential capacity vs voltage plot for Silicon-Carbon Composite 3 from $2^{nd}$ cycle using a half-cell.

FIG. 2 depicts the dQ/dV vs Voltage curve for cycle 2 for the silicon-carbon composite material corresponding to Silicon-Carbon Composite 3 from Example 1. Silicon-Carbon Composite 3 comprises a Z of 0.6. For ease of identification, the plot is divided into regimes I, II, II, IV, V, and VI. Regimes I (0.8 V to 0.4 V), II (0.4 V to 0.15 V), III (0.15 V to 0 V) comprise the lithiation potentials and Regimes IV (0 V to 0.4 V), V (0.4 V to 0.55 V), VI (0.55 V to 0.8 V) comprise the delithiation potential. As described above, previous amorphous silicon-based materials in the art exhibit phase-transition peaks for two regimes (Regime II and Regime III) in the lithiation potential and two regimes (Regime IV and Regime V) in the delithiation potentials.

Figure 3:
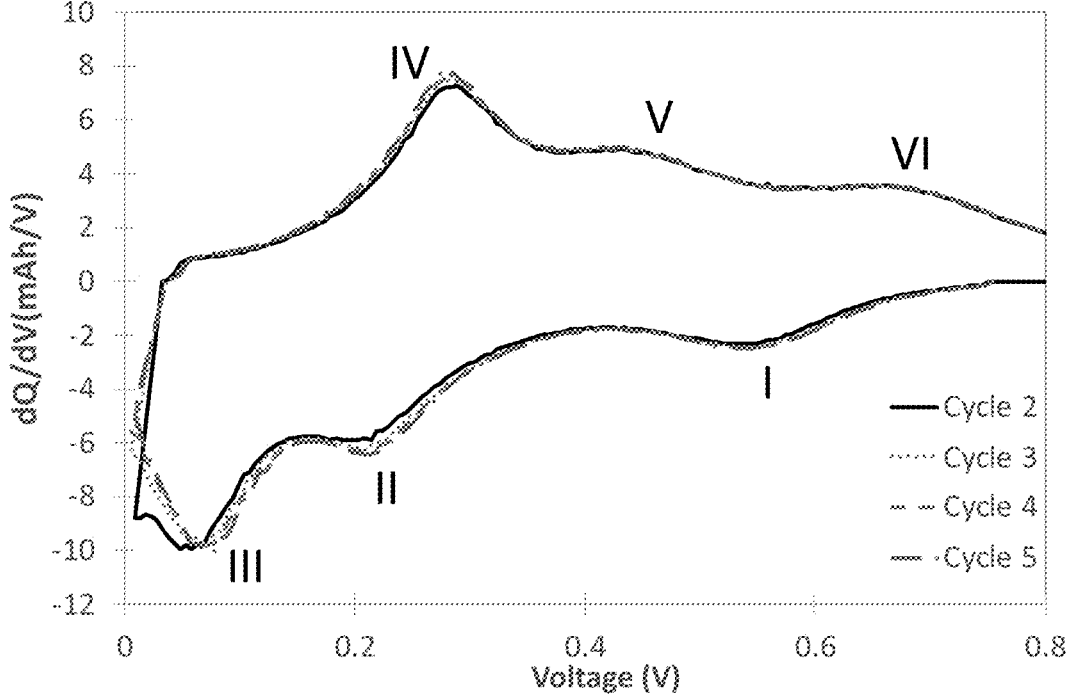
FIG. 3. Differential capacity vs voltage plot for Silicon-Carbon Composite 3 from 2nd cycle to 5th cycle using a half-cell.

As can be seen in FIG. 2, the dQ/dV vs Voltage curve reveals surprising and unexpected result that Silicon-Carbon Composite 3, which comprises a Z of 0.6, comprises two additional peaks in the dQ/dV vs Voltage curve, namely Regime I in the lithiation potential and Regime VI in the delithiation potential. All 6 peaks are reversible and observed in the subsequent cycles as well, as shown in FIG. 3.

Without being bound by theory, such trimodal behavior for the dQ/dV vs V curve is novel, and likewise reflects a novel form of silicon.

Notably, the novel peaks observed in Regime I and Regime VI are more pronounced in certain scaffold matrixes and completely absent in others samples illustrating the prior art (silicon-carbon composite samples with Z>10, see explanation and table below).

Figure 4:
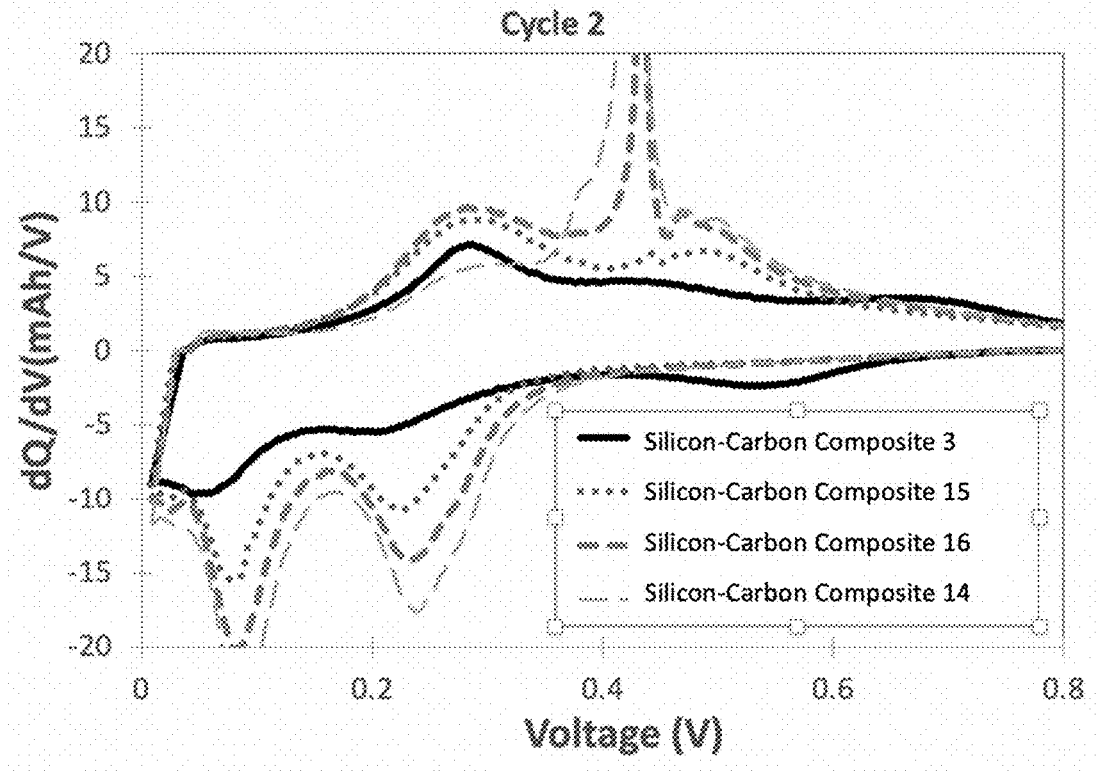
FIG. 4. dQ/dV vs V plot for various silicon-carbon composite materials.

FIG. 4 presents the dQ/dV vs V curve for Silicon-Carbon Composite 3, wherein the novel peaks in Regime I and Regime VI are evident, in comparison to Silicon-Carbon Composite 15, Silicon-Carbon Composite 16, and Silicon-Carbon Composite 14, all three of which comprise Z>10 and whose dQ/dV vs V curves are devoid of the any peaks in Regime I and Regime VI.

Figure 5:
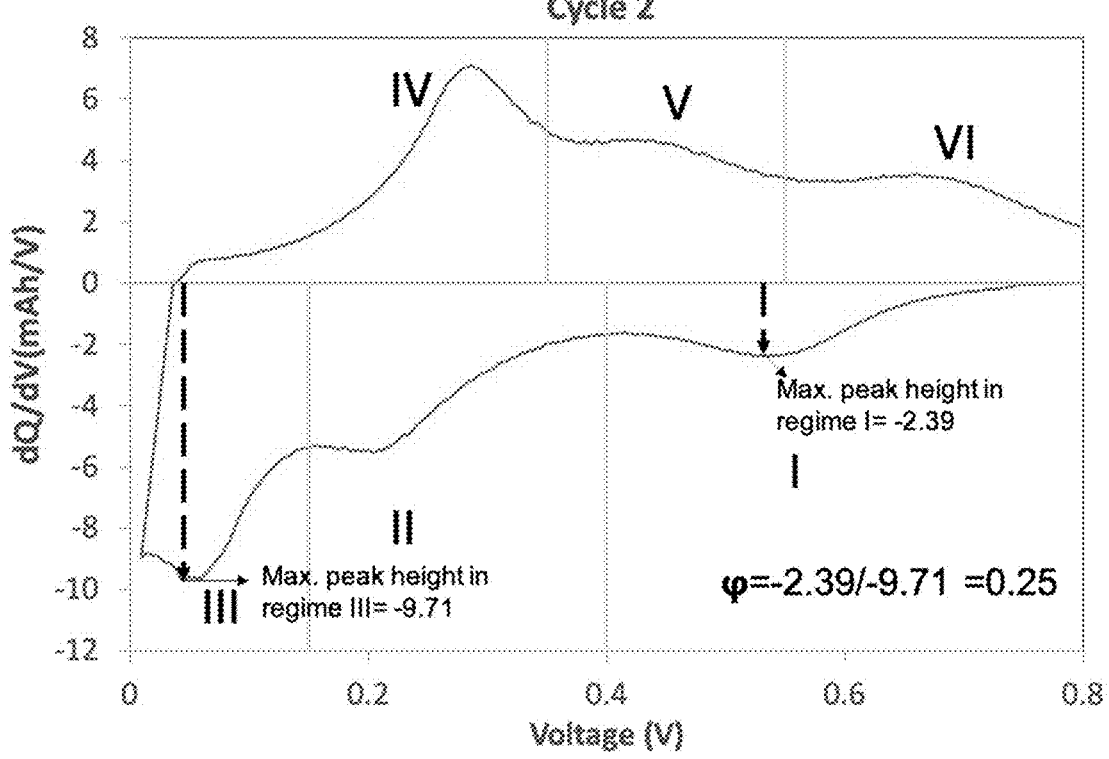
FIG. 5. Example of Calculation of φ for Silicon-Carbon Composite 3.

Without being bound by theory, these novel peaks observed in Regime I and Regime VI relate to the properties of the silicon impregnated into the porous carbon scaffold, i.e., related to the interactions between and among the properties of the porous carbon scaffold, the silicon impregnated into the porous carbon scaffold via CVI, and lithium. In order to provide a quantitative analysis, we herein define the parameter $\varphi$, which is calculated as the normalized peak I with respect to peak III as:

$$\varphi = (\text{Max peak height } dQ/dV \text{ in Regime I})/(\text{Max peak height } dQ/dV \text{ in Regime III})$$

where dQ/dV is measured in a half-cell coin cell, and regime I is 0.8V-0.4V and Regime III is 0.15V-0V; the half-cell coin cell is produced as known in the art. If the Si—C sample shows peaks associated with graphite in regime III of the differential curve, it is omitted in favor of Li—Si related phase transition peaks for the calculation of D factor. For this example, the half-cell coin cell comprises an anode comprising 60-90% silicon-carbon composite, 5-20% SBR-Na-CMC, and 5-20% Super C45. An example for $\varphi$ calculation is shown in FIG. 5 for Silicon-Carbon Composite 3. In this instance, the maximum peak height in the regime I is −2.39 and is found at voltage 0.53V. Similarly, maximum peak height in regime III is −9.71 at 0.04V. In this instance, $\varphi$ can be calculated using the above formula, yielding $\varphi=-2.39/-9.71=0.25$. The value of $\varphi$ was determined from the half-cell coin cell data for the various silicon-carbon composites presented in Example 2. These data are summarized in Table 6. Table 6 also includes data for the first cycle efficiency, as measured in half cell coin cells cycled from 5 mV to 0.8 V.

TABLE 6

Properties of various silicon-carbon materials.

| Silicon-Carbon Composite # | Surface Area (m2/g) | Si content (%) | Z | Average CE (7-20) | $\varphi$ | First Cycle Efficiency |
|---|---|---|---|---|---|---|
| 1 | 7 | 45.0 | 0.2 | 0.9981 | 0.24 | 76.3 |
| 2 | 7 | 45.4 | 0.6 | 0.9980 | 0.24 | 76.8 |
| 3 | 6 | 45.8 | 0.6 | 0.9975 | 0.25 | 75.5 |
| 4 | 3.06 | 50.1 | 1.0 | 0.9969 | 0.18 | 80.9 |
| 5 | 1.96 | 51.3 | 2.0 | 0.9974 | 0.18 | 80.3 |
| 6 | 140 | 43.1 | 3.2 | 0.9941 | 0.13 | 52.3 |
| 7 | 1.61 | 48.7 | 2.8 | 0.9977 | 0.19 | 79.2 |
| 8 | 2 | 48.5 | 3.0 | 0.9972 | 0.19 | 78.3 |
| 9 | 8 | 46.3 | 0.2 | 0.9976 | 0.20 | 73.3 |
| 10 | 44 | 51.2 | 6.2 | 0.9975 | 0.13 | 78.1 |
| 11 | 94 | 48.9 | 6.2 | 0.9969 | 0.15 | 72.7 |
| 12 | 61 | 52.1 | 10.6 | 0.9869 | 0 | 80.2 |
| 13 | 68.5 | 34.6 | 17.2 | 0.9909 | 0 | 64 |
| 14 | 20 | 74 | 33.5 | 0.9717 | 0 | 85 |
| 15 | 149 | 57.7 | 34.5 | 0.9766 | 0 | 69 |
| 16 | 61.7 | 68.9 | 38.7 | 0.9757 | 0 | 79.3 |
| 17 | 11 | 46.1 | 0.8 | 0.9990 | 0.35 | 82.2 |
| 18 | 11 | 46.7 | 2.0 | 0.9985 | 0.34 | 82.5 (92.1*) |
| 19 | 15.1 | 46.8 | 1.7 | 0.9980 | 0.34 | 79.9 (90.3*) |
| 20 | 4.1 | 47.9 | 4.2 | 0.9953 | 0.33 | 83.3 (92.6*) |
| 21 | 5 | 48.1 | 4.6 | 0.9962 | 0.30 | 82.9 (92.2*) |

These data for first cycle effiency in parenthesis were measured for voltage window of 5 mV to 1.5 V.

Figure 6:
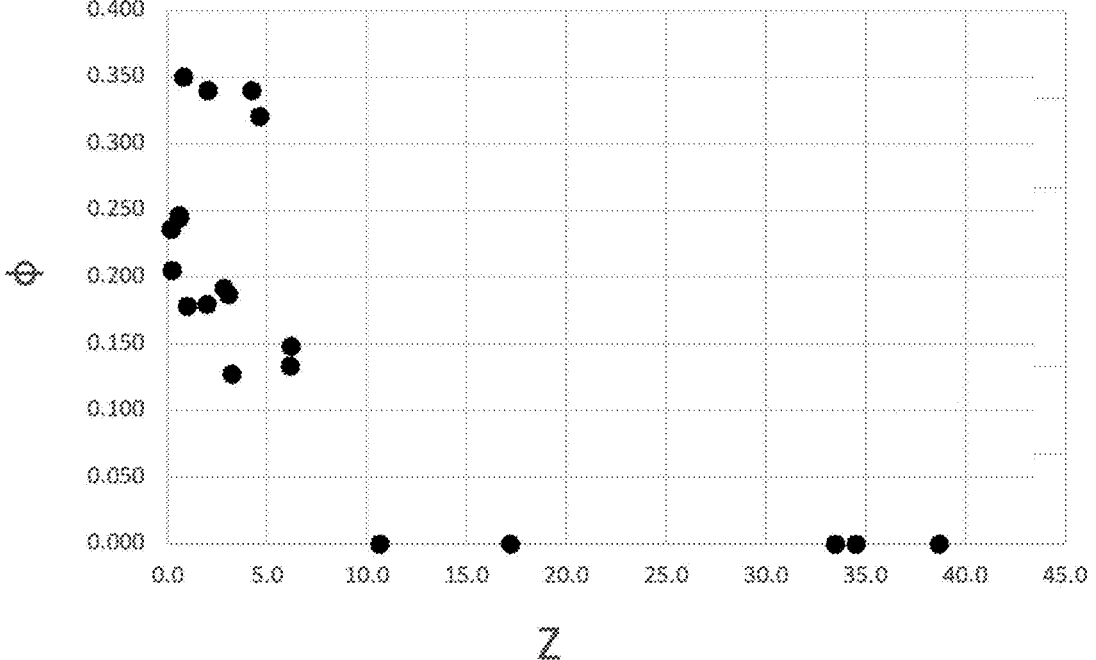
FIG. 6. Z vs φ plot for various silicon-carbon composite materials.

The data in Table 6 reveal an unexpected relationship between decreasing Z and increasing $\varphi$. All silicon-carbon composites with Z<10 had $\varphi\geq0.13$, and all silicon-carbon composites with Z>10 had $\varphi<0.13$, indeed, all silicon-carbon composites with where Z>10 had $\varphi=0$. This relationship is also evidenced in FIG. 6. Without being bound by theory, silicon materials comprising $\varphi\geq0.10$, for example $\varphi\geq0.13$, for example $\varphi\geq0.15$, for example $\varphi\geq0.20$, for example $\varphi\geq0.25$, for example $\varphi\geq0.30$, correspond to a novel form of silicon. Alternatively, silicon materials comprising $\varphi>0$ correspond to a novel form of silicon. Without being bound by theory, silicon materials comprising >0 are characteristic to silicon material wherein the silicon is amorphous, nano-sized silicon confined within pores, for example pores of a porous carbon scaffold. The silicon-carbon composite material comprising silicon comprising $\varphi\geq0.10$, for example $\varphi\geq0.13$, for example $\varphi\geq0.15$, for example $\varphi\geq0.20$, for example $\varphi\geq0.25$, for example $\varphi\geq0.30$, corresponds to a novel silicon-carbon composite material. Alternatively, silicon-carbon composite materials comprising $\varphi\geq0$ corresponds to a novel silicon-carbon composite material.

In certain embodiments, the silicon-carbon composite comprises a $\varphi\geq0.1$, $\varphi\geq0.11$, $\varphi\geq0.12$, $\varphi\geq0.13$, $\varphi\geq0.14$, $\varphi\geq0.15$, $\varphi\geq0.16$, $\varphi\geq0.17$, $\varphi\geq0.18$, $\varphi\geq0.19$, $\varphi\geq0.20$, $\varphi\geq0.24$, $\varphi\geq0.24$, $\varphi\geq0.25$, $\varphi\geq0.30$ or $\varphi\geq0.35$. In one embodiment, $\varphi\geq0$. In some embodiments, $\varphi\geq0.001$, $\varphi\geq0.01$, $\varphi\geq0.02$, $\varphi\geq0.05$, $\varphi\geq0.1$, $\varphi\geq0.11$, or $\varphi\geq0.12$.

In certain embodiments, the silicon-carbon composite material comprises a Z less than 10 and a carbon scaffold with >70% microporosity, and wherein the silicon-carbon composite also comprises 30%-60% silicon, and surface area less than 100 m2/g, and $\varphi\geq0.1$, for example Z less than 10 and >70% microporosity, and wherein the silicon-carbon composite also comprises 30%-60% silicon, and surface area less than 50 m2/g, and $\varphi\geq0.1$, for example Z less than 10 and >70% microporosity, and wherein the silicon-carbon composite also comprises 30%-60% silicon, and surface area less than 30 m2/g, and φ≥0.1, for example Z less than 10 and >70% microporosity, and wherein the silicon-carbon composite also comprises 30%-60% silicon, and surface area less than 10 m2/g, and φ≥0.1, for example Z less than 10 and >70% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >70% microporosity, and wherein the silicon-carbon composite also comprises 40%-60% silicon, and surface area less than 100 m2/g, and φ≥0.1, for example Z less than 10 and >70% microporosity, and wherein the silicon-carbon composite also comprises 40%-60% silicon, and surface area less than 50 m2/g, and φ≥0.1, for example Z less than 10 and >70% microporosity, and wherein the silicon-carbon composite also comprises 40%-60% silicon, and surface area less than 30 m2/g, and φ≥0.1, for example Z less than 10 and >70% microporosity, and area less than 10 m2/g, and φ≥0.1, for example Z less than 10 and >70% microporosity, area less than 5 m2/g, and φ≥0.1.

In certain embodiments, the silicon-carbon composite material comprises a Z less than 10 and a carbon scaffold with >70% microporosity, and wherein the silicon-carbon composite also comprises 30%-60% silicon, and surface area less than 100 m2/g, and φ≥0, for example Z less than 10 and >70% microporosity, and wherein the silicon-carbon composite also comprises 30%-60% silicon, and surface area less than 50 m2/g, and φ≥0, for example Z less than 10 and >70% microporosity, and wherein the silicon-carbon composite also comprises 30%-60% silicon, and surface area less than 30 m2/g, and φ≥0, for example Z less than 10 and >70% microporosity, and wherein the silicon-carbon composite also comprises 30%-60% silicon, and surface area less than 10 m2/g, and φ≥0, for example Z less than 10 and >70% microporosity, and wherein the silicon-carbon composite also comprises 30%-60% silicon, and surface area less than 5 m2/g, and φ≥0.

In certain embodiments, the silicon-carbon composite material comprises a Z less than 10 and a carbon scaffold with >70% microporosity, and wherein the silicon-carbon composite also comprises 40%-60% silicon, and surface area less than 100 m2/g, and φ≥0, for example Z less than 10 and >70% microporosity, and wherein the silicon-carbon composite also comprises 40%-60% silicon, and surface area less than 50 m2/g, and >0, for example Z less than 10 and >70% microporosity, and wherein the silicon-carbon composite also comprises 40%-60% silicon, and surface area less than 30 m2/g, and φ≥0, for example Z less than 10 and >70% microporosity, and wherein the silicon-carbon composite also comprises 40%-60% silicon, and surface area less than 10 m2/g, and φ≥0, for example Z less than 10 and >70% microporosity, and wherein the silicon-carbon composite also comprises 40%-60% silicon, and surface area less than 5 m2/g, and φ≥0.

In certain embodiments, the silicon-carbon composite material comprises a Z less than 10 and a carbon scaffold with >80% microporosity, and wherein the silicon-carbon composite also comprises 30%-60% silicon, and surface area less than 100 m2/g, and φ≥0.1, for example Z less than 10 and >80% microporosity, and wherein the silicon-carbon composite also comprises 30%-60% silicon, and surface area less than 50 m2/g, and φ≥0.1, for example Z less than 10 and >80% microporosity, and wherein the silicon-carbon composite also comprises 30%-60% silicon, and surface area less than 30 m2/g, and φ≥0.1, for example Z less than 10 and >80% microporosity, and wherein the silicon-carbon composite also comprises 30%-60% silicon, and surface area less than 10 m2/g, and φ≥0.1, for example Z less than 10 and >80% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >80% microporosity, and wherein the silicon-carbon composite also comprises 40%-60% silicon, and surface area less than 100 m2/g, and φ≥0.1, for example Z less than 10 and >80% microporosity, and wherein the silicon-carbon composite also comprises 40%-60% silicon, and surface area less than 50 m2/g, and φ≥0.1, for example Z less than 10 and >80% microporosity, and wherein the silicon-carbon composite also comprises 40%-60% silicon, and surface area less than 30 m2/g, and φ≥0.1, for example Z less than 10 and >80% microporosity, and wherein the silicon-carbon composite also comprises 40%-60% silicon, and surface area less than 10 m2/g, and φ≥0.1, for example Z less than 10 and >80% microporosity, and wherein the silicon-carbon composite also comprises 40%-60% silicon, and surface area less than 5 m2/g, and φ≥0.1.

In certain embodiments, the silicon-carbon composite material comprises a Z less than 10 and a carbon scaffold with >80% microporosity, and wherein the silicon-carbon composite also comprises 30%-60% silicon, and surface area less than 100 m2/g, and φ≥0, for example Z less than 10 and >80% microporosity, and wherein the silicon-carbon composite also comprises 30%-60% silicon, and surface area less than 50 m2/g, and φ≥0, for example Z less than 10 and >80% microporosity, and wherein the silicon-carbon composite also comprises 30%-60% silicon, and surface area less than 30 m2/g, and φ≥0, for example Z less than 10 and >80% microporosity, and wherein the silicon-carbon composite also comprises 30%-60% silicon, and surface area less than 10 m2/g, and φ≥0, for example Z less than 10 and >80% microporosity, and wherein the silicon-carbon composite also comprises 30%-60% silicon, and surface area less than 5 m2/g, and φ≥0.

In certain embodiments, the silicon-carbon composite material comprises a Z less than 10 and a carbon scaffold with >80% microporosity, and wherein the silicon-carbon composite also comprises 40%-60% silicon, and surface area less than 100 m2/g, and φ≥0, for example Z less than 10 and >80% microporosity, and wherein the silicon-carbon composite also comprises 40%-60% silicon, and surface area less than 50 m2/g, and φ≥0, for example Z less than 10 and >80% microporosity, and wherein the silicon-carbon composite also comprises 40%-60% silicon, and surface area less than 30 m2/g, and φ≥0, for example Z less than 10 and >80% microporosity, and area less than 10 m2/g, and φ≥0, for example Z less than 10 and >80% microporosity, area less than 5 m2/g, and φ≥0.

In certain embodiments, the silicon-carbon composite material comprises a Z less than 10 and a carbon scaffold with >90% microporosity, and wherein the silicon-carbon composite also comprises 30%-60% silicon, and surface area less than 100 m2/g, and φ≥0.1, for example Z less than 10 and >90% microporosity, and wherein the silicon-carbon composite also comprises 30%-60% silicon, and surface area less than 50 m2/g, and φ≥0.1, for example Z less than 10 and >90% microporosity, and wherein the silicon-carbon composite also comprises 30%-60% silicon, and surface area less than 30 m2/g, and φ≥0.1, for example Z less than 10 and >90% microporosity, and wherein the silicon-carbon composite also comprises 30%-60% silicon, and surface area less than 10 m2/g, and φ≥0.1, for example Z less than 10 and >90% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >90% microporosity, and wherein the silicon-carbon composite also comprises 40%-60% silicon, and surface area less than 100 m2/g, and φ≥0.1, for example Z less than 10 and >90% microporosity, and wherein the silicon-carbon composite also comprises 40%-60% silicon, and surface area less than 50 m2/g, and φ≥0.1, for example Z less than 10 and >90% microporosity, and wherein the silicon-carbon composite also comprises 40%-60% silicon, and surface area less than 30 m2/g, and φ≥0.1, for example Z less than 10 and >90% microporosity, and wherein the silicon-carbon composite also comprises 40%-60% silicon, and surface area less than 10 m2/g, and φ≥0.1, for example Z less than 10 and >90% microporosity, and wherein the silicon-carbon composite also comprises 40%-60% silicon, and surface area less than 5 m2/g, and φ≥0.1.

In certain embodiments, the silicon-carbon composite material comprises a Z less than 10 and a carbon scaffold with >90% microporosity, and wherein the silicon-carbon composite also comprises 30%-60% silicon, and surface area less than 100 m2/g, and φ≥0, for example Z less than 10 and >90% microporosity, and wherein the silicon-carbon composite also comprises 30%-60% silicon, and surface area less than 50 m2/g, and φ≥0, for example Z less than 10 and >90% microporosity, and wherein the silicon-carbon composite also comprises 30%-60% silicon, and surface area less than 30 m2/g, and φ≥0, for example Z less than 10 and >90% microporosity, and wherein the silicon-carbon composite also comprises 30%-60% silicon, and surface area less than 10 m2/g, and φ≥0, for example Z less than 10 and >90% microporosity, and wherein the silicon-carbon composite also comprises 30%-60% silicon, and surface area less than 5 m2/g, and φ≥0.

In certain embodiments, the silicon-carbon composite material comprises a Z less than 10 and a carbon scaffold with >90% microporosity, and wherein the silicon-carbon composite also comprises 40%-60% silicon, and surface area less than 100 m2/g, and φ≥0, for example Z less than 10 and >90% microporosity, and wherein the silicon-carbon composite also comprises 40%-60% silicon, and surface area less than 50 m2/g, and φ≥0, for example Z less than 10 and >90% microporosity, and wherein the silicon-carbon composite also comprises 40%-60% silicon, and surface area less than 30 m2/g, and φ≥0, for example Z less than 10 and >90% microporosity, and wherein the silicon-carbon composite also comprises 40%-60% silicon, and surface area less than 10 m2/g, and φ≥0, for example Z less than 10 and >90% microporosity, and wherein the silicon-carbon composite also comprises 40%-60% silicon, and surface area less than 5 m2/g, and φ≥0.

In certain embodiments, the silicon-carbon composite material comprises a Z less than 10 and a carbon scaffold with >95% microporosity, and wherein the silicon-carbon composite also comprises 30%-60% silicon, and surface area less than 100 m2/g, and φ≥0.1, for example Z less than 10 and >95% microporosity, and wherein the silicon-carbon composite also comprises 30%-60% silicon, and surface area less than 50 m2/g, and φ≥0.1, for example Z less than 5 and >95% microporosity, and wherein the silicon-carbon composite also comprises 30%-60% silicon, and surface area less than 30 m2/g, and φ≥0.1, for example Z less than 10 and >95% microporosity, and wherein the silicon-carbon composite also comprises 30%-60% silicon, and surface area less than 10 m2/g, and φ≥0.1, for example Z less than 10 and >95% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >95% microporosity, and wherein the silicon-carbon composite also comprises 40%-60% silicon, and surface area less than 100 m2/g, and φ≥0.1, for example Z less than 10 and >95% microporosity, and wherein the silicon-carbon composite also comprises 40%-60% silicon, and surface area less than 50 m2/g, and φ≥0.1, for example Z less than 10 and >95% microporosity, and wherein the silicon-carbon composite also comprises 40%-60% silicon, and surface area less than 30 m2/g, and φ≥0.1, for example Z less than 10 and >95% microporosity, and area less than 10 m2/g, and φ≥0.1, for example Z less than 10 and >95% microporosity, area less than 5 m2/g, and φ≥0.1.

In certain embodiments, the silicon-carbon composite material comprises a Z less than 10 and a carbon scaffold with >95% microporosity, and wherein the silicon-carbon composite also comprises 30%-60% silicon, and surface area less than 100 m2/g, and φ≥0.1, for example Z less than 10 and >95% microporosity, and wherein the silicon-carbon composite also comprises 30%-60% silicon, and surface area less than 50 m2/g, and φ≥0.1, for example Z less than 10 and >95% microporosity, and wherein the silicon-carbon composite also comprises 30%-60% silicon, and surface area less than 30 m2/g, and φ≥0.1, for example Z less than 10 and >95% microporosity, and wherein the silicon-carbon composite also comprises 30%-60% silicon, and surface area less than 10 m2/g, and φ≥0.1, for example Z less than 10 and >95% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >95% microporosity, and wherein the silicon-carbon composite also comprises 40%-60% silicon, and surface area less than 100 m2/g, and φ≥0, for example Z less than 10 and >95% microporosity, and wherein the silicon-carbon composite also comprises 40%-60% silicon, and surface area less than 50 m2/g, and φ≥0, for example Z less than 10 and >95% microporosity, and wherein the silicon-carbon composite also comprises 40%-60% silicon, and surface area less than 30 m2/g, and φ≥0, for example Z less than 10 and >95% microporosity, and wherein the silicon-carbon composite also comprises 40%-60% silicon, and surface area less than 10 m2/g, and φ≥0, for example Z less than 10 and >95% microporosity, and wherein the silicon-carbon composite also comprises 40%-60% silicon, and surface area less than 5 m2/g, and φ≥0.

In certain embodiments, the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9969, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9970, for example the silicon-carbon composite material comprises a Z less than 10 and a carbon scaffold with >80% microporosity, and wherein the silicon-φ≥0.15, and an average Coulombic efficiency ≥0.9975, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9980, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9985, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9990, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9995, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.15, and an average Coulombic efficiency ≥0.9999.

In certain embodiments, the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9969, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9970, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9975, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9980, for example the silicon-carbon composite material comprises a Z less than 10 and a carbon scaffold with >80% microporosity, and wherein the silicon-φ≥0.20, and an average Coulombic efficiency ≥0.9985, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9990, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9995, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.20, and an average Coulombic efficiency ≥0.9999.

In certain embodiments, the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9969, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9970, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9975, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9980, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9985, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9990, for example the silicon-carbon composite material comprises a Z less than 10 and a carbon scaffold with >80% microporosity, and wherein the silicon-φ≥0.25, and an average Coulombic efficiency ≥0.9995, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.25, and an average Coulombic efficiency ≥0.9999.

In certain embodiments, the silicon-carbon composite material comprises a Z less than 10 and a carbon scaffold with >80% microporosity, and wherein the silicon-carbon composite also comprises 30%-60% silicon, and surface area less than 30 m2/g, φ≥0.3, and an average Coulombic efficiency ≥0.9969, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.3, and an average Coulombic efficiency ≥0.9970, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.3, and an average Coulombic efficiency ≥0.9975, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.3, and an average Coulombic efficiency ≥0.9980, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.3, and an average Coulombic efficiency ≥0.9985, for example the silicon-carbon composite material comprises a Z less than 10 and a carbon scaffold with >80% microporosity, and wherein the silicon-carbon composite also comprises 30%-60% silicon, and surface area less than 30 m2/g, φ≥0.3, and an average Coulombic efficiency ≥0.9990, for example the silicon-carbon composite material comprises a Z less than 10 and a carbon scaffold with >80% microporosity, and wherein the silicon-carbon composite also comprises 30%-60% silicon, and surface area less than 30 m2/g, $\varphi \geq 0.3$, and an average Coulombic efficiency ≥0.9995, for example the silicon-carbon composite material comprises a Z less than 10 and a carbon scaffold with >80% microporosity, and wherein the silicon-carbon composite also comprises 30%-60% silicon, and surface area less than 30 m2/g, $\varphi \geq 0.3$, and an average Coulombic efficiency ≥0.9999.

Example 4

Particle Size Distribution for Various Carbon Scaffold Materials

The particle size distribution for the various carbon scaffold materials was determined by using a laser diffraction particle size analyzer as known in the art. Table 7 presented the data, specifically the Dv,1, Dv10, Dv50, and Dv,90, and Dv,100.

TABLE 7

Properties of various carbon scaffold materials.

| Carbon Scaffold # | Particle Size Characteristics |
| --- | --- |
| 1 | Dv, 1 = 1.2 um, Dv, 10 = 2.5 um, Dv, 50 = 6.9 um, Dv90 = 11.5 um, Dv100 = 20.1 um |
| 2 | Dv, 1 = 1.09, Dv10 = 3.4 um, Dv50 = 7.67 um, Dv, 90 = 13.3 um, Dv100 = 17.8 |
| 4 | Dv, 1 = 0.81, Dv10 = 1.9 um, Dv50 = 6.4 um, Dv, 90 = 16.6 um, Dv100 = 26.5 |
| 5 | Dv, 1 = 0.62, Dv10 = 1.1 um, Dv50 = 4.2 um, Dv, 90 = 15.8 um, Dv100 = 29.8 |
| 8 | Dv, 1 = 1.3, Dv10 = 3.7 um, Dv50 = 16 um, Dv, 90 = 35.2 um, Dv100 = 50.7 |
| 9 | Dv, 1 = 1.2 um, Dv, 10 = 2.7 um, Dv, 50 = 7.6 um, Dv, 90 = 12.3 um, Dv100 = 20.7 um |

Example 5

Lithium-Silicon Batteries Comprising Anode Comprising a Composite Comprising Group 14 Elements Silicon and Carbon The novel composite comprising Group14 elements silicon and carbon has utility for dramatically improving the performance of lithium silicon batteries. As known in the art, the lithium silicon battery comprises various other attributes as described in this example.

The lithium silicon battery comprises an anode comprising a composite comprising Group14 elements silicon and carbon. The concentration of composite comprising Group14 elements silicon and carbon by dry weight in the anode can vary, for example from 1% to 90%, for example 5% to 95%, for example 10% to 70%. In certain embodiments, the concentration of composite comprising Group14 elements silicon and carbon by dry weight in the anode is 5% to 25% or 25% to 35%, or 35% to 50%, or 50% to 70%, or greater than 70%.

The anode may further comprise other components. These other components include graphite, conductive carbon additive, and binder, and combinations thereof.

In some embodiments, the lithium-silicon battery comprises an anode that comprises graphite, or combinations thereof. Exemplary graphites in this regard include, but are not limited to, natural graphite, synthetic graphite, nanographite, or combinations thereof. The concentration by dry weight of graphite in the anode may vary, example 5% to 95%, for example 10% to 70%, for example 20% to 60%, for example 30% to 50%. In certain embodiments, the lithium-silicon battery comprises an anode that is devoid of graphite.

In preferred embodiments, the lithium-silicon battery comprises an anode that comprises conductive carbon additive, or combinations thereof. Exemplary conductive carbon additives include, but are not limited to, carbon black, conductive carbon black, superconductive carbon black, extraconductive carbon black, ultraconductive carbon black, Super C, Super P, Super [C45 or C65], Ketjenblack carbon, acetylene black, fullerene, graphene, carbon fibers, carbon nanofibers, carbon nanotubes, or combinations thereof. The concentration by dry weight of conductive carbon additive in the anode may vary, for example from 0.1% to 20%, for example 1% to 10%, for example 2% to 8%, for example 3% to 6%. In certain embodiments, for example wherein the anode is devoid of graphite, the concentration by dry weight of conductive carbon additive may range from 5% to 20%, for example 10% to 20%, for example 14% to 16%.

In preferred embodiments, the lithium-silicon battery comprises an anode that comprises a binder, or combinations thereof. Exemplary binders included, but are not limited to, polyvinylidene difluoride (PVDF), styrene butadiene rubber (SBR), sodium carboxymethyl cellulose (Na-CMC), polyacrylonitrile (PAN), polyacrylic latex, polyacrylic acid (PAA), polyvinyl alcohol (PVA), polyethylene glycol (PEG), polyamide imide (PAI), polyimide (PI), and combinations thereof. In certain embodiments, the binder can comprise a lithium ion as counter ion. The concentration by dry weight of binder in the anode may vary, for example from 0.1% to 20%, for example 1% to 10%, for example 2% to 8%, for example 3% to 6%. In certain embodiments, for example wherein the anode is devoid of graphite, the concentration by dry weight of binder may range from 5% to 20%, for example 10% to 20%, for example 14 to 16%.

The anode of the lithium-silicon battery comprises a composite comprising Group 14 elements silicon and carbon, wherein said anode also comprises a porosity in the dry state. The porosity of the dry anode may vary, for example between 10% and 90%, for example 20% to 80%, for example 30% to 70%, for example 40% to 60%. In certain preferred embodiments, the porosity of the dry anode is 30% to 50%. In certain preferred embodiments, the porosity of the dry anode is 10% to 50%.

The lithium-silicon battery comprises a anode comprising a composite comprising Group 14 elements silicon and carbon, wherein said lithium silicon battery also comprises a cathode. Exemplary cathodes include, but are not limited to, lithium cobalt oxide ($LiCoO_2$) (LCO), lithium manganese oxide ($LiMn_2O_4$) (LMO), lithium iron phosphate ($LiFePO_4$) (LFP), lithium nickel cobalt aluminum oxide ($LiNiCoAlO_2$) (NCA), lithium titanate ($Li_2TiO_3$) (LTO), lithium nickel manganese cobalt oxide ($LiNi_xMn_yCo_zO_2$) (NMC, with x+y+2=1, x:y:z=3:3:3 (NMC333), 4:3:3 (NMC433), 5:3:2 (NMC532), 6:1:1 (NMC611), 6:2:2 (NMC622), 8:1:1 (NMC811)). In certain preferred embodiments, the cathode is NMC811.

The lithium-silicon battery comprises a ratio known as the N/P ratio that describes the capacity ratio between the anode and cathode electrodes in the battery cell). The N/P is important for determining the energy density of the lithium-silicon battery. Without being bound by theory, a lower N/P ratio provides for less excess anode hence higher energy density of the lithium-silicon battery. The average discharge potential for silicon-carbon anodes is higher than graphite anodes. Without being bound by theory, presence of $\varphi$ in the anode enables one to reduce the excess anode needed in the cell to avoid plating. Accordingly, and without being bound by theory, the novel anode material described herein comprising $\varphi \geq 0$, for example $\varphi \geq 0.15$, for example $\varphi \geq 0.2$, for example $\varphi \geq 0.25$, for example $\varphi \geq 0.3$, allows for lower N/P ratio and hence higher energy density of the lithium-silicon battery. In certain embodiments, the N/P ratio>1.1, for example N/P ratio>1.2, for example N/P ratio>1.3, for example N/P ratio>1.4, for example N/P ratio>1.5, for example N/P ratio>2.0. In certain preferred embodiments, the N/P ratio≤2.0, for example N/P ratio≤1.5, for example N/P ratio≤1.4, for example N/P ratio≤1.3, for example N/P ratio≤1.2, for example N/P ratio≤1.1, for example N/P ratio≤1.0, for example N/P ratio≤0.9, for example N/P ratio≤0.8.

The lithium-silicon battery comprises an electrolyte, wherein the electrolyte comprises various components including solvent, solvent additives, and electrolyte ions. Exemplary electrolyte components include, but are not limited to, ethylene carbonate (EC), diethylcarbonate (DEC), propylene carbonate (PC), dimethyl carbonate (DMC), ethyl methyl carbonate (EMC), ethyl propyl ether (EPE), fluorinated cyclic carbonate (F-AEC), fluorinated linear carbonate (F-EMC), Dimethylacrylamide (DMAA), Succinic anhydride (SA), tris(trimethylsilyl) borate (TTMB), tris(trimethylsilyl) phosphate (TTSP), 1,3-propane sultone (PS), fluorinated ether (F-EPE), fluoroethylene carbonate (FEC), performance enhancing organosilicon electrolyte materials sch as OS3, vinylene carbonate (VC), LiPF6, LiBF4, LiBOB, LiTFSI, LIFSI, LiClO4 and combinations thereof. In certain embodiments, the electrolyte salts concentration >1.0 M, for example salt concentration >1.2, for example salt concentration >1.3, for example salt concentration >1.4, for example salt concentration >1.5, for example salt concentration >2.0. In certain preferred embodiments, the electrolyte salt concentration <2.0, for example electrolyte salt concentration <1.5, for example electrolyte salt concentration <1.4, for example electrolyte salt concentration <1.3, for example electrolyte salt concentration <1.2, for example electrolyte salt concentration <1.1, for example electrolyte salt concentration <1.0, for example electrolyte salt concentration <0.9.

The lithium-silicon battery comprising a composite comprising Group 14 elements silicon and carbon also comprises a separator that maintains the separation of anode and cathode. Separator can be made of one layer or multiple layers of polymer material, or coated with aramid, ceramic or fluoride materials. Examplary separator materials include, but are not limited to, nonwoven fibers (cotton, nylon, polyesters, glass), polymer films (polyethylene, polypropylene, poly (tetrafluoroethylene), polyvinyl chloride), ceramic, and naturally occurring substances (rubber, asbestos, wood). In certain preferred embodiments, the separator comprises a polymer, wherein exemplary polymers include, but are not limited to, polyolefin based materials with semi-crystalline structure, polyethylene, polypropylene, graft polymers including micro-porous poly(methyl methacrylate)-grafted and siloxane grafted polyethylene, polyvinylidene fluoride (PVDF) nanofiber webs, and polytriphenylamine (PTPA).

The lithium-silicon battery comprising a composite comprising Group14 elements silicon and carbon is cycled during battery use between the lower and upper bounds of the lithium-silicon battery operating voltage window. Without being bound by theory, decreasing the lower bound of the operating voltage window provides for higher energy density of the lithium-silicon battery. Accordingly, and without being bound by theory, the novel anode material described herein comprising $\varphi \geq 0$, for example $\varphi \geq 0.15$, for example $\varphi \geq 0.2$, for example $\varphi \geq 0.25$, for example $\varphi \geq 0.3$, allows for decreasing the lower bound voltage window and hence higher energy density of the lithium-silicon battery. In certain embodiments, the lower bound of the voltage window is ≤3.0 V, for example ≤2.9V, for example ≤2.8V, for example ≤2.7V, for example ≤2.6V, for example ≤2.5V, for example ≤2.4V, for example ≤2.3V. The upper bound of the voltage window for cycling the lithium-silicon battery can be varied. For example, the upper bound of the voltage window can vary, for example ≥4.0 V, for example 4.0V, or 4.1 V, or 4.2 V, or 4.3 V, or 4.4V, or 4.5 V, or 4.6 V, or 4.7V, or 4.8, or 4.9 V, or 5.0V.

Example 6

Passivation of Silicon-Carbon Composite Materials Prepared by CVI by Employing Various Oxygen-Containing Gases Silicon-carbon composite materials were produced employing Carbon Scaffold 10 as the porous carbon scaffold, and carrying out the CVI process generally as described in Example 1, except that for this current example, for the last step in the preparation of the silicon-carbon composite, the various samples were passivated by various methodologies. In each case, after completion of CVI process, the process gas was switched to nitrogen gas until the desired passivation temperature was reached, at which time the temperature was maintained at the desired passivation temperature and the process gas was switched to the passivation gas. Following passivation, the temperature was lowered to <100° C. and the material removed for characterization. A summary of the passivation methodologies and properties of the resulting silicon-carbon composite materials is presented in Table 8.

TABLE 8

| Passivation of silicon-carbon composite materials according to Example 6. | | | | | | |
|---|---|---|---|---|---|---|
| Silicon-Carbon Composite # | Passivation | | Mass | Si | Surface | Thermal |
| | Gas | Temp (° C.) | Gain (%) | Content (%) | Area (m2/g) | Z | Runaway (Y/N) |
| 22 | Air | 200 | 49 | 46 | 26 | 1.6 | N |
| 23 | H2O | 200 | 48 | 44 | 62 | 0.5 | N |
| 24 | Denatured alcohol | 200 | 47 | 47 | 22 | 1.5 | N |
| 25 | CO2 | 400 | 49 | 47 | 6 | 1.8 | N |
| 26 | CO2, 3 cycles | 440 | 47 | 37 | 23 | 1.2 | N |

Employment of air as the passivating agent (Silicon-Carbon Composite Sample #22) resulted in a satisfactory condition. No excessive sample heating (no thermal runaway) was observed, therefore, this condition represents a safe and industrially relevant and scalable approach for preparing the silicon-carbon composite. In contrast, a silicon-carbon composite comparator sample was produced using the same carbon scaffold with the CVI reaction progressed to a lower mass gain (29%) and lower measured silicon content (25%), and passivated with air at relatively lower temperature (26 C), resulting in a surface area of 730 m2/g. Notably for this sample, thermal runaway was observed.

From the table, it can also be seen that various alternative oxygen-containing gases, such as water vapor, ethanol vapor, or carbon dioxide, can also be successfully employed as passivation gases at the temperature described in the table. The silicon-carbon composites were also analyzed by TGA to determine silicon content and the Z, and the values are presented in Table 8. The silicon-carbon composite materials were also tested in half-cell coin cells, and these data are presented in Table 9.

TABLE 9

Electrochemical evaluation of various silicon-carbon composite samples produced per Example 5.

| Silicon-Carbon Composite # | Max Capacity (mAh/g) | Average CE (7-20) | φ |
|---|---|---|---|
| 22 | 1483 | 0.9975 | 0.18 |
| 23 | 1323 | 0.9979 | 0.21 |
| 24 | 1517 | 0.9978 | 0.18 |
| 25 | 1479 | 0.9974 | 0.17 |
| 26 | 1109 | 0.9983 | 0.15 |

No excessive heating was observed for any of the various passivation approaches employed per Table 9. As can be seen, the condition of 200° C. and water vapor was found to be a suitable passivation gas for the silicon-carbon composite sample prepared by CVI. Likewise, the condition of 200° C. and ethanol gas was also found to be a suitable passivation gas for the silicon-carbon composite sample prepared by CVI. Without being bound by theory, it is expected that the added diffusional limited provided by silicon produced by CVI provides for less facile passivation for oxygen-containing gases of larger molecular size than oxygen gas. Therefore, it is a surprising and unexpected result that such alcohols such as denatured alcohol and the like are suitable for passivating silicon produced via CVI, that is silicon located within pore of porous carbon scaffold. In additional embodiments, the oxygen-containing passivation gas may be an alcohol, including, but not limited to, methanol, ethanol, denatured alcohol, propanol, butanol, isopropyl alcohol, dimethyl carbonate, ethylene carbonate, and mixtures thereof.

In addition, the condition of 400° C. and carbon dioxide was also found to be a suitable passivation gas for the silicon-carbon composite sample prepared by CVI. In this fashion, the passivation is carried out in the similar temperature regime as the CVI process. In some embodiments, the passivation can be alternated with the CVI processing, thus layering oxygen content within the silicon that is impregnated into the porous carbon. In this fashion, the characteristic silicon size is further reduced compared to the case where the passivation is carried out at the completion of CVI processing. Without being bound by theory, the layering of oxygen within the silicon located within the carbon pore as prepared by CVI provides for benefits for the material when employed as an anode for lithium ion batteries, such as increased cycle stability and reduced expansion upon lithiation.

To this end, a silicon-carbon composite sample was made in a similar fashion as Silicon-Carbon Composite #25, except that the reaction temperature was maintained at 440 C, and the gas entering the rector was alternated between silane (to accomplish CVI) and CO2 (to accomplish passivation) in three intervals, that is three separate and equally timed intervals each of CVI processing and passivation, thus providing for three layers of silicon and oxygen passivated surface on the silicon. This is denoted as Silicon-Carbon Composite #26 in Tables 8 and Table 9. This sample exhibited a substantially lower silicon content as determined by TGA compared to the overall mass gain upon the thrice intermittent CVI and passivation processing. This difference is due to increased oxygen content in the sample compared to other samples presented in Table 8. Importantly, this average Coulombic efficiency for this sample was higher, 0.9983, in contrast the other comparator samples in Table 9.

In some embodiment, the silicon-carbon composite material is prepared by maintaining the porous carbon scaffold at temperature between 350° C. and 550° C., and alternating the process gas between a silicon-containing gas and an oxygen-containing gas, for a total of two intervals each. In some embodiments, the alternating introduction of process between a silicon-containing gas and an oxygen-containing gas can be carried out for a total of three intervals each, or four intervals each, or five intervals each, or five to ten intervals each, or more than ten intervals each.

Example 7

Passivation of Silicon-Carbon Composite Materials Prepared by CVI by Employing Non-Oxygen Containing Gases Silicon-carbon composite materials were produced employing Caron Scaffold 10 as the porous carbon scaffold, and carrying out the CVI process generally as described in Example 1, except that for this current example, for the last step in the preparation of the silicon-carbon composite, the various samples was passivated using a non-oxygen containing gas. For this example, the non-oxygen containing gas was a hydrocarbon, namely propylene gas. For this example, the CVI reaction temperature was 440° C., and the passivation employing propylene was carried out by introducing the propylene after the CVI process was completed, and process temperature was initially at 440° C. and allowed to cool for about 60 min to carry out the passivation, hence the passivation temperature was <440° C. The details for this sample are presented in Table 10, and the electrochemical properties are presented in Table 11.

TABLE 10

Passivation of silicon-carbon composite materials.

| Silicon-Carbon Composite # | Passivation | | Observed | Si | Surface | |
|---|---|---|---|---|---|---|
| | Gas | Temp (° C.) | Mass Gain (%) | Content (%) | Area (m2/g) | Z |
| 27 | Propylene | <440 | 45 | 45 | ND | 1.3 |

ND = not determined

TABLE 11

Electrochemical evaluation of various silicon-carbon composite samples produced per Example 6.

| Silicon-Carbon Composite # | Max Capacity (mAh/g) | Average CE (7-20) | φ |
|---|---|---|---|
| 27 | 1412 | 0.9981 | 0.19 |

Without being bound by theory, the employment of propylene as the passivation agent provides not only for passivation of the silicon surface, but also for adding a terminal carbon coating on the silicon-carbon composite. Without being bound by theory, this also provides additional benefits such as increased conductivity, and increased stability afforded by decreased reactivity of the terminal carbon coating layer. In turn, the silicon-carbon composite thusly produced has additional benefits when employed as an anode material in a lithium ion battery, such as, but not limited to, increased rate capability, increased cycle life at room temperature, increased cycle life at elevated temperature such as 45° C. or 60° C., and/or increased calendar life.

In some embodiments, a diminution is carried out to reduce the size of the silicon-carbon composite particles after the CVI process, and before passivation. In alternate embodiments, a diminution is carried out to reduce the size of the silicon-carbon composite particles after the passivation process.

Example 8

Hydrosilylation Passivation of Silicon-Carbon Composite Materials Prepared by CVI by Employing Acetylene Following creation of silicon-carbon composite materials via CVI, passivation can be accomplished by hydrosilylation passivation. The temperature can range from 100 to 500° C., for example 120° C., for example 150° C., for example 170° C., for example 180° C., for example 200° C., for example 250° C., for example 300° C., for example 350° C., for example 400° C., for example 450° C. In a preferred embodiment, the temperature is 170° C., or 190 C. The pressure can be atmospheric pressure. In some embodiments, the pressure can be lower than atmospheric pressure. In some embodiments, the pressure can be higher than atmospheric pressure. Without being bound by theory, the acetylene undergoes a self-terminating hydrosilylation reaction with the Si—H surface group (Si—H+R1=R2→Si—R1H—R2) thus resulting in an alkyl (ethyl) termination no longer susceptible to further oxidation on eventual exposure to air, where R1 and R2 correspond to alkanes, alkenes, or alkynes, as known in the art. This particular hydrosilylation passivation reaction is advantageous because it emits no byproducts and imparts no oxygen content thereby potentially improving electrochemical anode performance by mitigating formation of irreversible Li—O byproducts or other parasitic side reactions with the electrolyte in a Li-ion battery.

Without being bound by theory, the hydrosilylation passivation of the silicon carbon composite results in a material that comprises a carbon scaffold, nano-sized silicon domains within the pores of the porous carbon wherein the silicon surface comprises Si—R bonds (wherein R represents an organic functional group comprising combinations of carbon, oxygen, nitrogen or hydrogen; exemplary R species are alkanes, an alkenes, or alkynes). In some embodiments, R comprises a halogen element, such as bromine, fluorine, chlorine, or iodine.

Table 12 presents a listing of various samples produced employing hydrosilylation passivation according to Example 8. These samples were produced employing Carbon Scaffold 10.

TABLE 12

Hydrosilylation passivation of silicon-carbon composite materials according to Example 8.

| Silicon-Carbon Composite # | Passivation Temp (C.) | Si Content (%) | Surface Area (m2/g) | Z | Thermal Runaway (Y/N) | Oxygen content (%) |
|---|---|---|---|---|---|---|
| 27 | 477 | 44.3 | 167 | 2.5 | N | 17 |
| 28 | 190 | 20.2 | 919 | 0 | N | 9.48 |
| 29 | 190 | ND | 1267 | ND | N | 10.7 |

TABLE 12-continued

Hydrosilylation passivation of silicon-carbon composite materials according to Example 8.

| Silicon-Carbon Composite # | Passivation Temp (C.) | Si Content (%) | Surface Area (m2/g) | Z | Thermal Runaway (Y/N) | Oxygen content (%) |
|---|---|---|---|---|---|---|
| 30 | 190 | ND | 1411 | ND | N | 8.59 |
| 31 | 190 | ND | 1012 | ND | N | 13.2 |
| 32 | 190 | 17.5 | ND | 0.00 | N | ND |
| 33 | 170 | 51.2 | ND | 10.9 | N | 3.04 |
| 34 | 170 | 42.4 | 198 | 3.0 | N | 11.3 |
| 35 | 170 | 25.3 | 721 | 0 | Y | 13.8 |
| 36 | 170 | 51.0 | ND | 9.4 | N | 5.61 |
| 37 | 170 | 50.0 | ND | 6.9 | N | 6.91 |
| 38 | 170 | 45.5 | ND | 2.6 | N | 13.2 |
| 39 | 190 | 45.3 | ND | 3.1 | N | 12.8 |
| 40 | 400 | 46.0 | 12.9 | 0 | N | 1.2 |
| 41 | 400 | 44.0 | 10.1 | 0.4 | N | 1.78 |
| 42 | 400 | 48.0 | 6.7 | 3.15 | N | 0.91 |
| 43 | 200 | 43.8 | 45.2 | 0.26 | Y | 1.73 |
| 44 | 250 | 44.5 | 40.9 | 0.62 | N | 0.95 |

ND = not determined; Silicon-carbon composite #27 represents a control that is not hydrosilylation passivated, but rather air passivated.

Selected samples were analyzed for their electrochemical characterization (Table 13). Regarding both Z and φ, the trends and ranges followed similar behavior for chemical vapor passivated samples and sample passivated with air as presented in examples above (e.g., Examples 1-3).

TABLE 13

Electrochemical characterization of hydrosilylation passivation of silicon-carbon composite materials according to Example 8.

| Silicon-Carbon Composite # | Max Capacity (mAh/g) | Average CE (7-20) | FCE (%) |
|---|---|---|---|
| 34 | 1416 | 0.9985 | 79.7 |
| 36 | 1889 | 0.9961 | 91.7 |
| 37 | 1844 | 0.9957 | 90.8 |
| 38 | 1631 | 0.9979 | 85.8 |
| 39 | 1591 | 0.9976 | 85.9 |

Example 9

Passivation of Silicon-Carbon Composite Materials Prepared by CVI by Employing Gasified Liquid In certain embodiments, the alkene and/or alkyne passivation agent is a liquid under standard temperature and pressure conditions. Following silicon deposition from silane on a porous substrate the material is cooled to and held at 100 to 500° C., for example 120° C., for example 150° C., for example 170° C., for example 180° C., for example 200° C., for example 250° C., for example 300° C., for example 350° C., for example 400° C., for example 450° C. In a preferred embodiment, the temperature is 170° C. Some time is allowed to pass to achieve temperature equilibrium (~30 min). At which point, the gas flow is stopped and a vacuum is pulled on the reactor. The reactor is then back filled from a bubbler/dewar containing the liquid alkene to the desired pressure (e.g., allyl glycidyl ether, b.p.=154° C.) having a boiling point less than the reactor temperature so as to remain in a vapor phase during the reaction conditions. The reactor is sealed off and allowed to dwell at temperature for 1-24 hours to facilitate the hydrosilylation passivation reaction. In another embodiment the vacuum steps can be omitted and instead the inert gas flow can be diverted through the bubbler/dewar containing the alkene/alkyne liquid species allowing the vapor to be entrained in the gas stream and introduced to the reactor for a period of time specified above, thus maintaining atmospheric pressure throughout the reaction.

In another embodiment, the hydrosilylation reaction is carried out in a liquid suspension. Herein the silicon-carbon composite is transferred from the reactor into an inert gas (e.g., argon, nitrogen, helium) environment where it is then dispersed in an aprotic solvent (e.g., THF or toluene) with or without stirring. The alkene/alkyne (e.g., allyl glycidyl ether) species is added to the suspension followed by a catalyst (e.g., platinum(0)-1,3-divinyl-1,1,3,3-tetramethyld-isiloxane complex). The suspension is heated modestly (e.g., 30-50° C.) and allowed to react for a period of time (e.g., 1-24 hours). The passivated silicon-carbon composite is then recovered from the suspension afterwards using conventional methods (e.g., centrifuging, filtration, spray drying, etc.).

Example 10

Passivation of Silicon-Carbon Composite Materials Prepared by CVI by Employing Combination of Passivation Agents In yet another embodiment wherein a combination of different alkene/alkyne species are utilized for passivation simultaneously so as to achieve a combination of physical properties and/or performance characteristics. Following silicon deposition from silane on a porous substrate the material is cooled to and held at 170° C. under an inert gas. Some time is allowed to pass to achieve temperature equilibrium (~30 min). At which point, the gas flow is stopped and a vacuum is pulled on the reactor. The reactor is then back filled from a bubbler/dewar containing a mixture of two or more liquid alkenes to the desired pressure (e.g., allyl glycidyl ether and allyloxy(polyethylene oxide)) having boiling points less than the reactor temperature so as to remain in a vapor phase during the reaction conditions. The reactor is sealed off and allowed to dwell at temperature for 3 hours to facilitate the hydrosilylation passivation reaction.

In preferred embodiments, the temperature for the hydrosilylation passivation is 100° C. to 220° C., preferably 160 to 190° C. In preferred embodiments, the pressure for the hydrosilylation passivation is 0.001 Torr to 800 Torr, preferably 500-760 Torr. Exemplary species to employed as the hydrosilylation passivation agent include acetylene, propylene, ethylene, butene, allyloxyethanol, diallyl carbonate, allyl methyl carbonate, allyl ethyl carbonate, allyl glycidyl ether, allyloxy(polyethylene oxide) methyl ether, and allyloxytrimethylsilane (preferred species: acetylene, allyl glycidyl ether, allyl ethyl carbonate, and allyloxy(polyethylene oxide). The preferred duration for the hydrosilylation passivation is 0.5 to 12 hours, preferably 1 to 6 hours. In certain embodiments, a catalyst can be employed to lower the temperature and/or time for the hydrosilylation passivation reaction. With regards to such embodiment, exemplary catalysts include platinum (Karstedt's catalyst), ultraviolet light (~365 nm wavelength), radical initiator such as 2,2-azobisisobutyronitrile, benzoyl peroxide, or borane, and combinations thereof.

Example 11

Chemical Vapor Passivation (CVP) of Silicon-Carbon Composite Materials

This example describes a novel process for in situ passivation of silicon-carbon composite materials, herein referred to as chemical vapor passivation (CVP). According to the CVP process, the silicon-carbon composite material, for example silicon-carbon composite material produced via CVI to create nano-sized amorphous silicon within a porous carbon scaffold material, is subsequently passivated in the presence of a hydrocarbon gas at elevated temperature. The CVP temperature can vary, for example from 400 to 1000° C., for example 400 to 500° C., for example 500 to 600° C., for example 600 to 700° C., for example 700 to 800° C., for example 800 to 900° C., for example 900 to 1000° C., for example 400 to 450° C., for example 450 to 500° C., for example 500 to 550° C., for example 550 to 600° C., for example 600 to 650° C., for example 650 to 700° C., for example 700 to 750° C., for example 750 to 800° C., for example 800 to 850° C., for example 850 to 900° C., for example 900 to 950° C., for example 950 to 1000° C. In some embodiments, the CVP temperature ranges from 400 to 600° C., or 500 to 700° C., or 600 to 800° C., or 700 to 900° C., or 800 to 1000° C. In some preferred embodiments, the temperature ranges from 300 to 700° C. The gas employed for the CVP process can be a hydrocarbon (e.g., acetylene, ethylene, propylene, propane, ethane, methane, butane, butylene, etc., or combinations thereof. In some preferred embodiments, acetylene is employed. The pressure can be atmospheric pressure. In some embodiments, the pressure can be below atmospheric pressure. In some embodiments, the pressure can be above atmospheric pressure. During the CVP process, the hydrocarbon gas undergoes decomposition on the surface of the material yielding an amorphous carbon coating (accordingly $CxHy \Rightarrow C+H2$). This particular passivation reaction is advantageous because the thickness of the carbon layer can be controlled by adjusting the temperature and/or dwell time and the carbon layer itself can contribute electrical conductivity to the host silicon-carbon composite.

Without being bound by theory, the CVP of the silicon carbon composite results in a material that comprises a carbon scaffold, nano-sized silicon domains within the pores of the porous carbon wherein the silicon surface comprises Si—H bonds, and a carbonaceous layer at least partially covering the silicon domains.

According to this example, a variety of silicon-carbon composite samples were prepared generally according to the methods described herein, with their passivation accomplished by CVP. These samples are presented in Table 14. The carbon scaffold employed was Carbon Scaffold 10 or otherwise had similar porous nature. The CVP 5 temperature was within the range of 300 to 700 C. Alternatively, the CVP temperature can range from 700 C to 1000 C. Selected samples were measured for their oxygen content; the oxygen content was within the range of 0.6 to 2.9%. Regarding both Z and φ, the trends and ranges followed similar behavior for hydrosilylation passivated samples and sample passivated with air as presented in examples above (e.g., Examples 1-3).

TABLE 14

| | | | | | | |
|---|---|---|---|---|---|---|
| CVP of silicon-carbon composite materials according to Example 11. | | | | | | |
| Silicon-Carbon Composite # | Si Content (%) | Surface Area (m2/g) | Thermal Runaway (Y/N) | Max Capacity (mAh/g) | Average CE (7-20) | FCE (%) |
| 45 | 46.8 | 7.55 | N | 1830 | 0.9986 | 92% |
| 46 | 46.6 | 10.15 | N | 1813 | 0.9982 | 92% |

TABLE 14-continued

CVP of silicon-carbon composite materials
according to Example 11.

| Silicon-Carbon Composite # | Si Content (%) | Surface Area (m2/g) | Thermal Runaway (Y/N) | Max Capacity (mAh/g) | Average CE (7-20) | FCE (%) |
|---|---|---|---|---|---|---|
| 47 | 46.4 | 8.4 | N | 1880 | 0.9979 | 90% |
| 48 | 46.9 | 6 | N | 1932 | 0.9971 | 92% |
| 49 | 46.5 | 8.7 | N | 1908 | 0.9984 | 89% |
| 50 | 45.6 | 19 | N | 1733 | 0.9989 | 85% |
| 51 | 46.4 | 11.6 | N | 1890 | 0.9988 | 88% |
| 52 | 46.1 | 9.1 | N | 1809 | 0.9989 | 87% |
| 53 | 46.6 | 5.1 | N | 1898 | 0.9964 | 92% |
| 54 | 45.1 | 6.4 | N | 1691 | 0.9990 | 91% |
| 55 | 45.0 | 6.6 | N | 1646 | 0.9991 | 91% |

EXPRESSED EMBODIMENTS

Embodiment 1. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. lowering the temperature to ≤200° C. in the presence of nitrogen gas; and d. adding an oxygen-containing gas.

Embodiment 2. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. lowering the temperature to ≤200° C. in the presence of nitrogen gas;

d. adding an oxygen-containing gas; and e. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 3. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. lowering the temperature to ≤200° C. in the presence of nitrogen gas;

d. adding an oxygen-containing gas; and e. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and ii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 4. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. lowering the temperature to ≤200° C. in the presence of nitrogen gas;

d. adding an oxygen-containing gas; and e. wherein the passivated silicon-carbon composite comprises:

i. a silicon content of 30% to 60% by weight;

ii. a surface area less than 30 $m^2/g$;

iii. Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 5. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. adjusting the temperature to ≤400° C. in the presence of nitrogen gas; and d. adding an oxygen-containing gas.

Embodiment 6. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. adjusting the temperature to ≤400° C. in the presence of nitrogen gas;

d. adding an oxygen-containing gas; and e. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 7. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. adjusting the temperature to ≤400° C. in the presence of nitrogen gas;

d. adding an oxygen-containing gas; and e. wherein the passivated silicon-carbon composite comprises:

i. a Z of less than 10, wherein Z=1.875×[(M1100−M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and ii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 8. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. adjusting the temperature to ≤400° C. in the presence of nitrogen gas;

d. adding an oxygen-containing gas; and e. wherein the passivated silicon-carbon composite comprises:

i. a silicon content of 30% to 60% by weight;

ii. a surface area less than 30 m²/g;

iii. Z of less than 10, wherein Z=1.875×[(M1100−M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 9. The process for preparing passivated silicon-carbon composite particles of any of Embodiments 1 through Embodiment 8 wherein the pore volume comprises greater than 80% microporosity.

Embodiment 10. The process for preparing passivated silicon-carbon composite particles of any of Embodiments 1 through Embodiment 9 wherein the pore volume comprises greater than 90% microporosity.

Embodiment 11. The process for preparing passivated silicon-carbon composite particles of any of Embodiments 1 through Embodiment 10 wherein the pore volume comprises greater than 95% microporosity.

Embodiment 12. The process for preparing passivated silicon-carbon composite particles of any of Embodiments 1 through Embodiment 11 wherein the porous carbon scaffold particles are heated to a temperature of 400° C. to 525° C. in the presence of silane gas.

Embodiment 13. The process for preparing passivated silicon-carbon composite particles of any of Embodiments 1 through Embodiment 12 wherein the silicon-carbon composite comprises a silicon content of 40-60%.

Embodiment 14. The process for preparing passivated silicon-carbon composite particles of any of Embodiments 1 through Embodiment 13 wherein the silicon-carbon composite comprises a Z less than 5.

Embodiment 15. The process for preparing passivated silicon-carbon composite particles of any of Embodiments 1 through Embodiment 14 wherein the silicon-carbon composite comprises a surface area less than 10 m2/g.

Embodiment 16. The process for preparing passivated silicon-carbon composite particles of any of Embodiments 1 through Embodiment 15 wherein the silicon-carbon composite comprises a φ of greater than or equal to 0.2, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 17. The process for preparing passivated silicon-carbon composite particles of any of Embodiments 1 through Embodiment 16 wherein the silicon-carbon composite comprises a φ of greater than or equal to 0.3, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 18. The process for preparing passivated silicon-carbon composite particles of any of the embodiments from Embodiment 1 through Embodiment 17 wherein the silicon-carbon composite comprises a Dv50 between 5 nm and 20 microns.

Embodiment 19. The process for preparing passivated silicon-carbon composite particles of any of the embodiments from Embodiment 1 through Embodiment 18 wherein the silicon-carbon composite comprises a capacity of greater than 900 mA/g.

Embodiment 20. The process for preparing passivated silicon-carbon composite particles of any of the embodiments from Embodiment 1 through Embodiment 19 wherein the silicon-carbon composite comprises a capacity of greater than 1300 mA/g.

Embodiment 21. The process for preparing passivated silicon-carbon composite particles of any of the embodiments from Embodiment 1 through Embodiment 20 wherein the silicon-carbon composite comprises a capacity of greater than 1600 mA/g.

Embodiment 22. The process for preparing passivated silicon-carbon composite particles of any of the embodiments from Embodiment 1 through Embodiment 21 wherein the oxygen-containing gas comprises carbon dioxide.

Embodiment 23. The process for preparing passivated silicon-carbon composite particles of any of the embodiments from Embodiment 1 through Embodiment 21 wherein the oxygen-containing gas comprises ethanol.

Embodiment 24. The process for preparing passivated silicon-carbon composite particles of any of the embodiments from Embodiment 1 through Embodiment 21 wherein the oxygen-containing gas comprises dimethyl carbonate, ethylene carbonate, propylene carbonate, ethyl methyl carbonate, diethyl carbonate, or vinylene carbonate, or a mixture thereof.

Embodiment 25. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas; and c. alternating the process gas between silane gas and carbon dioxide gas.

Embodiment 26. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. alternating the process gas between silane gas and carbon dioxide gas; and d. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 27. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. alternating the process gas between silane gas and carbon dioxide gas; and d. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and ii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 28. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. alternating the process gas between silane gas and carbon dioxide gas; and d. wherein the passivated silicon-carbon composite comprises:

i. a silicon content of 30% to 60% by weight;

ii. a surface area less than 30 m²/g;

iii. Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 29. The process for preparing passivated silicon-carbon composite particles of any of Embodiments 25 through Embodiment 28 wherein the pore volume comprises greater than 80% microporosity.

Embodiment 30. The process for preparing passivated silicon-carbon composite particles of any of Embodiments 25 through Embodiment 28 wherein the pore volume comprises greater than 90% microporosity.

Embodiment 31. The process for preparing passivated silicon-carbon composite particles of any of Embodiments 25 through Embodiment 28 wherein the pore volume comprises greater than 95% microporosity.

Embodiment 32. The process for preparing passivated silicon-carbon composite particles of any of Embodiments 25 through Embodiment 28 wherein the silicon-carbon composite comprises a silicon content of 40-60%.

Embodiment 33. The process for preparing passivated silicon-carbon composite particles of any of Embodiments 25 through Embodiment 28 wherein the silicon-carbon composite comprises a Z less than 5.

Embodiment 34. The process for preparing passivated silicon-carbon composite particles of any of Embodiments 25 through Embodiment 28 wherein the silicon-carbon composite comprises a surface area less than 10 m2/g.

Embodiment 35. The process for preparing passivated silicon-carbon composite particles of any of Embodiments 25 through Embodiment 28 wherein the silicon-carbon composite comprises a φ of greater than or equal to 0.2, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 36. The process for preparing passivated silicon-carbon composite particles of any of Embodiments 25 through Embodiment 28 wherein the silicon-carbon composite comprises a φ of greater than or equal to 0.3, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 37. The process for preparing passivated silicon-carbon composite particles of any of the embodiments from Embodiment 25 through Embodiment 28 wherein the silicon-carbon composite comprises a Dv50 between 5 nm and 20 microns.

Embodiment 38. The process for preparing passivated silicon-carbon composite particles of any of the embodiments from Embodiment 25 through Embodiment 28 wherein the silicon-carbon composite comprises a capacity of greater than 900 mA/g.

Embodiment 39. The process for preparing passivated silicon-carbon composite particles of any of the embodiments from Embodiment 25 through Embodiment 28 wherein the silicon-carbon composite comprises a capacity of greater than 1300 mA/g.

Embodiment 40. The process for preparing passivated silicon-carbon composite particles of any of the embodiments from Embodiment 25 through Embodiment 28 wherein the silicon-carbon composite comprises a capacity of greater than 1600 mA/g.

Embodiment 41. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas; and c. cooling the silicon-carbon composite in the presence of propylene gas.

Embodiment 42. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. cooling the silicon-carbon composite in the presence of propylene gas; and d. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 43. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. cooling the silicon-carbon composite in the presence of propylene gas; and d. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and ii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 44. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. cooling the silicon-carbon composite in the presence of propylene gas; and d. wherein the passivated silicon-carbon composite comprises:

i. a silicon content of 30% to 60% by weight;

ii. a surface area less than 30 m²/g;

iii. Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 45. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas; and c. cooling the silicon-carbon composite to a temperature between 100° C. and 300° C. in the presence of acetylene gas.

Embodiment 46. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. cooling the silicon-carbon composite to a temperature between 100° C. and 300° C. in the presence of acetylene gas; and d. wherein the passivated silicon-carbon composite comprises:

ii. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 47. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. cooling the silicon-carbon composite to a temperature between 100° C. and 300° C. in the presence of acetylene gas; and d. wherein the passivated silicon-carbon composite comprises:

i. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and ii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 48. A process for preparing passivated silicon-carbon composite particles comprising:

a. providing a carbon scaffold comprising a pore volume, wherein the pore volume comprises greater than 70% microporosity;

b. heating the porous carbon scaffold particles to a temperature of 350° C. to 550° C. in the presence of silane gas;

c. cooling the silicon-carbon composite to a temperature between 100° C. and 300° C. in the presence of acetylene gas; and d. wherein the passivated silicon-carbon composite comprises:

i. a silicon content of 30% to 60% by weight;

ii. a surface area less than 30 m²/g;

iii. Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 49. The process for passivated preparing silicon-carbon composite particles of any of Embodiments 41 through Embodiment 48 wherein the pore volume comprises greater than 80% microporosity.

Embodiment 50. The process for preparing passivated silicon-carbon composite particles of any of Embodiments 41 through Embodiment 48 wherein the pore volume comprises greater than 90% microporosity.

Embodiment 51. The process for preparing passivated silicon-carbon composite particles of any of Embodiments 41 through Embodiment 48 wherein the pore volume comprises greater than 95% microporosity.

Embodiment 52. The process for preparing passivated silicon-carbon composite particles of any of Embodiments 41 through Embodiment 48 wherein the silicon-carbon composite comprises a silicon content of 40-60%.

Embodiment 53. The process for preparing passivated silicon-carbon composite particles of any of Embodiments 41 through Embodiment 48 wherein the silicon-carbon composite comprises a Z less than 5.

Embodiment 54. The process for preparing passivated silicon-carbon composite particles of any of Embodiments 41 through Embodiment 48 wherein the silicon-carbon composite comprises a surface area less than 10 m²/g.

Embodiment 55. The process for preparing passivated silicon-carbon composite particles of any of Embodiments 41 through Embodiment 48 wherein the silicon-carbon composite comprises a φ of greater than or equal to 0.2, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 56. The process for preparing passivated silicon-carbon composite particles of any of Embodiments 41 through Embodiment 48 wherein the silicon-carbon composite comprises a φ of greater than or equal to 0.3, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 57. The process for preparing passivated silicon-carbon composite particles of any of the embodiments from Embodiment 41 through Embodiment 48 wherein the silicon-carbon composite comprises a Dv50 between 5 nm and 20 microns.

Embodiment 58. The process for preparing passivated silicon-carbon composite particles of any of the embodiments from Embodiment 41 through Embodiment 48 wherein the silicon-carbon composite comprises a capacity of greater than 900 mA/g.

Embodiment 60. The process for preparing passivated silicon-carbon composite particles of any of the embodiments from Embodiment 41 through Embodiment 48 wherein the silicon-carbon composite comprises a capacity of greater than 1300 mA/g.

Embodiment 61. The process for preparing passivated silicon-carbon composite particles of any of the embodiments from Embodiment 41 through Embodiment 48 wherein the silicon-carbon composite comprises a capacity of greater than 1600 mA/g.

Embodiment 62. A silicon-carbon composite comprising:

a. a carbon scaffold comprising a pore volume, wherein the pore volume comprises greater than 70% microporosity;

b. a Z of less than 10, wherein $Z=1.875\times[(M1100-M)/M1100]\times100$, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and c. one or more layers of passivated silicon located below the terminally passivated silicon surface.

Embodiment 63. The silicon-carbon composite of Embodiment 62 wherein the silicon-carbon composite further comprises a silicon content of 30% to 60% by weight.

Embodiment 64. The silicon-carbon composite of any of the embodiments from Embodiment 62 through Embodiment 63 wherein the silicon-carbon composite is comprised of particles comprising a Dv50 between 5 nm and 20 microns.

Embodiment 65. The silicon-carbon composite of any of the embodiments from Embodiment 62 through Embodiment 64 wherein the silicon-carbon composite comprises a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 66. The silicon-carbon composite of any of the embodiments from Embodiment 62 through Embodiment 65 wherein layers of passivated silicon are silicon oxide layers.

Embodiment 67. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   c. contacting the silicon-carbon composite particles with an alkene gas at a temperature of 100° C. to 500° C. to create hydrosilylation passivated silicon-carbon composite particles.

Embodiment 68. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   c. contacting the silicon-carbon composite particles with an alkyne gas at a temperature of 100° C. to 500° C. to create hydrosilylation passivated silicon-carbon composite particles.

Embodiment 69. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   c. contacting the silicon-carbon composite particles with acetylene gas at a temperature of 100° C. to 500° C. to create hydrosilylation passivated silicon-carbon composite particles.

Embodiment 70. A process for preparing hydrosilylation passivated silicon-carbon composite particles comprising:
   a providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   c. contacting the silicon-carbon composite particles with propylene gas at a temperature of 100° C. to 500° C. to create hydrosilylation passivated silicon-carbon composite particles.

Embodiment 71. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   C. contacting the silicon-carbon composite particles with ethylene gas at a temperature of 100° C. to 500° C. to create hydrosilylation passivated silicon-carbon composite particles.

Embodiment 72. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   c. contacting the silicon-carbon composite particles with acetylene gas at a temperature of 100° C. to 500° C. to create hydrosilylation passivated silicon-carbon composite particles; and
   d. wherein the hydrosilylation passivated silicon-carbon composite comprises:
      i. a silicon content of 30% to 60% by weight;
      ii. a surface area less than 30 $m^2$/g;
      iii. Z of less than 10, wherein Z=1.875×[(M1100–M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and
      iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 73. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;
   c. contacting the silicon-carbon composite particles with propylene gas at a temperature of 100° C. to 500° C. to create hydrosilylation passivated silicon-carbon composite particles; and
   d. wherein the hydrosilylation passivated silicon-carbon composite comprises:
      i. a silicon content of 30% to 60% by weight;
      ii. a surface area less than 30 m2/g;
      iii. Z of less than 10, wherein Z=1.875×[(M1100–M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and
      iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 74. A process for preparing hydrosilylation passivated silicon-carbon composite particles comprising:
   a. providing carbon scaffold particles comprise a pore volume, wherein the pore volume comprises greater than 70% microporosity;
   b. contacting the porous carbon scaffold particles with silane gas at a temperature of 350° C. to 550° C. to create silicon-carbon composite particles;

c. contacting the silicon-carbon composite particles with ethylene gas at a temperature of 100° C. to 500° C. to create hydrosilylation passivated silicon-carbon composite particles; and d. wherein the hydrosilylation passivated silicon-carbon composite comprises:

i. a silicon content of 30% to 60% by weight;

ii. a surface area less than 30 m$^2$/g;

iii. Z of less than 10, wherein Z=1.875×[(M1100–M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 75. A hydrosilylation passivated silicon-carbon composite material comprising:

a. a carbon scaffold comprising a pore volume, wherein the pore volume comprises greater than 70% microporosity;

b. nano-sized silicon domains within the pores of the porous carbon wherein the silicon surface comprises Si—R bonds;

c. where R comprises:

a. an organic functional group comprising combinations of carbon, oxygen, nitrogen or hydrogen;

b. and one or more optional halogen elements, such as bromine, fluorine, chlorine, or iodine; and d. wherein the hydrosilylation passivated silicon-carbon composite comprises:

i. a silicon content of 30% to 60% by weight;

ii. a surface area less than 30 m$^2$/g;

iii. Z of less than 10, wherein Z=1.875×[(M1100–M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 76. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

C. contacting the silicon-carbon composite particles with an alkane gas at a temperature of 300° C. to 700° C. to create chemical vapor passivated silicon-carbon composite particles.

Embodiment 77. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with an alkyne gas at a temperature of 300° C. to 700° C. to create chemical vapor passivated silicon-carbon composite particles.

Embodiment 78. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with acetylene gas at a temperature of 300° C. to 700° C. to create chemical vapor passivated silicon-carbon composite particles.

Embodiment 79. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with propylene gas at a temperature of 300° C. to 700° C. to create chemical vapor passivated silicon-carbon composite particles.

Embodiment 80. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with ethylene gas at a temperature of 300° C. to 700° C. to create chemical vapor passivated silicon-carbon composite particles.

Embodiment 81. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with acetylene gas at a temperature of 300° C. to 700° C. to create chemical vapor passivated silicon-carbon composite particles; and d. wherein the chemical vapor passivated silicon-carbon composite comprises:

i. a silicon content of 30% to 60% by weight;

ii. a surface area less than 30 m$^2$/g;

iii. Z of less than 10, wherein Z=1.875×[(M1100–M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 82. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with propylene gas at a temperature of 300° C. to 700° C. to create chemical vapor passivated silicon-carbon composite particles; and d. wherein the chemical vapor passivated silicon-carbon composite comprises:
   i. a silicon content of 30% to 60% by weight;
   ii. a surface area less than 30 $m^2$/g;
   iii. Z of less than 10, wherein Z=1.875×[(M1100−M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and
   iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 83. A process for preparing chemical vapor passivated silicon-carbon composite particles comprising:

a. providing carbon scaffold particles comprise a pore volume, wherein the pore volume comprises greater than 70% microporosity;

b. contacting the porous carbon scaffold particles with silane gas at a temperature of 350° C. to 550° C. to create silicon-carbon composite particles;

c. contacting the silicon-carbon composite particles with ethylene gas at a temperature of 300° C. to 700° C. to create chemical vapor passivated silicon-carbon composite particles; and d. wherein the chemical vapor passivated silicon-carbon composite comprises:
   i. a silicon content of 30% to 60% by weight;
   ii. a surface area less than 30 $m^2$/g;
   iii. Z of less than 10, wherein Z=1.875×[(M1100−M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and
   iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 84. A chemical vapor passivated silicon-carbon composite material comprising:

a. a carbon scaffold comprising a pore volume, wherein the pore volume comprises greater than 70% microporosity;

b. nano-sized silicon domains within the pores of the porous carbon wherein the silicon surface comprises Si—H bonds; and c. a carbonaceous layer at least partially covering the silicon domains; and d. wherein the chemical vapor passivated silicon-carbon composite comprises:
   i. a silicon content of 30% to 60% by weight;
   ii. a surface area less than 30 m2/g;
   iii. Z of less than 10, wherein Z=1.875×[(M1100−M)/M1100]×100, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis; and
   iv. a φ of greater than or equal to 0.1, wherein φ=(Max peak height dQ/dV in Regime I)/(Max peak height dQ/dV in Regime III), wherein dQ/dV is 5 measured in a half-cell coin cell, and Regime I is 0.8V-0.4V and Regime III is 0.15V-0V.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A hydrosilylation passivated silicon-carbon composite material, comprising:

a) a porous carbon scaffold comprising a pore volume, wherein the pore volume comprises greater than 70% microporosity;

b) nano-sized silicon domains disposed within pores of the porous carbon scaffold, wherein a surface of the nano-sized silicon domains is passivated due to Si—R groups, wherein R comprises:
   (i) an organic functional group comprising one or more of carbon, oxygen, nitrogen, and hydrogen; and,
   (ii) one or more optional halogen element;

c) a silicon content of 30% to 60% by weight;

d) a surface area of less than 30 $m^2$/g;

e) a Z of less than 10, wherein Z=1.875×[(M1100−M)/M1100]×100, wherein M1100 is a mass of the passivated silicon-carbon composite material at 1100° C. and M is the minimum mass of the passivated silicon-carbon composite material between 800° C. and 1100° C. when the passivated silicon-carbon composite material is heated under air from about 25° C. to about 1100° C., as determined by thermogravimetric analysis; and f) a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V, wherein:

the surface of the nano-sized silicon domains is passivated using chemical vapor infiltration (CVI) by reacting the surface with an alkene gas or alkyne gas at a temperature ranging from 100° C. to 200° C.; and the surface of the nano-sized silicon domains comprises Si—H surface groups that react with the alkene gas or the alkyne gas to form the Si—R groups.

2. The composite material of claim 1, further comprising a Dv50 between 5 nm and 20 microns.

3. The composite material of claim 1, wherein the hydrosilylation passivated silicon-carbon composite material gasses less than 0.005 mol/mol silicon/h in an aqueous suspension at 45° C.

4. The composite material of claim 1, comprising a mol ratio of oxygen to silicon, wherein the mole ratio of oxygen to silicon increases less than 0.01 mol/mol/day when exposed to 25° C. in the presence of air.

5. The composite material of claim 1, wherein the Si—H surface groups are formed by reacting the porous carbon scaffold with a silane gas in the presence of hydrogen.

\*   \*   \*   \*   \*